United States Patent
Satoh et al.

(10) Patent No.: US 6,646,303 B2
(45) Date of Patent: Nov. 11, 2003

(54) NONVOLATILE SEMICONDUCTOR MEMORY DEVICE AND A METHOD OF MANUFACTURING THE SAME

(75) Inventors: Akihiko Satoh, Hachioji (JP);
Masahito Takahashi, Tachikawa (JP);
Takayuki Yoshitake, Akishima (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/973,022

(22) Filed: Oct. 10, 2001

(65) Prior Publication Data

US 2002/0158273 A1 Oct. 31, 2002

(30) Foreign Application Priority Data

Oct. 17, 2000 (JP) ......................................... 2000-317001

(51) Int. Cl.[7] ............................................ H01L 29/788
(52) U.S. Cl. ..................... 257/321; 257/315; 257/316
(58) Field of Search .............................. 257/316, 321, 257/315

(56) References Cited

U.S. PATENT DOCUMENTS

| | | | |
|---|---|---|---|
| 5,338,957 A | 8/1994 | Fukumoto et al. | 257/316 |
| 5,740,105 A * | 4/1998 | Gill | 365/185.05 |
| 5,793,678 A | 8/1998 | Kato et al. | 365/185.27 |
| 5,962,889 A * | 10/1999 | Yamauchi et al. | 257/317 |
| 6,461,916 B1 | 10/2002 | Adachi et al. | 438/257 |

FOREIGN PATENT DOCUMENTS

JP 8-279566 10/1996

* cited by examiner

Primary Examiner—Jerome Jackson
(74) Attorney, Agent, or Firm—Miles & Stockbridge P.C.

(57) ABSTRACT

The present invention aims to provide high integration of a nonvolatile semiconductor memory device having lots of flash memory cells without causing a reduction in its operating speed. A width taken along a gate-width direction, of a lower conductor film for a floating gate electrode is made thinner than a minimum processing size F, and a width taken along the gate-width direction, of an upper conductor film for the floating gate electrode, which is provided with an insulating film disposed on source and drain regions interposed therebetween, is made thicker than the minimum processing size F, whereby a reduction in the ratio of coupling between a control gate electrode and a floating gate electrode due to the scaling down of a unit cell area is restrained.

19 Claims, 44 Drawing Sheets

UNIT CELL AREA ($6F^2$)

NONVOLATILE SEMICONDUCTOR MEMORY DEVICE AND A METHOD OF MANUFACTURING THE SAME

BACKGROUND OF THE INVENTION

The present invention relates to a nonvolatile semiconductor memory device and a manufacturing technology thereof, and particularly to a technology effective for application to a nonvolatile semiconductor memory device suitable for high integration and a manufacturing method thereof.

A nonvolatile semiconductor memory device capable of electrically writing or programming data therein and erasing the same therefrom is capable of rewriting data in a state of being installed onto a wiring board, for example. Since the nonvolatile semiconductor memory device is easy to use, it has widely been used for various products each of which needs a memory.

In particular, an electrically batch or collectively erase type EEPROM (Electric Erasable Programmable Read Only Memory: hereinafter called a "flash memory") has the function of collectively electrically erasing data lying in a predetermined range (all the memory cells or a predetermined memory cell group in the memory array). Further, since the flash memory has a one-transistor laminated or stacked gate structure, the downsizing of each cell has been a goal, and expectations are also high for its high integration.

In the one-transistor laminated gate structure, one memory basically comprises one two-layer gate MISFET (Metal Insulator Semiconductor Field Effect Transistor). The two-layer gate MISFET is formed by providing a floating gate electrode on a semiconductor substrate with a tunnel insulating film interposed therebetween and further laminating or stacking a control gate electrode thereon with an interlayer film interposed therebetween. Injecting electrons into the floating gate electrode and extracting the electrons from the floating gate electrode carries out the storage of data.

As one model of this type of nonvolatile semiconductor memory device, there has been known a parallel type flash memory wherein memory cells lying in respective columns or sequences of a flash memory array are connected in parallel. This has been disclosed in, for example, U.S. Pat. No. 5,793,678 corresponding to Japanese Application laid-open No. Hei 8(1996)-279566. This type of memory device is known as an AND type flash memory.

The present inventors have discussed the layout of the AND type flash memory with a view toward achieving high integration thereof. A technology discussed by the present inventors will be explained below with reference to FIG. 48.

A cell layout of the AND type flash memory discussed by the present inventors is shown in FIG. 48.

Trench type isolators SGI known in an insulation separating method generally called "STI (Shallow Trench Isolation", for example, are formed on a main surface of a semiconductor substrate 1. An insulating film is embedded into plane band-shaped trenches dug therein along a gate-width direction, so as to electrically separate between memory cells disposed along the extending direction (gate-length direction) of each word line W, whereby the isolators SGI are formed. A memory cell block MCB comprising a plurality of the memory cells is disposed in each of active regions electrically isolated by the isolators SGI.

In the memory cell block MCB, a source region of each memory cell shares the use of a local source line SS based on a buried diffusion layer wiring and is connected to one of source/drain regions of each selection MOS (not shown) connected to a common source line. Further, the drain region of each memory cell has a structure wherein it is commonly used by a sub bit line SB based on a buried diffusion layer wiring and is connected to one of source/drain regions of each MOS (not shown) connected to its corresponding main bit line. Namely, it takes a structure wherein the memory cells are connected in parallel with the local source line SS or the sub bit line SB.

Gate electrodes of individual memory cells respectively comprise floating gate electrodes (each indicated by shaded hatching in the drawing) each comprising a lower conductive or conductor film FG and an upper conductive or conductor film FL, and control gate electrodes SG formed on their floating gate electrodes with an interlayer film interposed therebetween. The control gate electrode SG acts as the word line W for each memory cell. The control gate electrodes extend in the direction orthogonal to the local source line SS or the sub bit line SB and are shared between different memory cell blocks MCBs. Assuming that a minimum processing size determined by a design rule is given as F, the word lines W are disposed side by side in parallel in plural form along a gate-length direction so that the pitch between the adjacent word lines becomes 2F. The memory cells MCs are disposed side by side in parallel in plural form along a gate-width direction so that a bit line-to-bit line pitch becomes 4F.

SUMMARY OF THE INVENTION

The scale-down of the area of each memory cell is essential for the implementation of a further cost reduction of a flash memory and high performance thereof. As a result of discussions by the present inventors, it has been considered that the narrowing of each pitch in a word-line extending direction or a bit-line extending direction (in the direction orthogonal to each word line) is effective for the downsizing of a memory cell area when the minimum processing size determined by the design rule is constant, particularly, the downsizing of a pitch extending along the bit-line extending direction due to the scale-down of the area of the upper conductor film for each floating gate electrode is effective therefor. However, it has been found that a problem arises in that the scale-down of the memory cell area by the above-described method causes a reduction in coupling ratio which is an important factor in determining the performance of operation of the flash memory.

The coupling ratio is represented by a capacitance (hereinafter represented as "$C_1$") between the semiconductor substrate and the floating gate electrode, and a capacitance (hereinafter represented as "$C_2$") between the control gate electrode and the floating gate electrode. The coupling ratio is defined by the following equation (1):

$$C_2/(C_1+C_2) \tag{1}$$

When the coupling ratio is lowered, a voltage applied to the floating gate electrode is reduced when a constant voltage is applied to the control gate electrode. Therefore, the time required to perform each of write and erase operations becomes slow. As a measure against it, there is a need to increase an operating voltage applied to the control gate electrode for the purpose of the attainment of a desired operating speed. However, an increase in operating voltage is hard to be considered as desired means from the viewpoint of the reliability of each memory cell, a request of a voltage reduction to a flash memory grown in capacity, etc.

An object of the present invention is to provide a technology capable of implementing high integration of a nonvolatile semiconductor memory device having a plurality of flash memory cells connected in parallel without causing a decrease in operating speed thereof.

The above, other objects, and novel features of the present invention will become apparent from the description of the present specification and the accompanying drawings.

Summaries of typical ones of the inventions disclosed in the present application will be described in brief as follows:

According to a parallel type nonvolatile semiconductor memory device of the present invention, each of nonvolatile memory cells includes a lower conductor film for a floating gate electrode, which is provided on a channel region between source/drain regions with a first insulating film interposed therebetween, an upper conductor film for the floating gate electrode, which is electrically connected to the lower conductor film and is formed so as to extend on the source/drain regions from the lower conductor film with a second insulating film placed on the source/drain regions being interposed therebetween, and a conductor film for a control gate electrode, which is provided on the upper conductor film with a third insulating film interposed therebetween and serves as each word line. Widths taken along a gate-width direction, of the lower conductor film placed on the channel region and the word line are relatively thinner than those taken along the gate-width direction, of the upper conductor film placed on the second insulating film and the word line.

In the present invention as well, the widths taken along the gate-width direction, of the lower conductor film placed on the channel region and the word line are thinner than a minimum processing size determined by a design rule.

Further, in the present invention, the widths taken along the gate-width direction, of the upper conductor film placed on the second insulating film and the word line are thicker than a minimum processing size determined by a design rule.

According to a parallel type nonvolatile semiconductor memory device of the present invention as well, each of nonvolatile memory cells includes a lower conductor film for a floating gate electrode, which is provided on a channel region between source/drain regions with a first insulating film interposed therebetween, an upper conductor film for the floating gate electrode, which is electrically connected to the lower conductor film and is formed so as to extend on the source/drain regions from the lower conductor film with a second insulating film placed on the source/drain regions being interposed therebetween, and a conductor film for a control gate electrode, which is provided on the upper conductor film with a third insulating film interposed therebetween and serves as each word line.

In a central portion of a memory array, at least one first memory cell is disposed in which widths taken along a gate-width direction, of the lower conductor film placed on the channel region and the word line are relatively thinner than those taken along the gate-width direction, of the upper conductor film placed on the second insulating film and the word line. In a peripheral portion of the memory array, at least one second memory cell is disposed in which widths taken along the gate-width direction, of the lower conductor film placed on the channel region and the word line are identical to those taken along the gate-width direction, of the upper conductor film placed on the second insulating film and the word line.

According to the above-described means, even if the pitch between adjacent bit lines is narrowed to scale down or reduce a unit cell area, the areas opposed to each other between a lower conductor film for each floating gate electrode and a semiconductor substrate are reduced, whereas the areas opposed to each other between an upper conductor film for the floating gate electrode and a control gate electrode are restrained from decreasing. As a result, a reduction in coupling ratio between the control gate electrode and the floating gate electrode can be restrained from occurring.

According to the above-described means as well, at least one first memory cell capable of correcting or compensating for a reduction in coupling ratio is disposed in a central portion of a memory array, in which the thinning of a second insulating film is apt to occur. Thus it is possible to reduce or lessen variations in coupling ratio in each memory mat.

Incidentally, the technology of the present invention, of correcting the variations in coupling ratio can be applied even to a serial type nonvolatile semiconductor memory device like a NAND type as will be apparent from the description of embodiments to be described later.

DETAILED DESCRIPTION OF THE INVENTION

Figure 1:
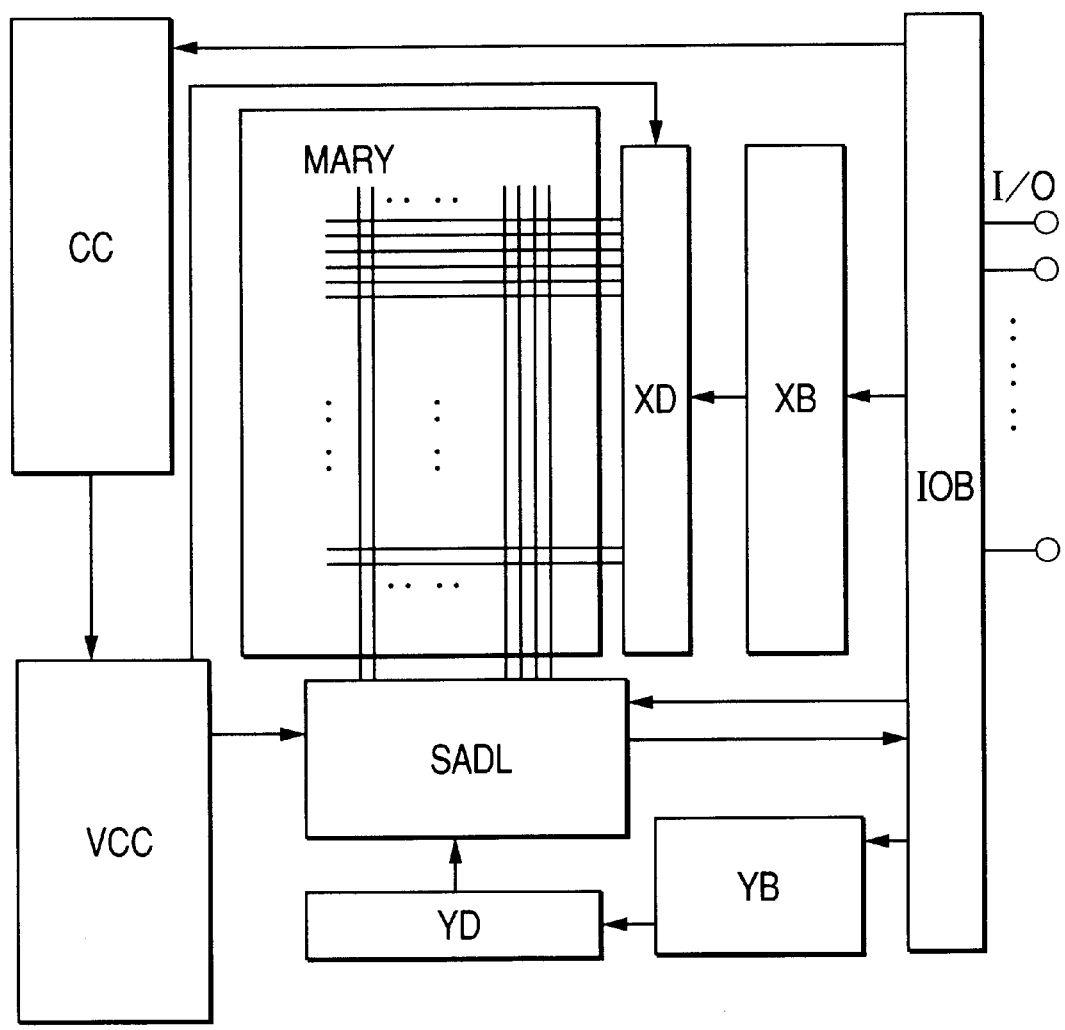
FIG. 1 is a diagram for describing a block configuration of a flash memory according to one embodiment of the present invention.

Preferred embodiments of the present invention will hereinafter be described in detail with reference to the accompanying drawings. Incidentally, components or elements each having the same function in all the drawings for describing the embodiments are respectively identified by the same reference numerals and their repetitive description will therefore be omitted.

In the present embodiments, MOSFETs (Metal Oxide Semiconductor Field Effect Transistors) are generically called "Field Effect Transistors", which will be abbreviated as "MOSs". p channel type MOSFETs will be abbreviated as "pMOSs" and n channel type MOSFETs will be abbreviated as "nMOSs".

(First embodiment)

An AND type flash memory corresponding to a parallel-type nonvolatile memory device, to which the present invention is applied, will be explained as the present embodiment.

FIG. 1 is a block diagram showing a first embodiment of an AND type flash memory. The outline of a configuration of the flash memory according to the first embodiment will first be described with reference to the same drawing.

A row decoder XD for selecting each of word lines is connected to a memory array MARY, and a column decoder YD for selecting each of bit lines is connected to the memory array MARY through a sense amplifier data latch SADL. An input/output buffer IOB is connected to the row decoder XD through a row address buffer XB and connected to the column decoder YD through a column address buffer YB. Further, the input/output buffer IOB is connected even to the sense amplifier data latch SADL and a control circuit CC. The control circuit CC is connected to the row decoder XD and the sense amplifier data latch SADL through a power control circuit VCC.

The control circuit CC comprises a command decoder, a power switching circuit, and a write/erase circuit. The power control circuit CC comprises a reference voltage generator, a write/ease voltage generator, and a verification voltage generator. The reference voltage generator is a circuit for generating reference voltages inputted to the respective circuits to generate respective predetermined voltages for the write/erase voltage generator and the verification voltage generator, etc.

As will be apparent from FIG. 2 to be described later, the memory array MARY is disposed so as to make up the majority of a main surface of a semiconductor substrate and includes a predetermined number of word lines placed in parallel with the horizontal direction in the drawing, a predetermined number of bit lines disposed in parallel with the direction orthogonal to the word lines, and a large number of two-layer gate structure type memory cells arranged in lattice at substantial intersecting points of these word lines and bit lines. The memory cells are group-divided into cell units with m+1 memory cells disposed in the same column as a unit. The cell units constitute memory blocks with n+1 cell units as a unit. The whole memory or storage capacity has 512 Mbits, for example. The storage capacity is not limited in particular and is applicable even to 256 Mbits.

Further, the flash memory according to the first embodiment adopts a so-called hierarchical bit-line system. The bit lines of the memory array MARY comprise sub bit lines to which drains of m+1 memory cells constituting the respective cell units are commonly connected, and main bit lines to which p+1 sub bit lines disposed in the same column are selectively connected through selection MOSs on the drain sides.

The sources of the m+1 memory cells constituting the respective cell units of the memory array MARY are connected to their corresponding local source lines in common. These local source lines are respectively connected to common source lines through selection MOSs on the corresponding source sides. Further, control gates of n+1 memory cells disposed in the same row of the memory array MARY are commonly connected to their corresponding word lines. The selection MOSs on the drain sides and the selection MOSs on the source sides are respectively commonly-connected to p+1 drain-side block select signal lines or source-side block select signal lines disposed in parallel with the word lines.

Figure 2:
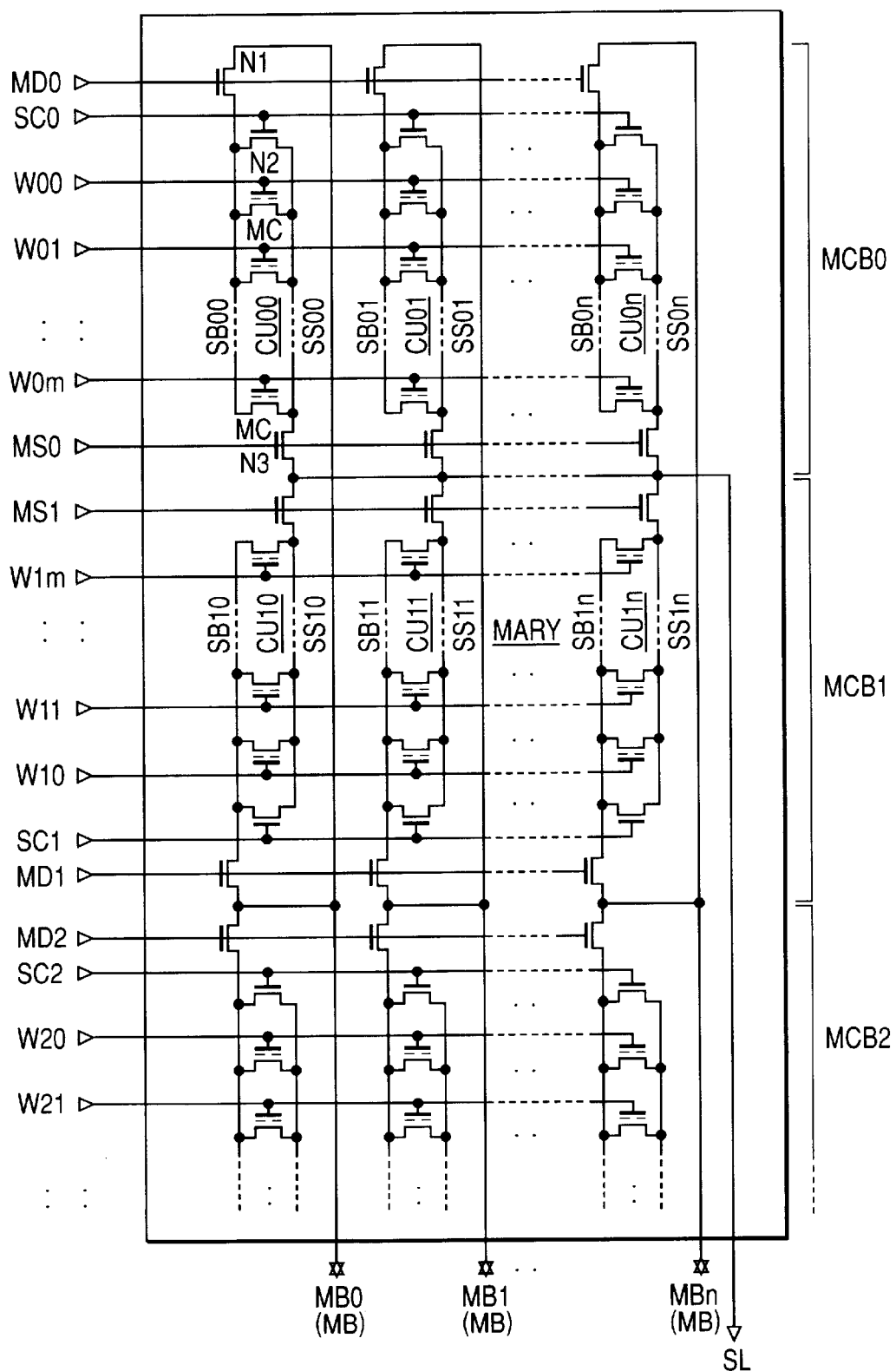
FIG. 2 is a partial circuit diagram showing one example of a memory array included in the flash memory shown in FIG. 1.

A partial circuit diagram of the memory array MARY included in the flash memory shown in FIG. 1 is shown in FIG. 2. A specific configuration of the memory array MARY will be explained based on the same drawing. Respective circuits in the memory array comprise n channel type MOSFETs.

As shown in FIG. 2, the memory array MARY of the flash memory according to the first embodiment includes p+1 memory cell blocks MCB0 through MCBp (only memory cell blocks MCB0, MCB1, a memory cell block MCB2, and portions related to these memory cell blocks are illustrated by way of example in FIG. 2, and they are similar subsequently). These memory cell blocks respectively include m+1 word lines W00 through W0m through Wp0 through Wpm disposed in parallel with the horizontal direction as viewed in the drawing, and n+1 main bit lines MB0 through MBn (MB) disposed in parallel with the vertical direction as viewed in the drawing. (m+1)×(n+1) two-layer gate structure type memory cells MCs are respectively arranged in lattice form at substantial intersecting points of these word lines and main bit lines.

Although not restricted in particular, the memory array MARY is provided as an AND type array configuration. The memory cells MCs constituting the memory cell blocks MCB0 through MCBp are respectively group-divided into n+1 cell units CU00 through CU0n and CUp0 through CUpn with m+1 memory cells disposed in the same column as a unit. The drains of the m+1 memory cells MCs constituting the these cell units are respectively commonly connected to their corresponding sub bit lines SB00 through SB0n and SBp0 through SBpn, whereas the sources thereof are respectively commonly connected to their corresponding local source lines SS00 through SS0n and SSp0 through SSpn. Further, the sub bit lines SB00 through SB0n and SBp0 through SBpn of the respective cell units are connected to their corresponding main bit lines MB0 through MBn through n channel type drain-side selection MOSN1 whose gates are coupled to block selection signal lines MD0 through MDp on their corresponding drain sides. The local source lines SS00 through SS0n and SSp0 through SSpn are respectively connected to a common source line SL through n channel type source-side selection MOSN3 whose gates are connected to block selection signal lines MS0 through MSp on the their corresponding source sides.

Further, the respective cell units of the memory cell blocks MCB0 through MCBp respectively include n channel type short-circuit MOSN2 respectively provided between the commonly-connected drains of their corresponding m+1 memory cells MCs, i.e., the sub bit lines SB00 through SB0n and SBp0 through SBpn, and the commonly-connected sources of their corresponding m+1 memory cells MCs, i.e., the local source lines SS00 through SS0n and SSp0 through SSpn. The gates of the n+1 short-circuit MOSN2 included in the respective memory cell blocks are commonly connected to their corresponding block selection signal lines SC0 through SCp for short-circuit MOSs.

Figure 3:
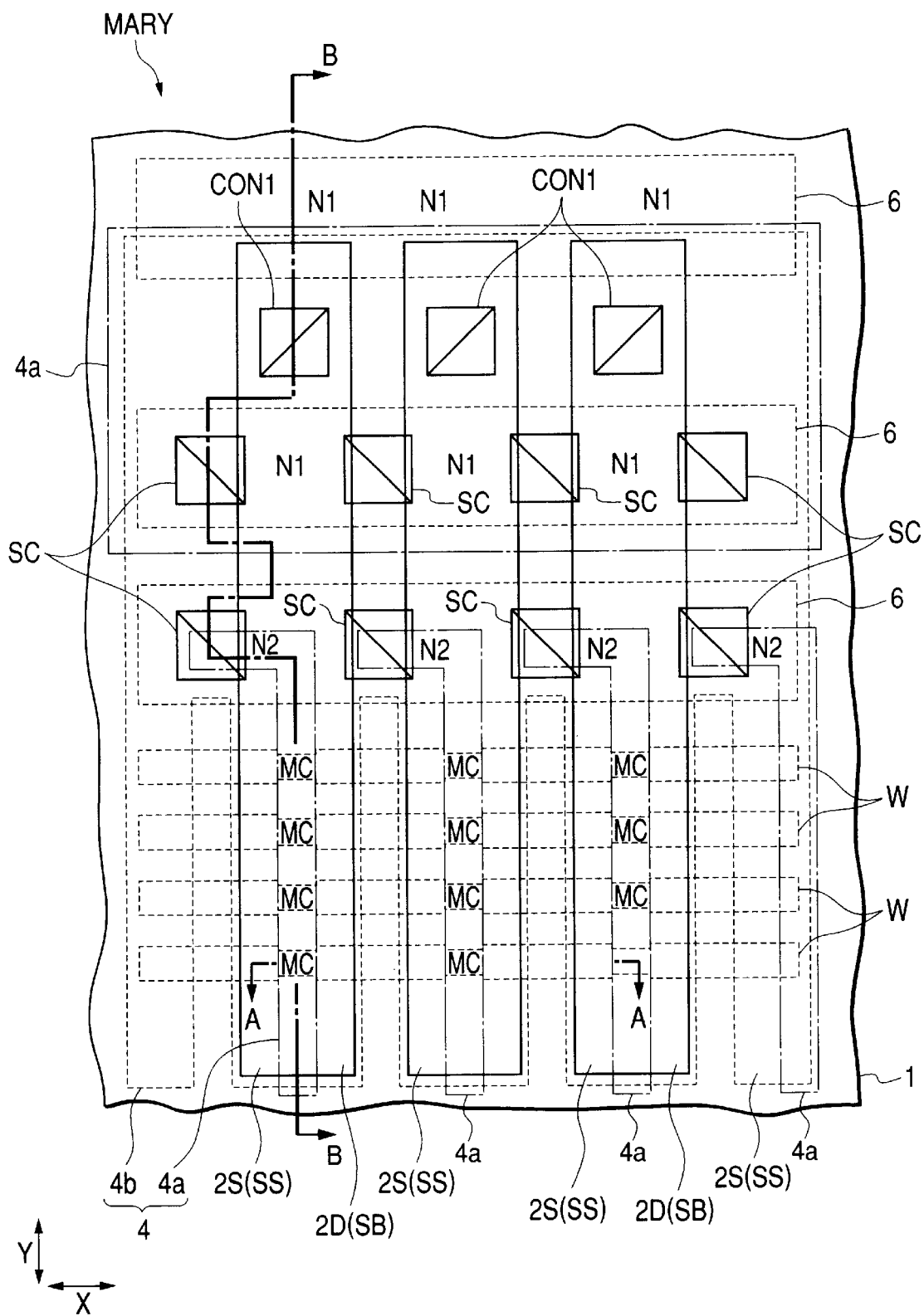
FIG. 3 is a fragmentary plan view of the memory array shown in FIG. 1.
Figure 4:
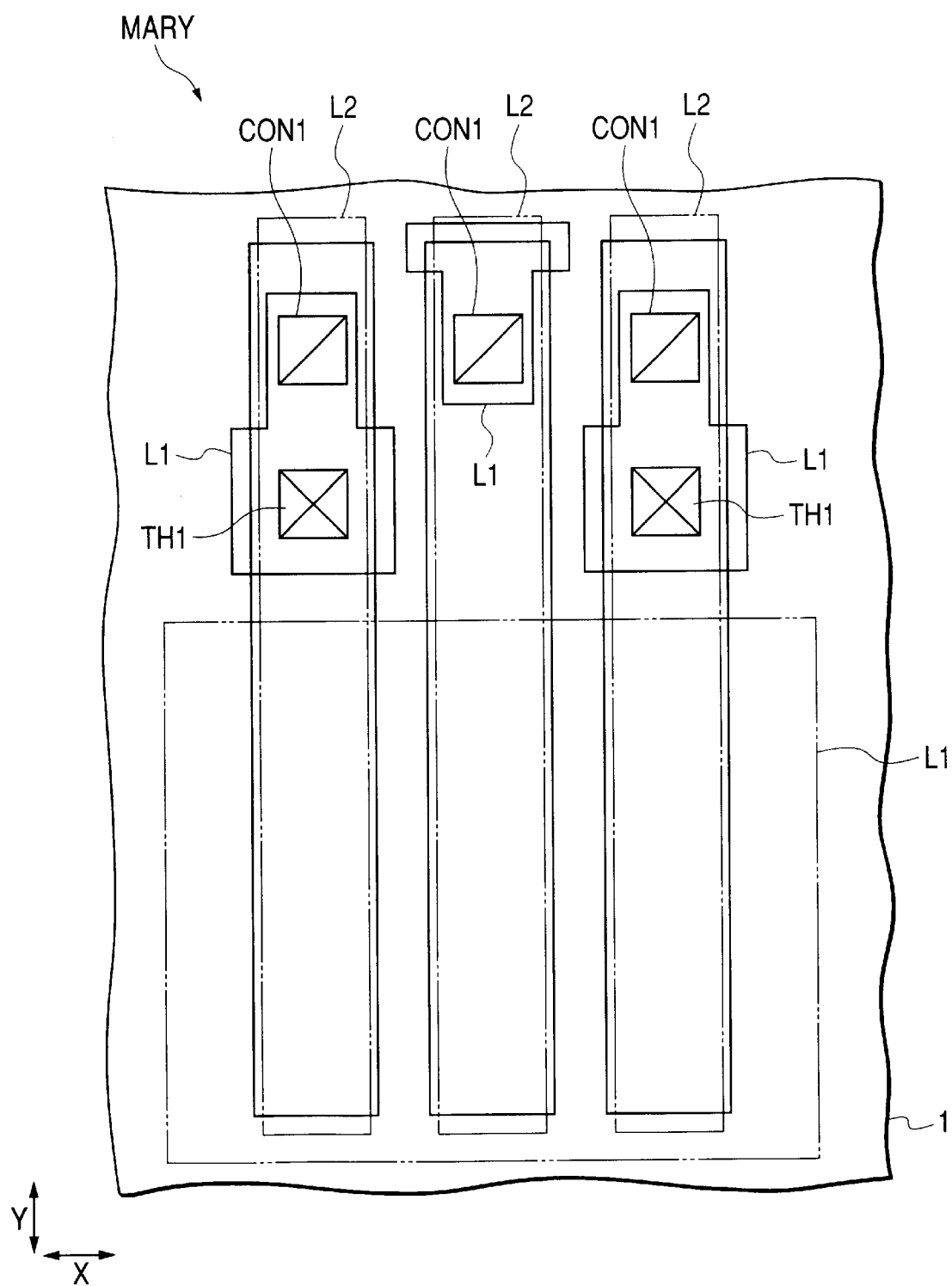
FIG. 4 shows a plane area identical to that shown in FIG. 3 and is a fragmentary plan view showing a layout layer located over or above that shown in FIG. 3.
Figure 5:
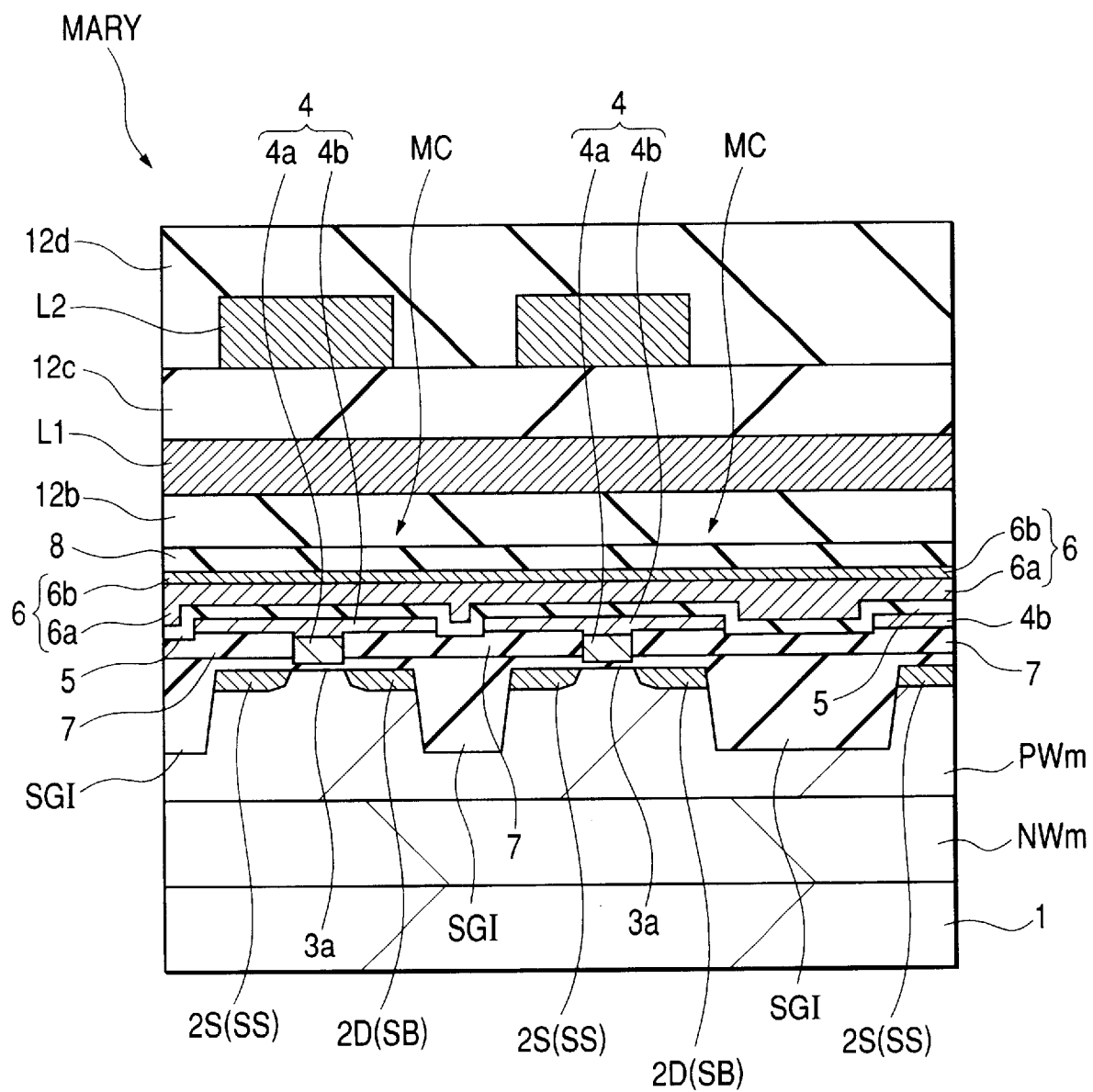
FIG. 5 is a cross-sectional view taken along line A—A of FIG. 3.
Figure 6:
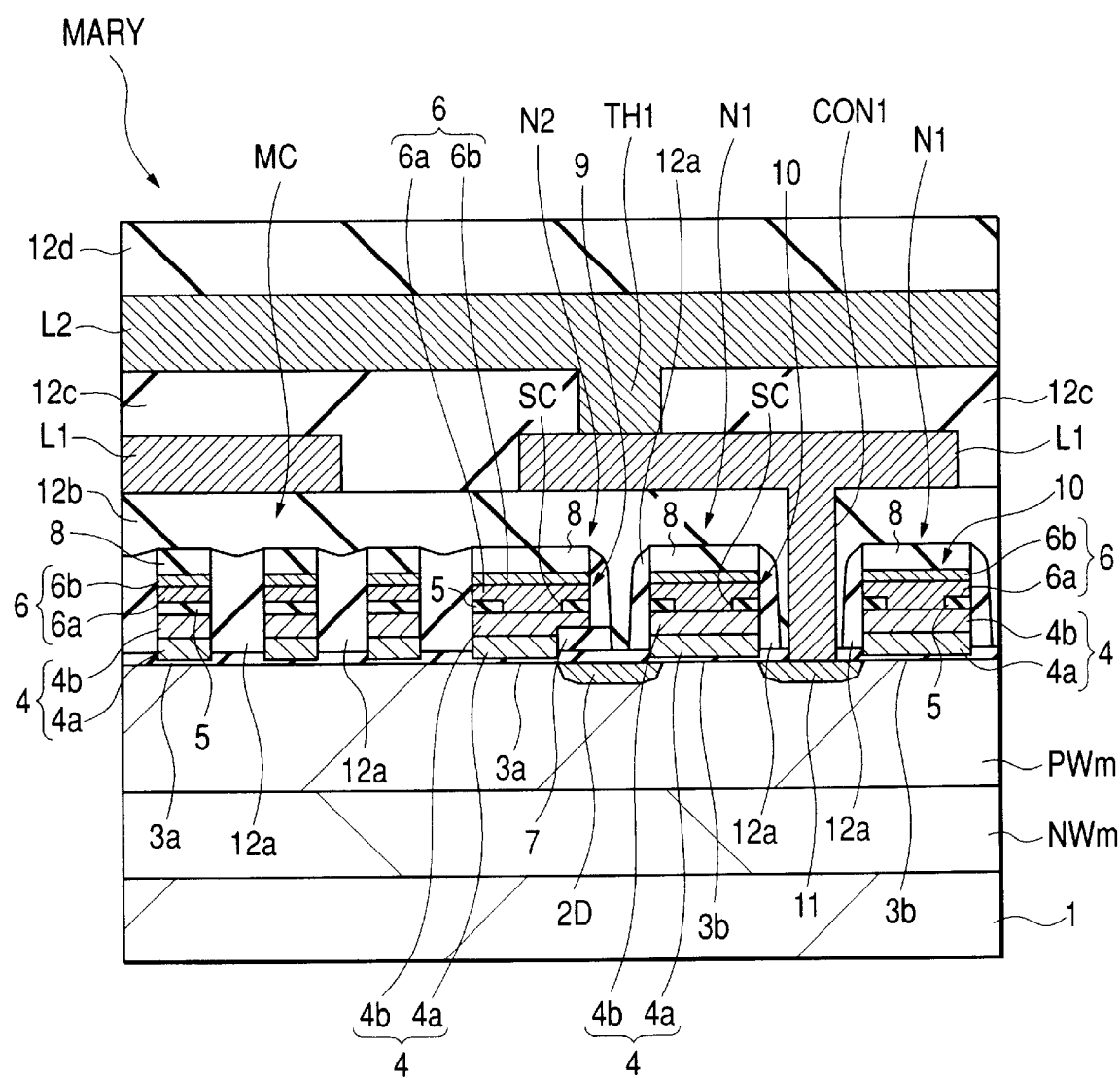
FIG. 6 is a cross-sectional view taken along line B—B of FIG. 3.
Figure 7:
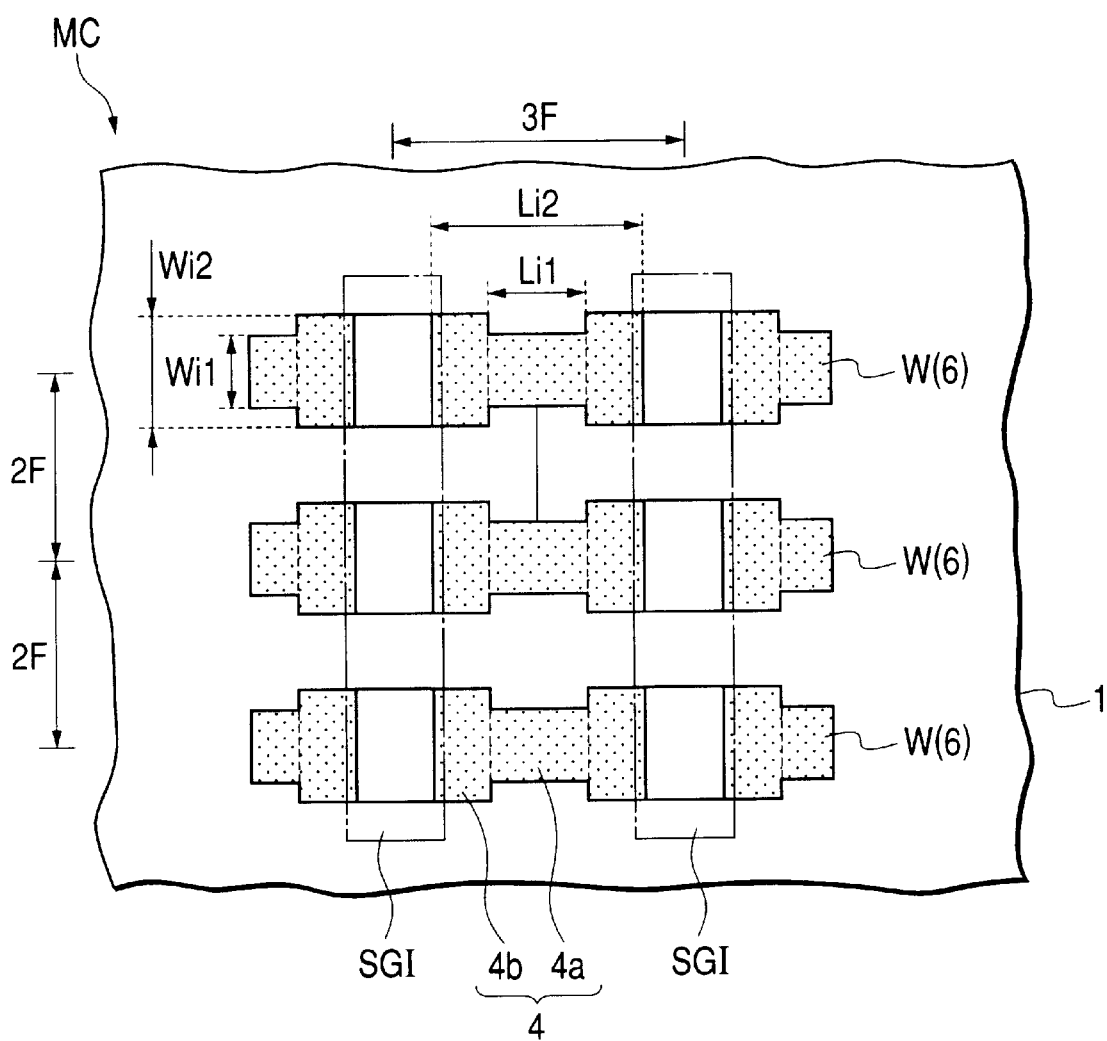
FIG. 7 is an enlarged plan view showing a memory cell shown in FIG. 3.
Figure 8A:
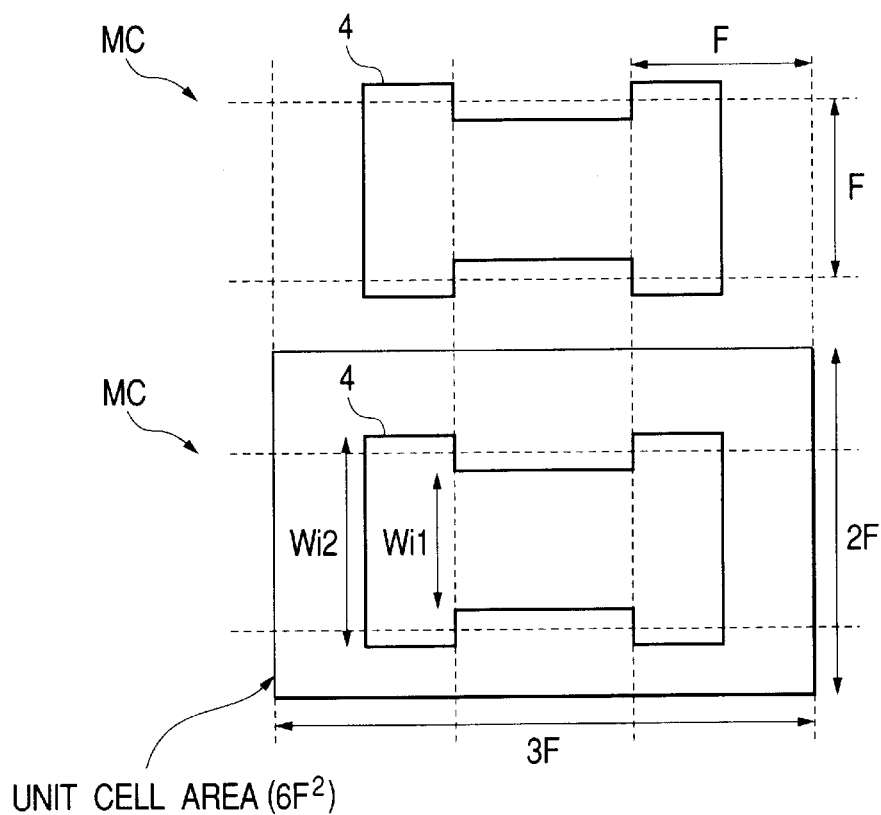
FIG. 8(a) is an enlarged plan view showing one memory cell.
Figure 8B:
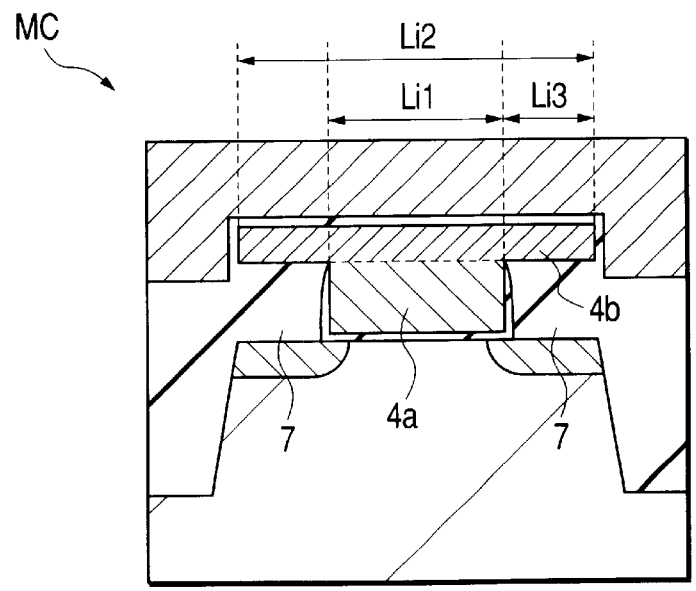
FIG. 8(b) is a cross-sectional view taken along the direction of a channel length.
Figure 9:
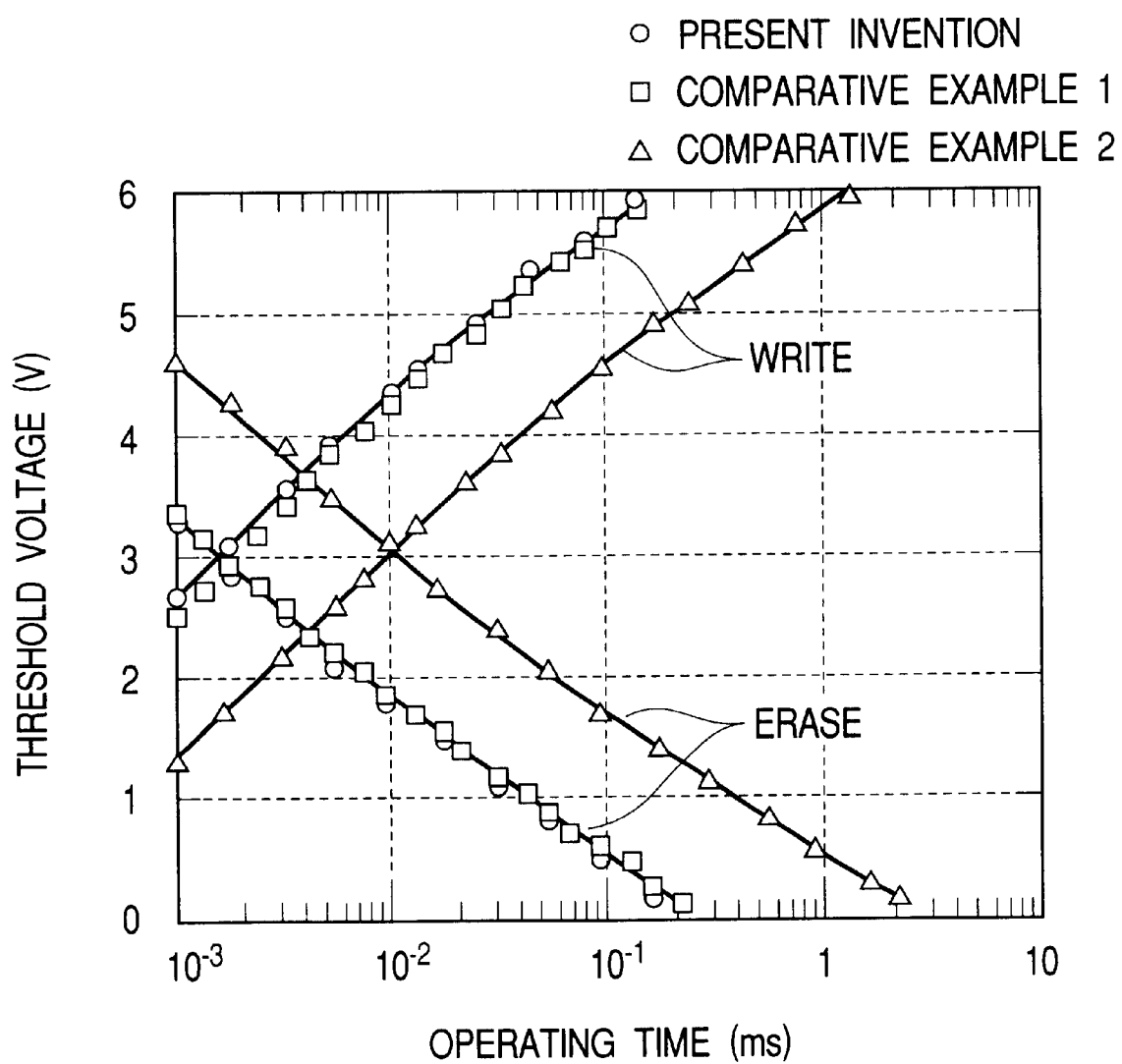
FIG. 9 is a graph illustrating comparative examples of operating characteristics of memory cells.

A device layout and a device structure of the flash memory according to the first embodiment will next be explained with reference to FIGS. 3 through 9. FIG. 3 is a fragmentary plan view of the memory array MARY, FIG. 4 shows a plane area identical to that shown in FIG. 3 and is a fragmentary plan view showing a layout layer located over or above that shown in FIG. 3, FIG. 5 is a cross-sectional view taken along line A—A (corresponding to a line formed by cutting word lines along their extending direction (X direction) from thereabove) of FIG. 3, and FIG. 6 is a cross-sectional view taken along line B—B (corresponding to a line formed by cutting a channel portion of each memory cell along the direction (Y direction) intersecting each word line) of FIG. 3, respectively. While the above description will be made herein with the cross-sectional views of FIGS. 5 and 6 as the center, it should be noted that points to describe a plane configuration will refer to FIGS. 3 and 4 whenever necessary. Further, FIG. 7 is an enlarged plan view showing each memory cell MC shown in FIG. 3, FIG. 8 is an enlarged plan view and an enlarged cross-sectional view showing one memory cell MC, and FIG. 9 is a graph illustrating comparative examples of operating characteristics of memory cells, respectively. A device structure of each memory cell MC according to the present invention and its effect will be explained with reference to FIGS. 7 through 9.

A semiconductor substrate 1, which constitutes the semiconductor chip, comprises a p-type silicon monocrystal, for example. A p well PWm is formed on the semiconductor substrate 1. For example, boron (B) is introduced into the p well PWm. Although not shown in the drawing, elements or devices for peripheral circuits, such as the short-circuit MOSN2, the selection MOSN1 and MOSN3, etc. are also formed herein in addition to the memory cells MCs.

Incidentally, although not restricted in particular, the p well PWm is taken or incorporated in a buried n well NWm formed therebelow, and an n well formed on the side of each side portion of the p well PWm and is electrically isolated from other portions of the semiconductor substrate 1. For example, phosphor (P) or arsenic (As) is introduced into the semiconductor substrate 1 to thereby form the buried n well NWm and the n well. The buried n well NWm and the n well function so as to inhibit or prevent noise produced from other elements on the semiconductor substrate 1 from entering the p well PWm (i.e., memory cell MC) through the semiconductor substrate 1 and set the potential of the p well PWm to a predetermined value independently of the semiconductor substrate 1.

Further, for example, trench-type isolations (trench isolation) SGIs are formed on a main surface of the semiconductor substrate 1. The trench isolations SGIs are formed by embedding an insulating film into plane or flat band-like trenches defined along a Y direction so as to electrically isolate among a plurality of memory cells MCs disposed along the direction (X direction) in which word lines extend. The insulating film of each trench isolation SGI is made up of oxide silicon or the like, for example. An upper surface of the insulating film is flattened so as to substantially coincide with a main surface of the semiconductor substrate 1. Incidentally, in order to electrically isolate among a plurality of memory cells MCs disposed along a gate-width direction, trench-type isolators may be formed even in the semiconductor substrate 1 placed between the adjacent respective memory cells MCs. Alternatively, a p-type semiconductor region may be formed on the semiconductor substrate 1 placed between the adjacent memory cells MCs by introducing, for example, boron into the semiconductor substrate 1.

Each of the memory cells MCs includes a pair of n-type semiconductor regions 2S and 2D formed over the semiconductor substrate 1, an insulating film (first insulating film) 3a formed on the main surface (active region) of the semiconductor substrate 1, a conductor film 4 used for each floating gate electrode, which is formed on the insulating film 3a, an interlayer film (third insulating film) 5 formed on the conductor film 4, and a conductive or conductor film 6 for each control gate electrode, which is formed on the interlayer film 5. The conductor film 4 and the conductor film 6 are superimposed on each other and extend in the same form as viewed in the word line direction.

The n-type semiconductor region 2S of the memory cell MC is a region for forming a source region and is formed of a part of the local source line SS. Further, the n-type semiconductor region 2D is a region for forming a drain region and is formed of a part of the sub bit line SB. The local source line SS and the sub bit line SB are formed in an extended flat-band form in parallel with each other along the Y direction so as to interpose the plurality of memory cells MCs disposed along the direction on a plane basis. They serve as regions shared among the plurality of memory cells MCs interposed therebetween. In the present embodiment, each of the n-type semiconductor region 2S (local source line SS) and the n-type semiconductor region 2D (sub bit line SB) is formed by introducing, for example, arsenic (As) into the semiconductor substrate 1 on the order of, for example, about $10^{14}/cm^2$ or more. It is thus possible to realize a shallow junction between the semiconductor regions 2S and 2D and increase the concentration of an impurity while a short channel effect or the like is being inhibited or prevented from occurring. Therefore, the ensuring of scale-down and reliability and a reduction in resistance (sheet resistance) can be implemented. Incidentally, each local source line SS is electrically connected to the common source line SL (see FIG. 2) formed of a metal film or the like through the corresponding selection MOSN3, and each sub bit line SB is electrically connected to its corresponding main bit line MB formed of a metal film or the like through the corresponding MOSN1.

The insulating film 3a, which constitutes each memory cell MC, comprises silicon oxide or the like having a thickness which ranges from about 9 nm to about 10 nm, for example, and serves as an electron passage region (tunnel insulating film) used when electrons, which contribute to writing and erasing of information, are injected into the conductor film 4 from the semiconductor substrate 1 or the electrons held by the conductor film 4 for each floating gate electrode are discharged or emitted into the semiconductor substrate 1.

The conductor film 4 is formed of two-layer conductor films (corresponding to a lower conductor film 4a placed on a channel region and an upper conductor film 4b which extend on source and drain regions) stacked on each other in order from below. The lower conductor film 4a and the upper conductor film 4b are both formed of, for example, low-resistance polycrystalline silicon with an impurity introduced therein. The thickness of the lower conductor film 4a is about 70 nm, for example, whereas the thickness of the upper conductor film 4b is about 40 nm, for example. The conductor film 6 formed of a part of the word line is laminated on the conductor film 4.

However, the conductor film 4 has a cross-section shaped in T form as indicated by a cross-section (FIG. 5) taken along the X direction of FIG. 3. The width of the upper conductor film 4b is wider than that of the lower conductor film 4a. It is thus possible to increase the opposite area of the conductor film 4 for the floating gate electrode to the conductor film 6 for the control gate electrode while the gate length of each memory cell MC is being reduced. The capacitance formed between those gate electrodes can be increased. Accordingly, the efficiency of operation of the memory cell MC can be improved while the minute or micro-fabricated memory cell MC is left as it is.

An insulating film (second insulating film) 7 made up of, for example, silicon oxide or the like is interposed between the conductor film 4b of the conductor film 4 for the floating gate electrode and the semiconductor substrate 1 and achieves or provides isolation between the pair of n-type semiconductor regions 2S and 2D and the conductor film 4b.

Further, the sizes of the conductor film 4 for the floating gate electrode and the conductor film 6 for the control gate electrode are as follows in the memory cell MC according to the present embodiment. Assuming that the minimum processing size determined by a design rule is given as F as shown in FIG. 7, a pitch (hereinafter called "word line-to-word line pitch") extending along a channel width direction (hereinafter called "gate-width direction") corresponding to a channel forming region, in the extending direction of each word line, lying between source and drain regions is represented as 2F, and a pitch (hereinafter called "bit line-to-bit line pitch") extending along a channel length direction (hereinafter called "gate-length direction") is represented as 3F. The bit line-to-bit line pitch becomes narrower than the bit line-to-bit line pitch 4F of the memory cell MC described in FIG. 48. Thus, for example, a width Li1 of each lower conductor film 4a taken along the gate-length direction is set to the minimum processing size F, the width of each SGI is set to the minimum processing size F, and each of the widths of the source and drain regions is set to one-half the minimum processing size F, respectively. A width Li2 of each upper conductor film 4b (indicated by shaded hatching in the drawing), which is taken along the gate-length direction, is thicker than the width Li1 of the lower conductor film 4a, which is taken along the gate-length direction, and is thinner than the bit line-to-bit line pitch 3F. For instance, the width Li2 is set to about twice the minimum processing size F.

Further, a width Wi1 taken along the gate-width direction, of each of the lower conductor film 4a and conductor film 6 (word line) located on a channel region is thinner than the minimum processing size F and thinner than one-half the word line-to-word line pitch 2F. A width taken along the gate-width direction, of the upper conductor film 4b, which overlaps with the lower conductor film 4a, is identical to the width Wi1 of the lower conductor film 4a and thinner than the minimum processing size F. However, a width Wi2 taken along the gate-width direction, of each of the upper conductor film 4b and the conductor film 6 (word line), which does not overlap with the lower conductor film 4a and is located over the insulating film 7, is thicker than the width Wi1 of the conductor film 4a and thicker than one-half the word line-to-word line pitch 2F.

While the conductor films 6 for the control gate electrodes and the conductor films 4 for the floating gate electrodes are simultaneously patterned by a photolithography technology using a Levenson type phase shift upon patterning thereof in the word line direction as will be described later, the width Wi1 taken along the gate-width direction, of each lower conductor film 4a is represented by the following equation (2) assuming that the minimum wirable size processable by using the phase shift is represented as a:

$$A \leq Wi1 < F \quad (2)$$

Assuming that the minimum separable size processable by using the phase shift is represented as $b$, the width Wi2 taken along the gate-width direction of each upper conductor film 4b on the insulating film 7 is represented by the following equation (3):

$$F < Wi2 < 2F - b \quad (3)$$

Here, the minimum wirable size a is a size in which when each of the conductor films is thinned greater than or equal to it, breaking occurs or a desired characteristic is not obtained. The minimum separable size $b$ is a size in which when they are caused to approach each other beyond it, a short circuit occurs or a desired characteristic is not obtained.

Namely, the width Wi1 of the lower conductor film 4a can be processed thin with a reduced width (F−a) as a limit, whereas the width Wi2 of the upper conductor film 4b can be processed thick with an enlarged width (F−b) as a limit.

The surface of the upper conductor film 4b for the floating gate electrode is covered with the interlayer film 5. Thus, the conductor film 4 for the floating gate electrode is isolated from the conductor film 6 for the control gate electrode. The interlayer film 5 is formed by laminating a silicon oxide film on a silicon oxide film with a silicon nitride film interposed therebetween, for example. The thickness of the interlayer film 5 is about 15 nm, for example. The conductor film 6 is an electrode for reading, writing and erasing information and is formed integrally with its word line W. Further, the conductor film 6 is formed of a part of the word line W. The word line W is formed in a flat band-shaped pattern extending in the gate-width direction and has an outer shape identical to that of the conductor film 4 for the floating gate electrode. Further, the word lines W are placed side by side in parallel in plural form so as to take the word line-to-word line pitches 2F along the gate-length direction. The conductor film 6 (word line W) for the control gate electrode is formed by stacking, for example, two-layer conductor films (lower conductor film 6a and upper conductor film 6b) on each other in order from below. The lower conductor film 6a comprises low-resistance polycrystalline silicon having a thickness of about 100 nm, for example. The upper conductor film 6b comprises tungsten silicide ($WSi_x$) having a thickness of about 80 nm, for example, and is laminated on the lower conductor film 6a in a state of being electrically connected thereto. Since the word line W can be reduced in electrical resistance owing to the provision of the upper conductor film 6b, the operating speed of the flash memory can be improved. However, the structure of the conductor film 6 is not limited to the above and can be changed in various ways. The conductor film 6 may adopt a structure wherein a metal film like tungsten or the like is laminated on low-resistance polycrystalline silicon with a barrier conductor film like tungsten nitride or the like interposed therebetween. Since the electrical resistance of the word line W can drastically be reduced in this case, the operating speed of the flash memory can further be improved. Incidentally, each of cap insulating films 8 comprising, for example, silicon oxide is formed on its corresponding word line W.

Incidentally, the structures of the devices or elements for the peripheral circuits like the short-circuit MOSN2, the selection MOSN1 and MOSN3 (see FIG. 2 and the like), etc. are formed according to the same process as the memory cell MC. In particular, a gate electrode 9 of each short-circuit MOSN2 and gate electrodes 10 of the selection MOSN1 and MOSN3 respectively have structures wherein the conductor films 6 for the control gate electrodes are respectively stacked on the conductor films 4 for the floating gate electrodes with the interlayer films 5 interposed therebetween. Incidentally, a detailed description about the device structures of the short-circuit MOSN2 and selection MOSN1 and MOSN3 will be omitted herein.

Further, each of the sides of the conductor film 4 for the floating gate electrode, the conductor film 6 for the control gate electrode, the gate electrodes 9 and 10, and the cap insulating film 8 is covered with an insulating film 12a made up of, for example, silicon oxide. In particular, each spacing defined between the word lines W adjacent to each other in the gate-width direction is kept in a state of being buried by the insulating film 12a. An insulating film 12b comprising silicon oxide, for example, is deposited on such an insulating film 12a and a conductor film 6.

Each of first layer wirings L1 made up of, for example, tungsten or the like is formed on the insulating film 12b. A predetermined first layer wiring L1 is electrically connected to an n-type semiconductor region of each selection MOSN1 through its corresponding contact hole CON1 defined in the insulating film 12b. Further, an insulating film 12c comprised of, for example, silicon oxide is deposited on the insulating film 12b and hence the surface of each first layer wiring L1 is covered with the insulating film 12c. A second layer wiring L2 is formed on the insulating film 12c. The second layer wiring L2 is formed by laminating, for example, titanium nitride, aluminum and titanium nitride on one another in order from below and is electrically connected to its corresponding first layer wiring L1 through a through hole TH1 defined in the insulating film 12c. The surface of the second layer wiring L2 is covered with an insulating film 12d which comprises silicon oxide, for example.

A coupling ratio of each memory cell MC will next be described on the basis of a plan view of a memory cell shown in FIG. 8(a) and a cross-sectional view corresponding to a cross section shown in the same FIG. 8(b), which is taken along a channel length direction in FIG. 8(a) referred to above. A description will be made here, of, as an example, a case in which the minimum processing size F is 0.2 μm, for example.

Let's first assume that a bit line-to-bit line pitch of the memory cell MC according to the present embodiment is 0.6 μm (3F), and a word line-to-word line pitch thereof is 0.4 μm (2F). Thus, a unit cell area thereof becomes 0.24 μm²(6F²). A width Li1 taken along a gate-length direction, of a lower conductor film 4a of a conductor film 4 for a floating gate electrode is 0.2 μm (F), and a width Li2 taken along the gate-length direction, of an upper conductor film 4b is 0.4 μm (2F). A width Li3 taken along the gate-length direction, of the upper conductor film 4b, which does not overlap with the lower conductor film 4a and is located on an insulating film 7, becomes 0.1 μm (F/2) as viewed on one side. Further, a width Wi1 taken along a gate-width direction, of the lower conductor film 4a is 0.16 μm thinner than the minimum processing size F, and a width Wi2 taken along the gate-width direction, of the upper conductor film 4b on the insulating film 7 is 0.24 μm thicker than the minimum processing size F.

Figure 48:
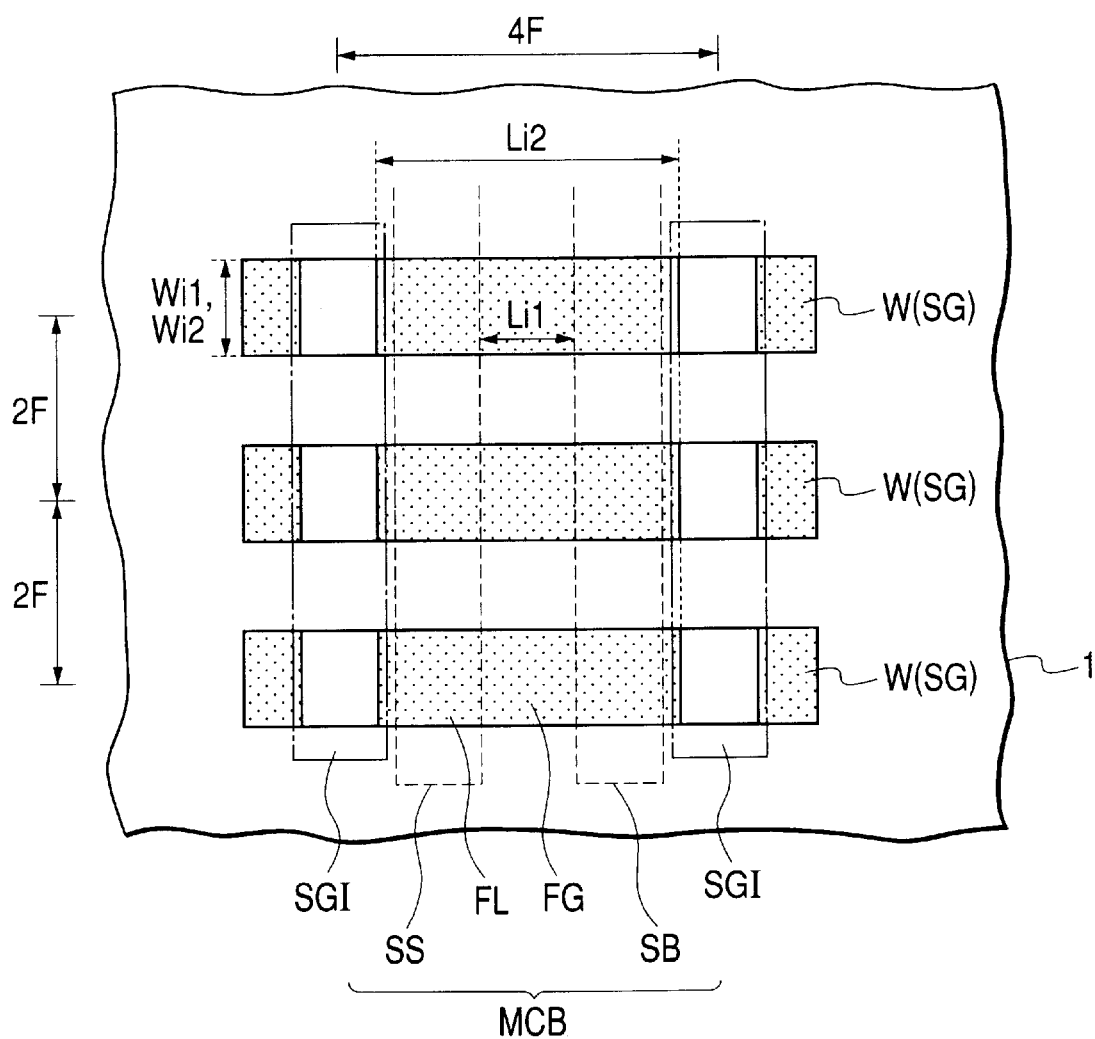
FIG. 48 is a fragmentary plan view showing an AND type flash memory discussed by the present inventors.

Incidentally, the memory cell shown in FIG. 48 will be illustrated as a comparative example 1. The bit line-to-bit line pitch of the memory cell is 0.8 μm (4F), and the word line-to-word line pitch thereof is 0.4 μm (2F). Thus, a unit cell area thereof becomes 0.32 μm²(8F²). A width Li1 taken along a gate-length direction, of a lower conductor film FG of a conductor film for each floating gate electrode is 0.2 μm (F), and a width Li2 taken along the gate-length direction, of an upper conductor film FL is about 0.6 μm (3F). Further, a width Wi1 taken along a gate-width direction, of the lower conductor film FG, and a width Wi2 taken along the gate-width direction, of the upper conductor film FL is 0.2 μm (F).

Further, a memory cell wherein the bit line-to-bit line pitch of the memory cell shown in FIG. 48 is simply scaled, will be illustrated as a comparative example 2. A bit line-to-bit line pitch of the memory cell is 0.6 μm (3F), and a word line-to-word line pitch thereof is 0.4 μm (2F). Thus, a unit cell area thereof becomes 0.24 μm² (6F²). A width taken along a gate-length direction, of a lower conductor film of a conductor film for each floating gate electrode is 0.2 μm (F), and a width taken along the gate-length direction, of an upper conductor film is 0.4 μm (2F). A width taken along the gate-length direction, of the upper conductor film which does not overlap with the lower conductor film, becomes 0.1 μm (F/2) on one side. Further, a width taken along a gate-width direction, of each of the lower conductor film and the upper conductor film is 0.2 μm (F).

TABLE 1

|  | Present Invention (6F)² | Comparative Example 1 (8F)² | Comparative Example 2 (6F)² |
| --- | --- | --- | --- |
| Data Line Pitch | 3F | 4F | 3F |
| Word Line Pitch | 2F | 2F | 2F |
| Cell Area Ratio | 0.75 | 1 | 0.75 |
| Relative Coupling Ratio | 0.99 | 1 | 0.91 |
| Operating Time | 1 | 1 | 7 through 10 |

Characteristics (relative coupling ratio and operation time) of the memory cell MC according to the first embodiment, the memory cell according to the comparative example 1 and the memory cell according to the comparative example 2 will be summarized in Table 1 with the comparative example as the reference. In the memory cell according to the comparative example 2, a unit cell area is first reduced to a factor of 0.75 as compared with the memory cell according to the comparative example 1. However, each of areas opposed to each other between the upper conductor film for each floating gate electrode and the conductor film for each control gate electrode with the interlayer film interposed therebetween is reduced to ⅔ or less. Therefore, the relative coupling ratio is reduced up to 0.91, and the operating time becomes slow or delayed about 7 through 10 times. On the other hand, in the memory cell MC according to the first embodiment, the unit cell area is reduced to a factor of 0.75 as compared with the memory cell according to the comparative example 1, and each of areas opposed to each other between the upper conductor film 4b for each floating gate electrode and the conductor film 6 for each control gate electrode with the interlayer film 5 interposed therebetween is reduced to ⅔ or less. However, each of areas opposed to each other between the lower conductor film 4a for the floating gate electrode and the semiconductor substrate 1 with the insulating film 3a interposed therebetween is reduced to a factor of 0.8 so that a reduction in relative coupling ratio is limited to 0.99. It is thus possible to avoid a delay in operating time.

FIG. 9 shows the relationship between threshold voltages of the memory cell MC according to the first embodiment, the memory cell according to the comparative example 1 and the memory cell according to the comparative example 2 and operating times thereof at writing or erasing.

The relationship between the threshold voltage of the memory cell MC according to the first embodiment and the operating time thereof is substantially identical to that related to the memory cell according to the comparative example 1. Degradation in operating characteristic due to a reduction in unit cell area does not appear. Thus, the adoption of the memory cell MC according to the first embodiment is effective even for a flash memory which has adopted a multivalued (four-value) storage or memory technology that allows one memory cell to store a plurality of levels.

TABLE 2

|  | Write | | Erase | | Read | |
| --- | --- | --- | --- | --- | --- | --- |
|  | Select | Non-select | Select | Non-select | Select | Non-select |
| Gate Electrode | 20 V | 20 V | −20 V |  | 3.3 V | 3.3 V |
| Drain | 0 V | 6 V | 0 V |  | 1 V | 0 V |

TABLE 2-continued

|  | Write | | Erase | | Read | |
| --- | --- | --- | --- | --- | --- | --- |
|  | Select | Non-select | Select | Non-select | Select | Non-select |
| Source | floating | floating | floating |  | 0 V | 0 V |
| Substrate | 0 V | 0 V | 0 V |  | 0 V | 0 V |

One example illustrative of terminal potentials at write, erase and read operations of the memory cell MC having the AND type array configuration or structure, according to the first embodiment will be summarized in Table 2. Upon writing, electrons, which contribute to the formation of information, pass through a tunnel insulating film and are then introduced into the corresponding conductor film for each floating gate electrode from the whole surface of the semiconductor substrate. Further, upon erasing, the electrons held or retained in the conductor film for the floating gate electrode pass through the tunnel insulating film and are then discharged or emitted into the whole surface of the semiconductor substrate.

Incidentally, the write and erase operations are not limited to the above in particular. Even if the terminal potentials or the array configuration of the memory array is changed in various ways, it is possible to write and erase information.

TABLE 3

|  | Write | | Erase | | Read | |
| --- | --- | --- | --- | --- | --- | --- |
|  | Select | Non-select | Select | Non-select | Select | Non-select |
| Gate Electrode | −14 V | −14 V | 18 V |  | 3.3 V | 3.3 V |
| Drain | 4 V | 0 V | 0 V |  | 1 V | 0 V |
| Source | floating | Floating | Floating |  | 0 V | 0 V |
| Substrate | 0 V | 0 V | 0 V |  | 0 V | 0 V |

Another example illustrative of terminals potentials at the respective operations of the memory cell having the AND type array structure or configuration is shown in Table 3. Upon writing, electrons retained in the conductor film for each floating gate electrode are emitted into the corresponding drain region, whereas upon erasing, the electrons are injected into the conductor film for the floating gate electrode from the whole surface of the semiconductor substrate.

TABLE 4

|  | Write | | Erase | | Read | |
| --- | --- | --- | --- | --- | --- | --- |
|  | Select | Non-select | Select | Non-select | Select | Non-select |
| Gate Electrode | 10 V | 10 V | −10 V |  | 3.3 V | 3.3 V |
| Drain | 5 V | 0 V | Floating | — | 1 V | 0 V |
| Source | 0 V | 0 V | Floating | — | 0 V | 0 V |
| Substrate | 0 V | 0 V | 10 V | — | 0 V | 0 V |

A further example illustrative of terminal potentials at the respective operations of the memory cell having the AND type array configuration is shown in Table 4. Upon writing, electrons, which are moved from the source to the drain at high speed within the channel region of the substrate surface, obtain high energy in the neighborhood of the drain and are then injected into the corresponding conductor film for each floating gate electrode (Injection of Channel Hot Electrons). Upon erasing, the electrons held in the conductor film for the floating gate electrode are discharged or emitted into the substrate. Incidentally, the memory cell (see Tables 3 and 4) having the AND type array configuration has such a structure that the drain region is relatively higher than the source region in impurity concentration. Further, the area of the drain region is relatively larger than that of the source region.

One example of a method of manufacturing the flash memory according to the first embodiment will next be described in process order.

Figure 10:
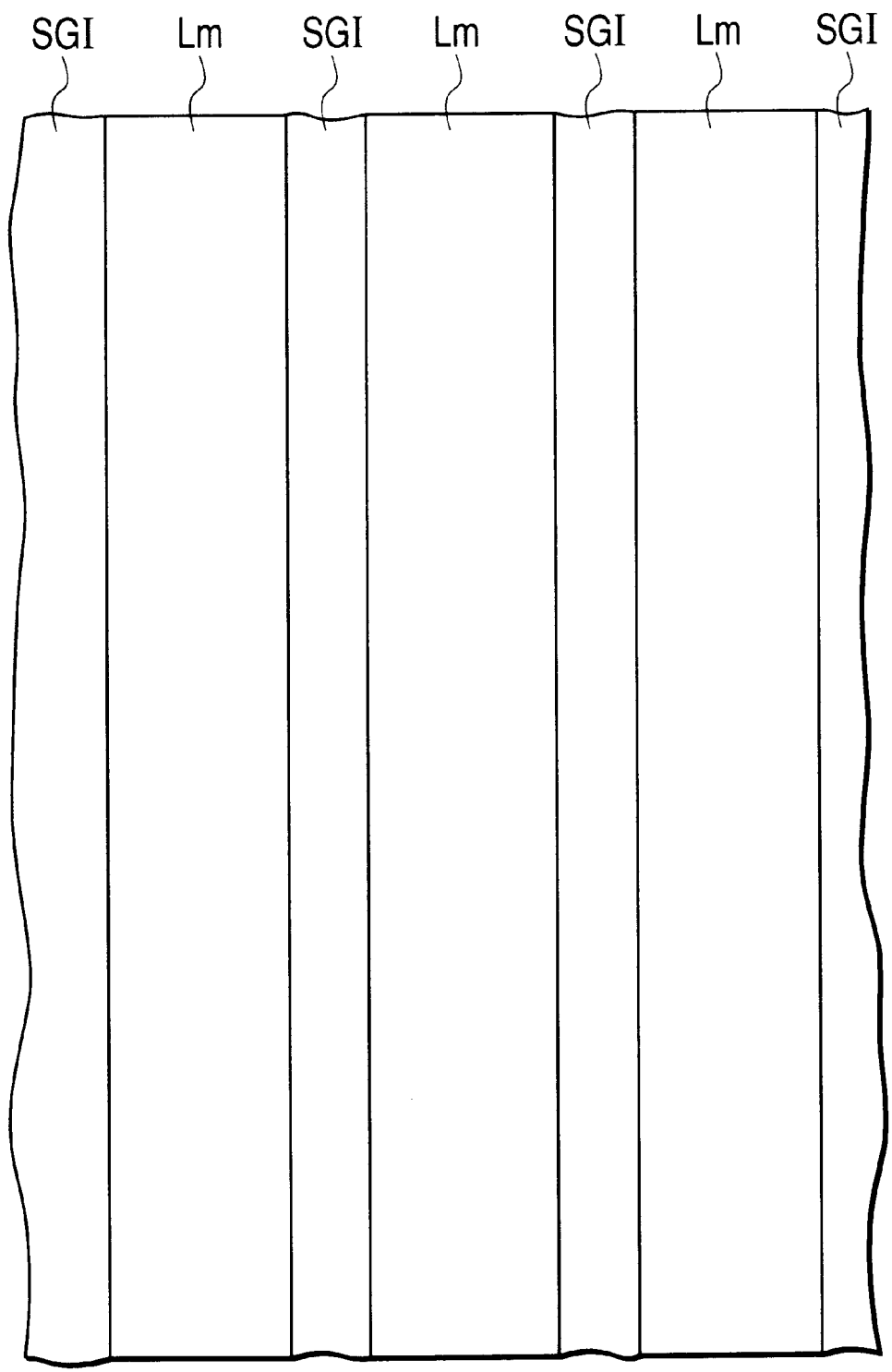
FIG. 10 is a fragmentary plan view in the process of manufacture of the flash memory shown in FIG. 1.
Figure 11:
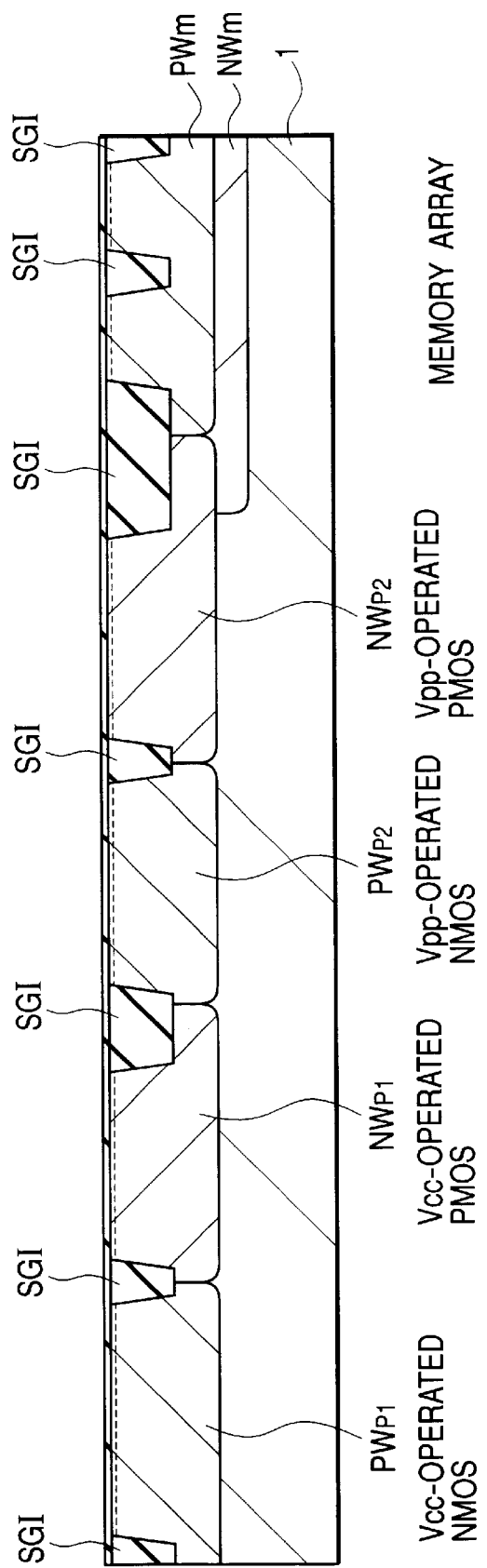
FIG. 11 is a fragmentary cross-sectional view showing the flash memory placed in the same process as FIG. 10.
Figure 12:
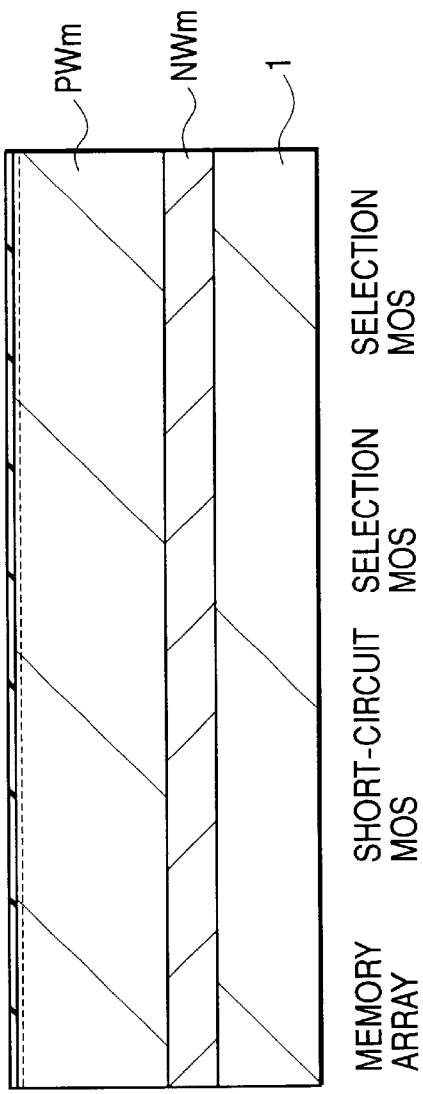
FIG. 12 is a fragmentary cross-sectional view illustrating a point of the flash memory in the same process as FIG. 10, which is different from FIG. 11.

FIGS. 10 through 12 respectively show drawings placed during the manufacturing process of the flash memory according to the first embodiment. FIG. 10 is a fragmentary plan view of a point equivalent to FIG. 3 referred to above. FIG. 11 is a fragmentary cross-sectional view including a memory array of the flash memory and peripheral circuit areas or regions thereof. The memory array used herein is equivalent to the cross-section taken along line A—A of FIG. 3. FIG. 12 is equivalent to a cross-section taken along line B—B of FIG. 3. Incidentally, Vpp-operated NMOSs and PMOSs are respectively MOSs used for relatively high voltage-operated peripheral circuits whose drive voltages are about 8V, for example. Further, Vcc-operated NMOSs and PMOSs are respectively MOSs used for relatively low voltage-operated peripheral circuits whose drive voltages range from about 1.8V to about 3.3V, for example (which are identical in the subsequent drawings).

As shown in FIGS. 10 through 12, for example, trench-type isolations SGIs and active regions Lm placed so as to be surrounded by them, etc. are first formed on a main surface of a semiconductor substrate (thin plate of a semiconductor whose plane is approximately circular, which is called a "semiconductor wafer" in this stage). Namely, isolation trenches are defined in predetermined points or locations of the semiconductor substrate 1. Thereafter, an insulating film formed of, for example, silicon oxide is deposited on the main surface of the semiconductor substrate 1. Further, the insulating film is polished or ground by a CMP (Chemical Mechanical Polishing) method or the like so that the insulating film is left in the isolation trenches, whereby the isolations SGIs are formed.

Subsequently, predetermined impurities are selectively introduced into predetermined portions of the semiconductor substrate 1 under predetermined energy by ion implantation or the like to thereby form an n well NWm, a p well PWm, p wells PWp1 and PWp2 and n wells NWp1 and NWp2 buried therein.

Figure 13:
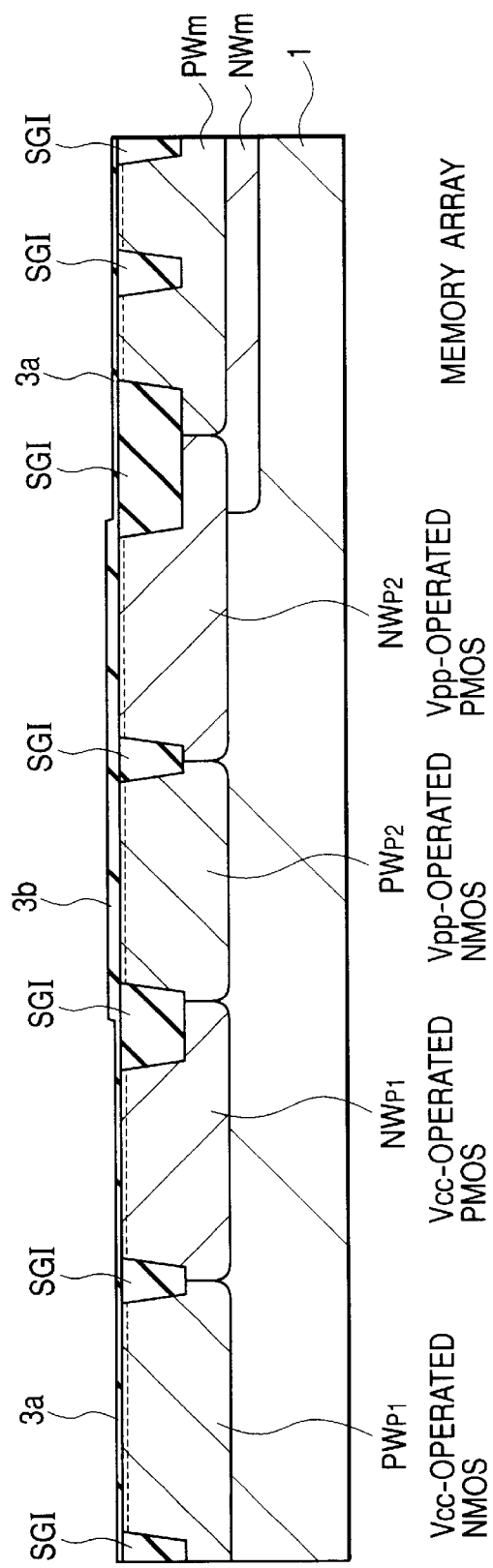
FIG. 13 is a fragmentary cross-sectional view depicting the same point as FIG. 11, which is placed during the process of manufacture of the flash memory following FIGS. 10 through 12.
Figure 14:
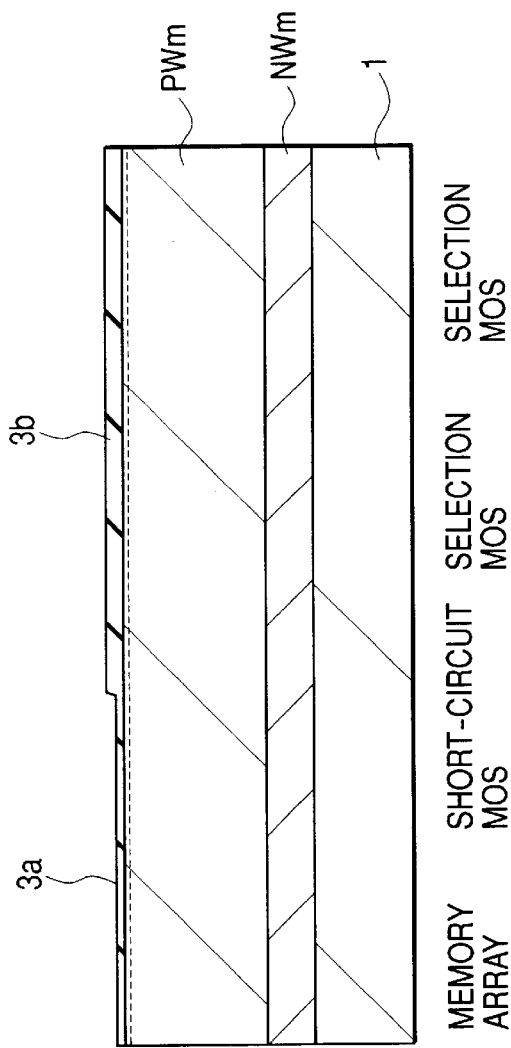
FIG. 14 is a fragmentary cross-sectional view showing the same point as FIG. 12, of the flash memory in the same process as FIG. 13.

Next, FIG. 13 is a fragmentary cross-sectional view of the same point or place as FIG. 11 in the subsequent manufacturing process, and FIG. 14 is a fragmentary cross-sectional view of the same point or place as FIG. 12 in the subsequent manufacturing process, respectively. Two types of insulating films 3a and 3b different in thickness from each other are formed herein as shown in FIGS. 13 and 14. They are formed in the following manner, for example.

First of all, a thick insulating film having a thickness of about 20 nm, for example, is formed on the main surface of the semiconductor substrate 1 by a thermal oxidation method or the like. Subsequently, the memory array and the low voltage-operated MOS regions (illustrated as Vcc-operated PMOS and Vcc-operated NMOS) are exposed on the thick insulating film, and such a photoresist pattern as to cover portions other than those referred to above is formed. Afterwards, the photoresist pattern is used as an etching mask and the thick insulating film exposed therefrom is removed by wet etching or the like. Thereafter, the semiconductor substrate 1 is subjected to the thermal oxidation processing or the like again after the removal of the photoresist pattern in order to form a tunnel oxide film in the memory array. Thus, a relatively thin gate insulator 3a having a thickness of, for example, about 9 nm is formed on the memory array (including each short-circuit MOS region) and the low voltage-operated MOS regions, whereas a relatively thick insulating film 3b having a thickness of about 25 nm is formed on the high voltage-operated MOS regions (illustrated as the Vcc-operated PMOS and Vpp-operated NMOS) and selection MOS regions.

Figure 15:
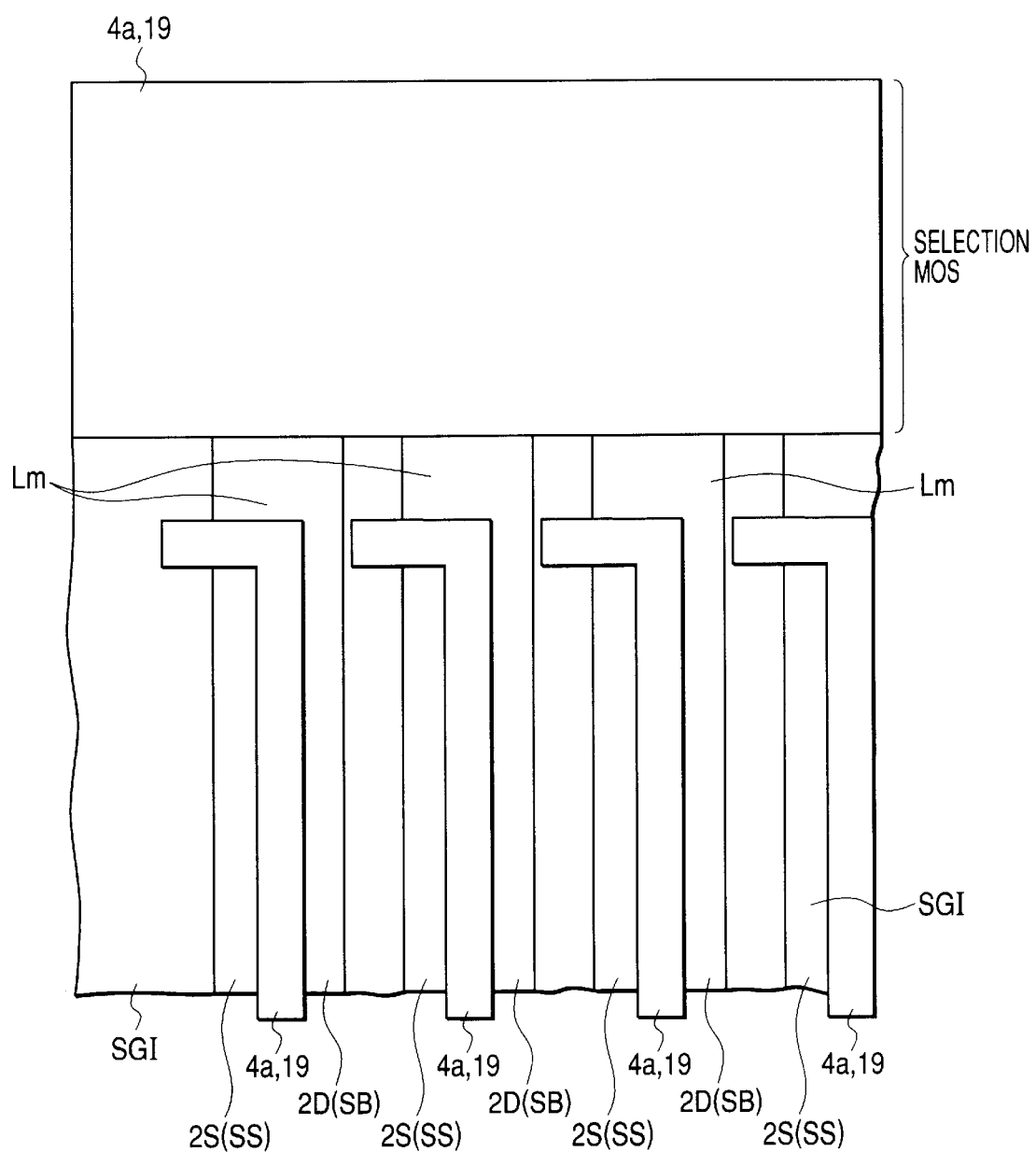
FIG. 15 is a fragmentary plan view illustrating the same point as FIG. 10, which is placed during the process of manufacture of the flash memory following FIGS. 13 and 14.
Figure 16:
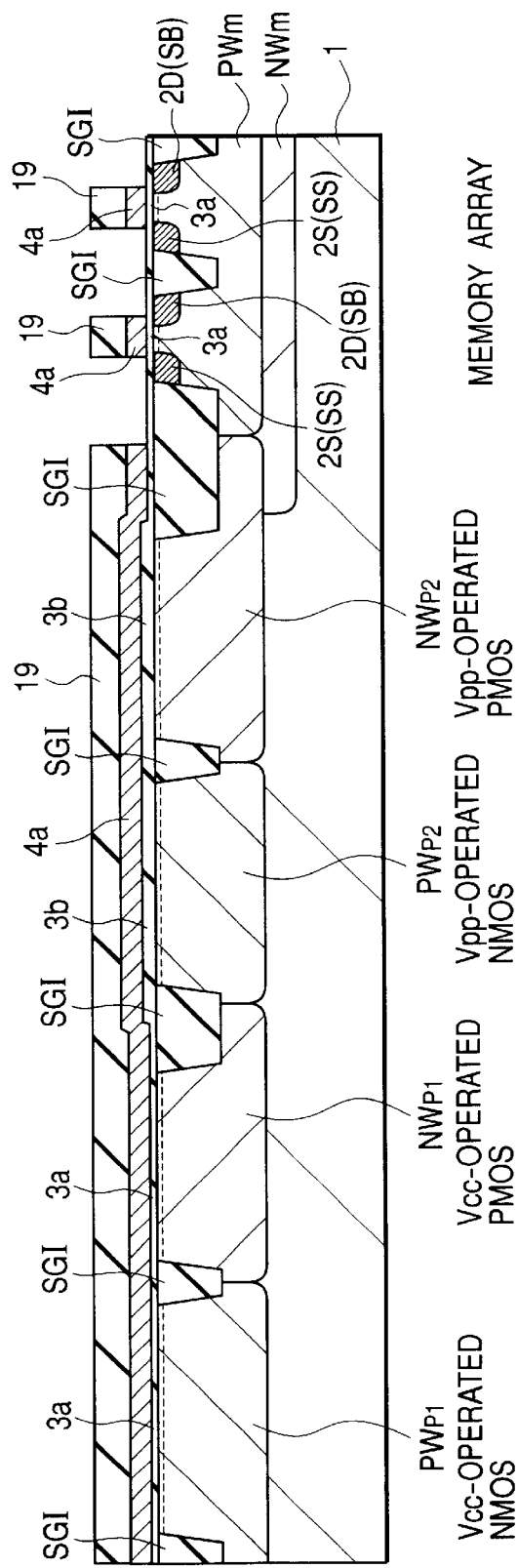
FIG. 16 is a fragmentary cross-sectional view depicting the same point as FIG. 11, of the flash memory in the same process as FIG. 15.
Figure 17:
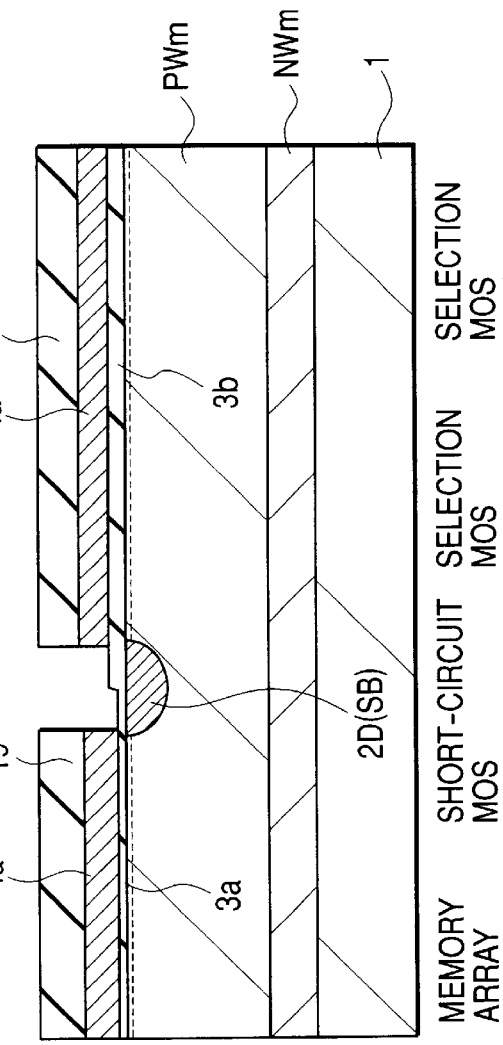
FIG. 17 is a fragmentary cross-sectional view showing the same point as FIG. 12, of the flash memory in the same process as FIG. 15.

Next, FIG. 15 is a fragmentary plan view of the same point or place as FIG. 10 in the subsequent manufacturing process, FIG. 16 is a fragmentary cross-sectional view of the same point as FIG. 11 in the subsequent manufacturing process, and FIG. 17 is a fragmentary cross-sectional view of the same point as FIG. 12 in the subsequent manufacturing process, respectively.

First of all, lower conductor films 4a formed of low-resistance polycrystalline silicon having a thickness of, for example, about 70 nm, and insulating films 19 formed of silicon oxide or the like are deposited on the main surface of the semiconductor substrate 1 in order from below by a CVD method or the like. Thereafter, the insulating films 19 and the lower conductor films 4a are processed by a photolithography technology and a dry etching technology to thereby pattern the lower conductor films 4a for forming floating gate electrodes in the memory array. At this time, peripheral circuit regions (such as high voltage-operated MOS regions, low voltage-operated MOS regions and selection MOS regions, etc.) are covered with the lower conductor film 4a and the insulating film 19 as a whole. Subsequently, an impurity (e.g., arsenic) for a source and drain of each memory cell is introduced into the semiconductor substrate 1 by ion implantation or the like to thereby form each pair of n type semiconductor regions 2S and 2D (local source lines SS and sub bit lines SB). At this time, each of the high voltage-operated MOS regions, the low voltage-operated MSO regions and the selection MOS regions, etc. is covered with the lower conductor film 4a. Thus, a gate length of each short-circuit MOS can be determined by the lower conductor film 4a alone.

Figure 18:
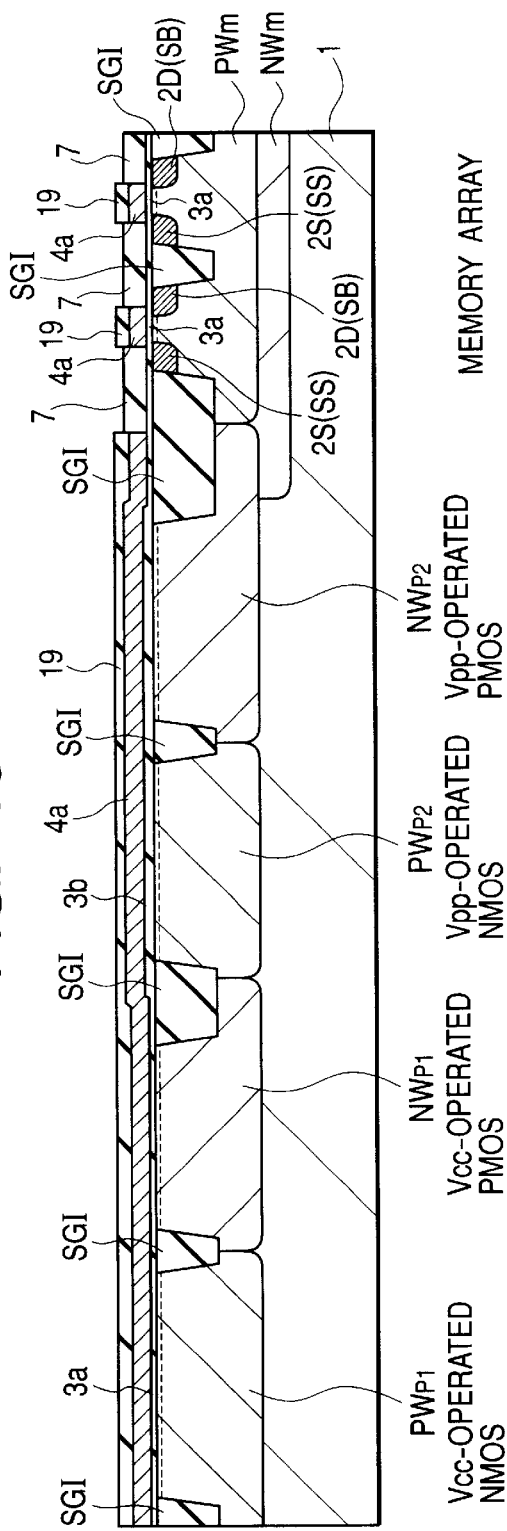
FIG. 18 is a fragmentary cross-sectional view illustrating the same point as FIG. 11, which is placed during the process of manufacture of the flash memory following FIGS. 15 through 17.
Figure 19:
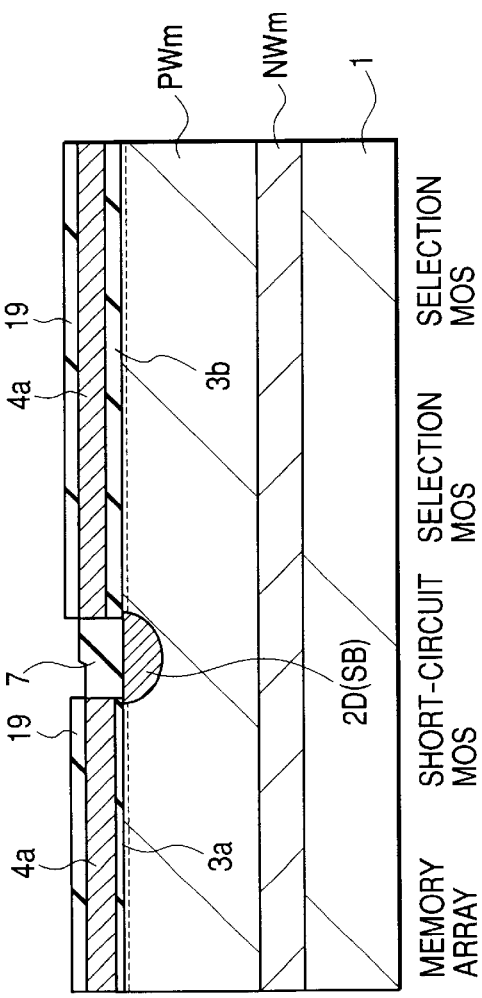
FIG. 19 is a fragmentary cross-sectional view depicting the same point as FIG. 12, of the flash memory in the same process as FIG. 18.

Next, FIG. 18 is a fragmentary cross-sectional view of the same point as FIG. 11 in the subsequent manufacturing process, and FIG. 19 is a fragmentary cross-sectional view of the same point as FIG. 12 in the subsequent manufacturing process.

An insulating film (second insulating film) 7 made up of, for example, silicon oxide is first deposited on the main surface of the semiconductor substrate 1 by the CVD method or the like herein. Thereafter, the insulating film 7 is polished by a CMP method so as to be left within cavities on the main surface of the semiconductor substrate 1. Further, the insulating film 7 is etched by a dry etching method or the like. Thus, the main surface of the semiconductor substrate 1 is fattened. Further, an upper conductor film deposited thereon for each floating gate electrode, which is to be described later, is provided so as not to make contact with the n type semiconductor regions 2S and 2D for the source and drain of the memory cell. While the insulating film 19 is also removed at this time, it functions so as to protect a lower layer.

Figure 20:
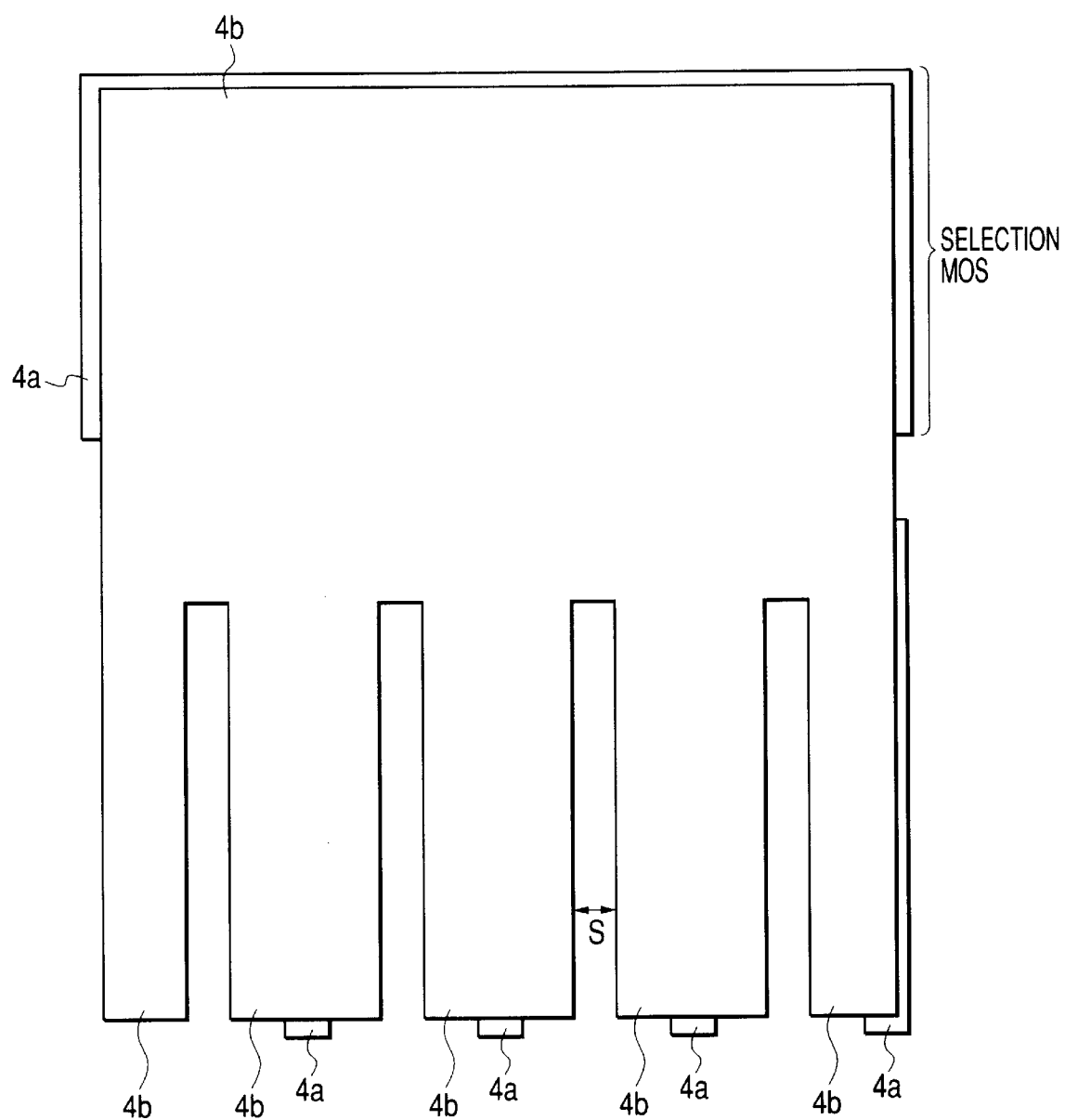
FIG. 20 is a fragmentary plan view showing the same point as FIG. 10, which is placed during the process of manufacture of the flash memory following FIGS. 18 and 19.
Figure 21:
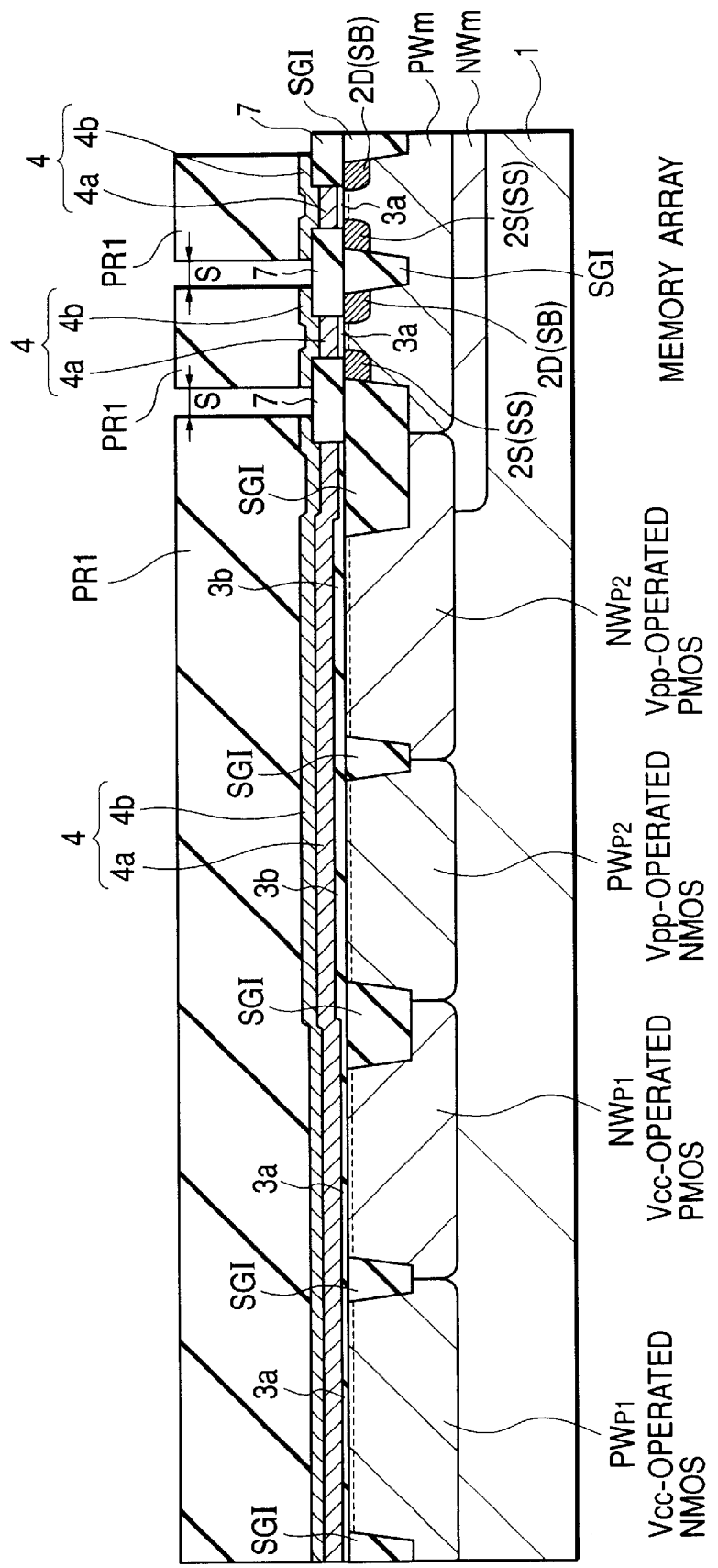
FIG. 21 is a fragmentary cross-sectional view illustrating the same point as FIG. 11, of the flash memory in the same process as FIG. 20.
Figure 22:
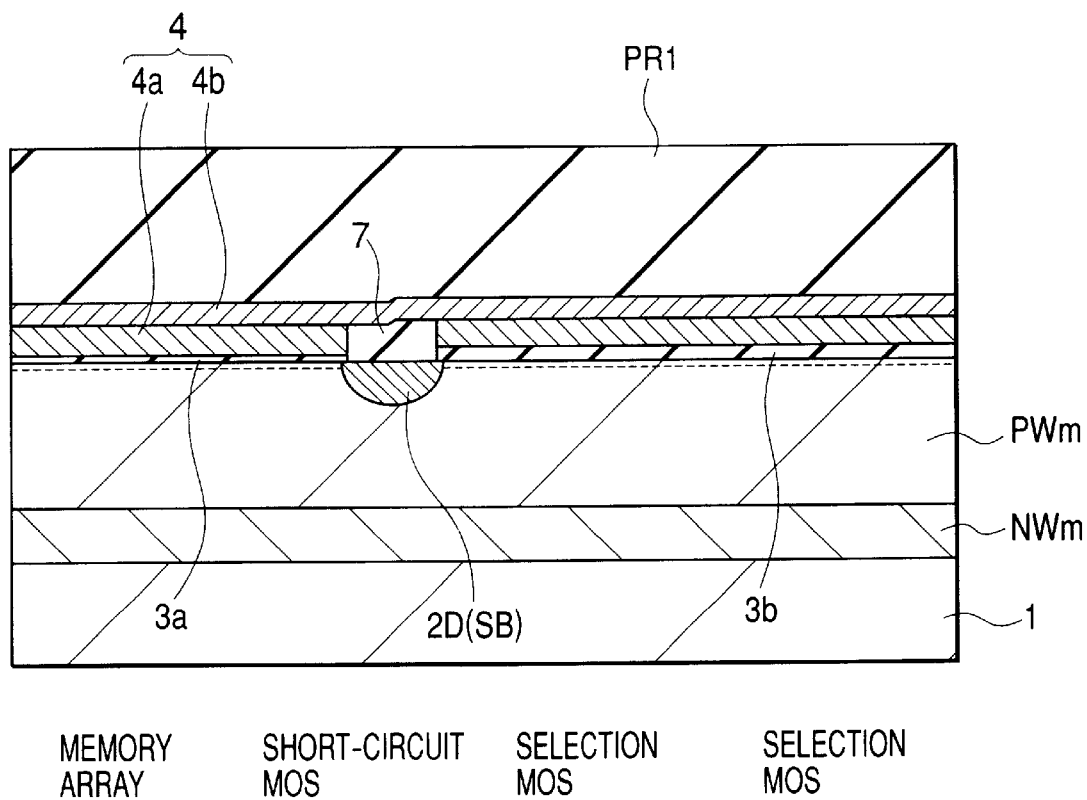
FIG. 22 is a fragmentary cross-sectional view depicting the same point as FIG. 12, of the flash memory in the same process as FIG. 20.

Next, FIG. 20 is a fragmentary plan view of the same point as FIG. 10 in the subsequent manufacturing process, FIG. 21 is a fragmentary cross-sectional view of the same point as FIG. 11 in the subsequent manufacturing process, and FIG. 22 is a fragmentary cross-sectional view of the same point as FIG. 12 in the subsequent manufacturing process.

First of all, an upper conductor film 4b formed of low-resistance polycrystalline silicon having a thickness of about 40 nm is deposited on the main surface of the semiconductor substrate 1. Afterwards, a photoresist pattern PR1 is formed on the upper conductor film 4b by the photolithography technology. Further, the photoresist pattern PR1 is used as an etching mask and the upper conductor film 4b exposed therefrom is removed by the dry etching method or the like, whereby each floating gate electrode comprising the lower conductor film 4a and the upper conductor film 4b is formed. At this time, the high voltage-operated MOS regions, low voltage-operated MSO regions, short-circuit MOS regions and selection MOS regions, etc. are covered with the upper conductor film 4b as a whole.

Figure 23:
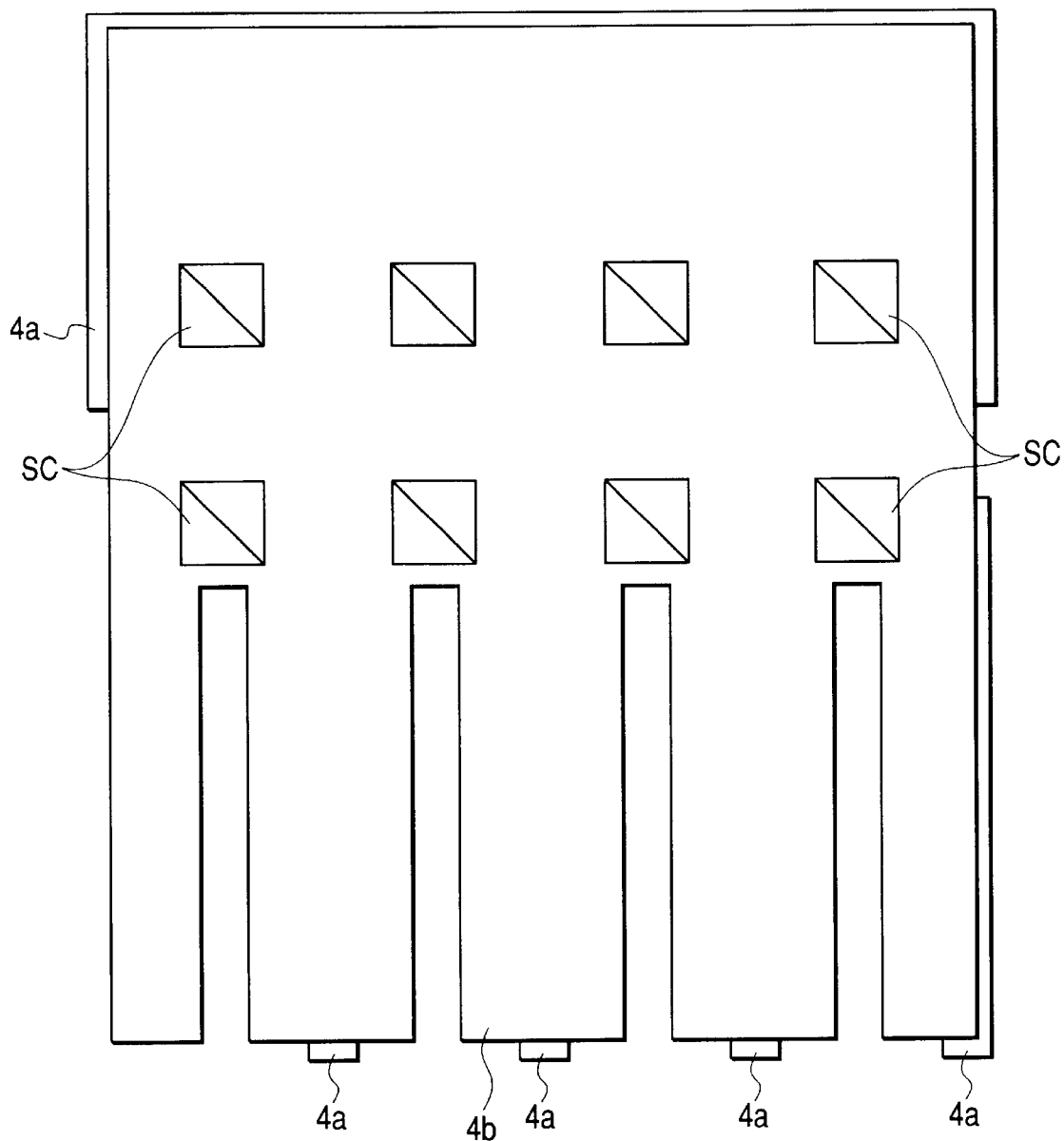
FIG. 23 is a fragmentary plan view showing the same point as FIG. 10, which is placed during the process of manufacture of the flash memory following FIGS. 20 through 22.
Figure 24:
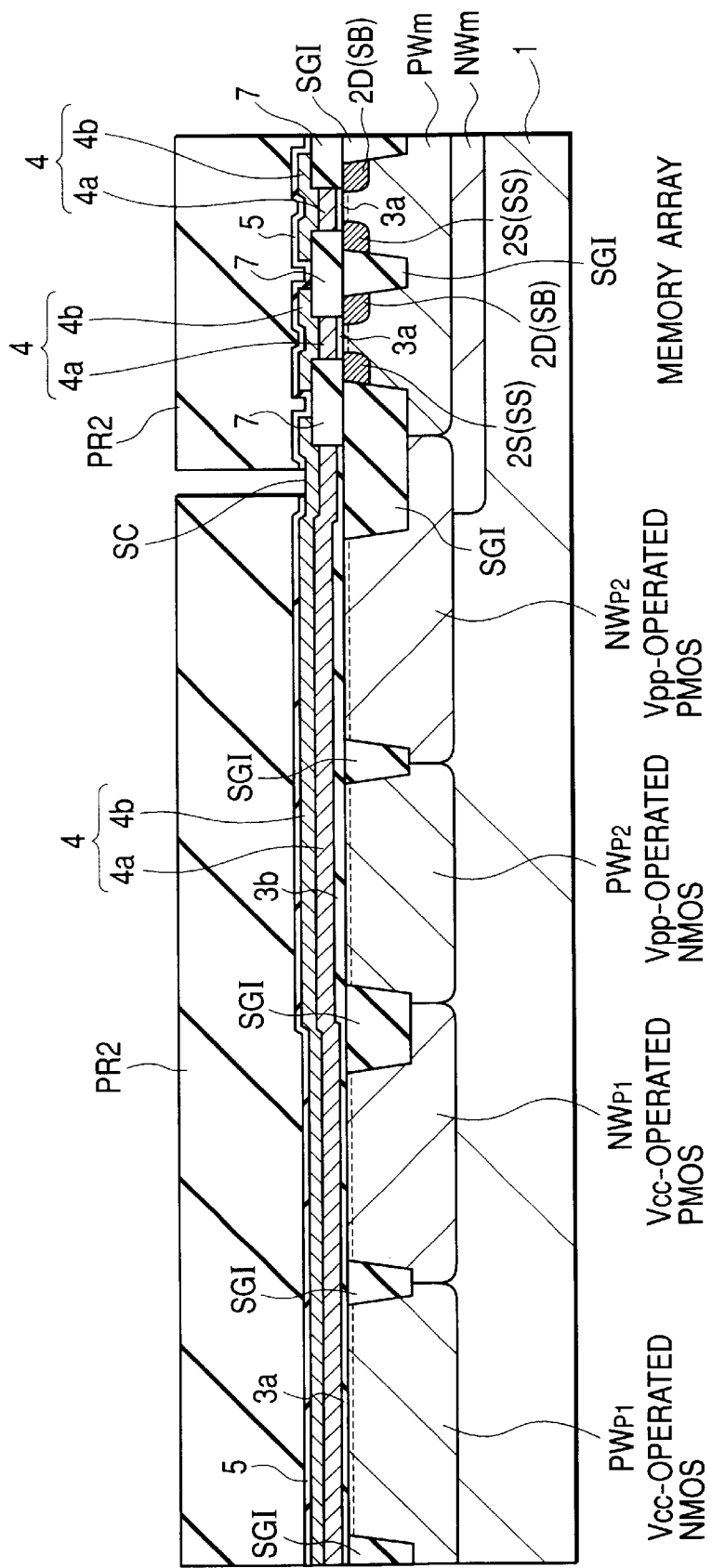
FIG. 24 is a fragmentary cross-sectional view illustrating the same point as FIG. 11, of the flash memory in the same process as FIG. 23.
Figure 25:
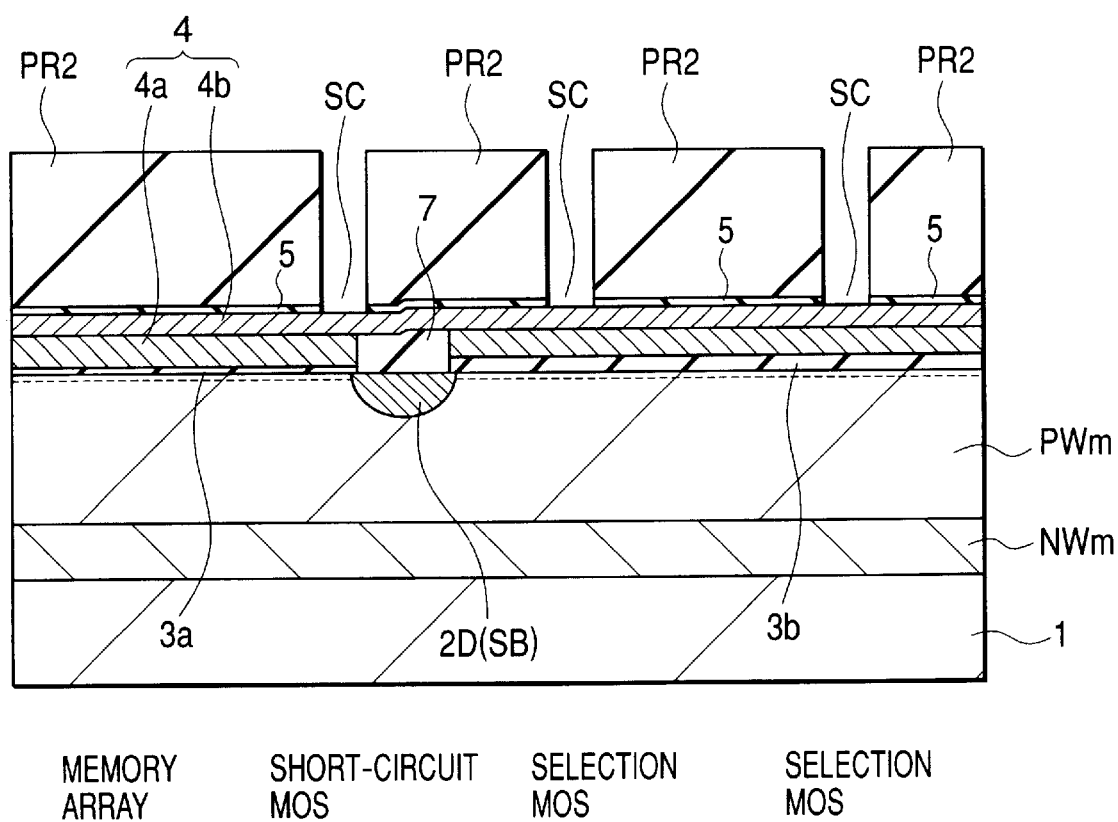
FIG. 25 is a fragmentary cross-sectional view depicting the same point as FIG. 12, of the flash memory in the same process as FIG. 23.

Next, FIG. 23 is a fragmentary plan view of the same point as FIG. 10 in the subsequent manufacturing process, FIG. 24 is a fragmentary cross-sectional view of the same point as FIG. 11 in the subsequent manufacturing process, and FIG. 25 is a fragmentary cross-sectional view of the same point as FIG. 12 in the subsequent manufacturing process.

First of all, for example, a silicon oxide film, a silicon nitride film and a silicon oxide film are deposited on the semiconductor substrate 1 in order from below by the CVD method or the like, whereby an interlayer film (third insulating film) 5 having a thickness of, for example, about 15 nm is formed. Thereafter, a photoresist pattern PR2 for forming each contact hole SC is formed on the insulating film 5 by the photolithography technology. Subsequently, the photoresist pattern PR2 is used as an etching mask, and the interlayer film 5 exposed therefrom is removed by the dry etching method or the like, whereby the contact holes SC are defined in the interlayer film 5. Incidentally, in FIG. 23, the contact holes placed in an upper row are disposed on a gate electrode forming region or area of each selection MOS, whereas the contact holes SC placed in a lower row are disposed on a gate electrode forming region of each short-circuit MOS. While no contact holes SC are shown in high voltage-operated and low voltage-operated MOS regions in FIG. 24, the contact holes SC, each of which exposes part of the conductor film 4b on each of the gate electrode forming regions of those MOSs, are defined in other positions not shown in the cross-section shown in FIG. 24.

Figure 26:
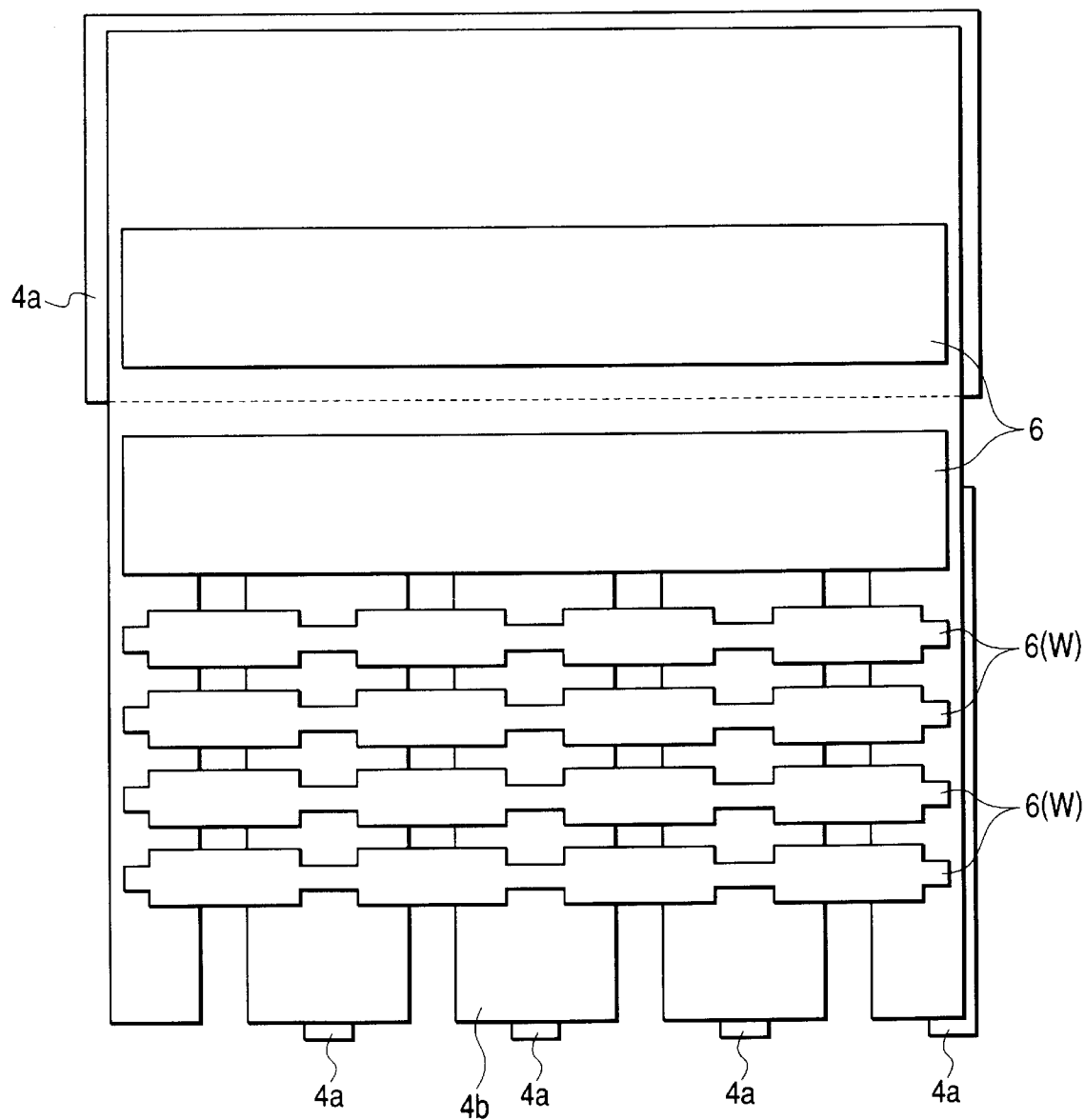
FIG. 26 is a fragmentary plan view showing the same point as FIG. 10, which is placed during the process of manufacture of the flash memory following FIGS. 23 through 25.
Figure 27:
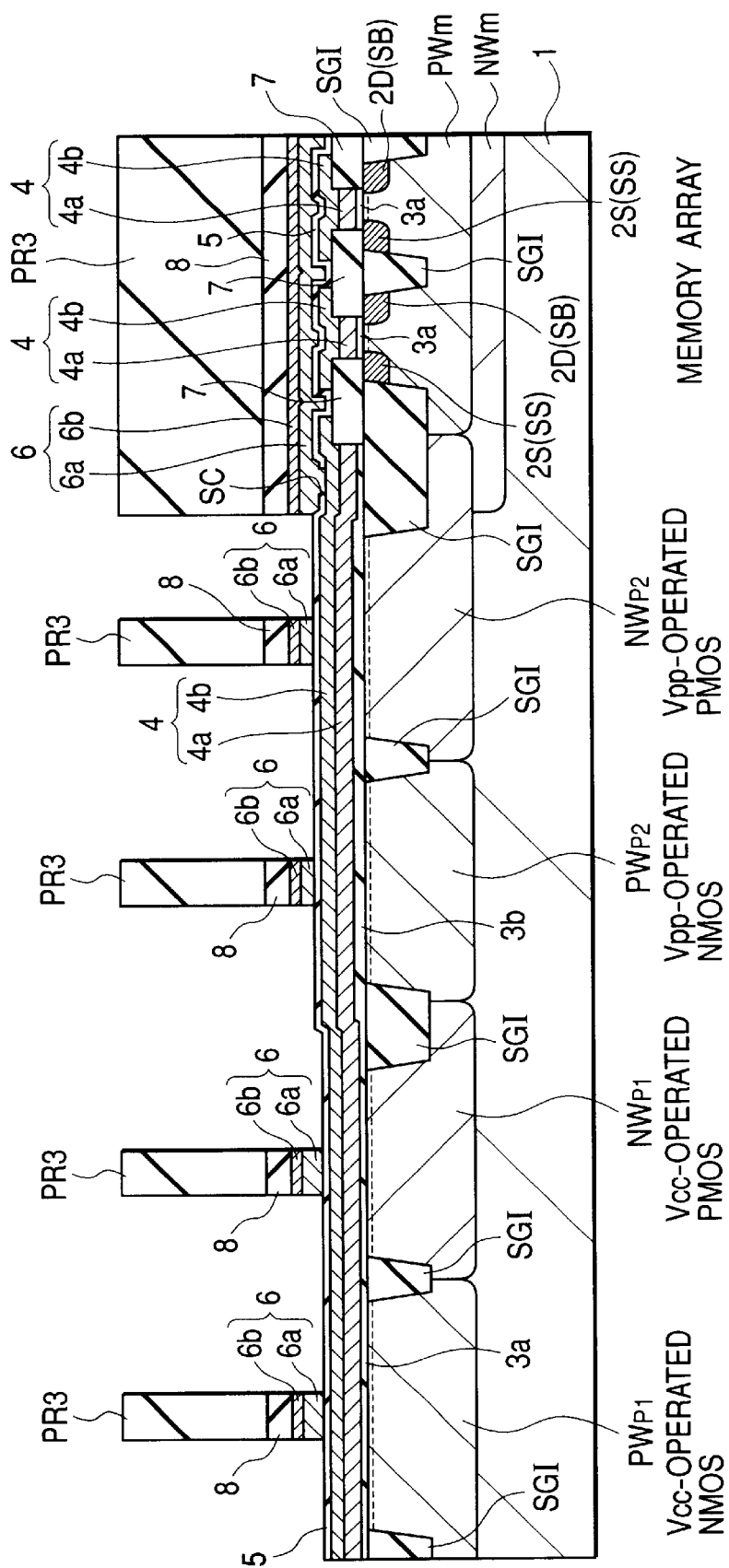
FIG. 27 is a fragmentary cross-sectional view depicting the same point as FIG. 11, of the flash memory in the same process as FIG. 26.
Figure 28:
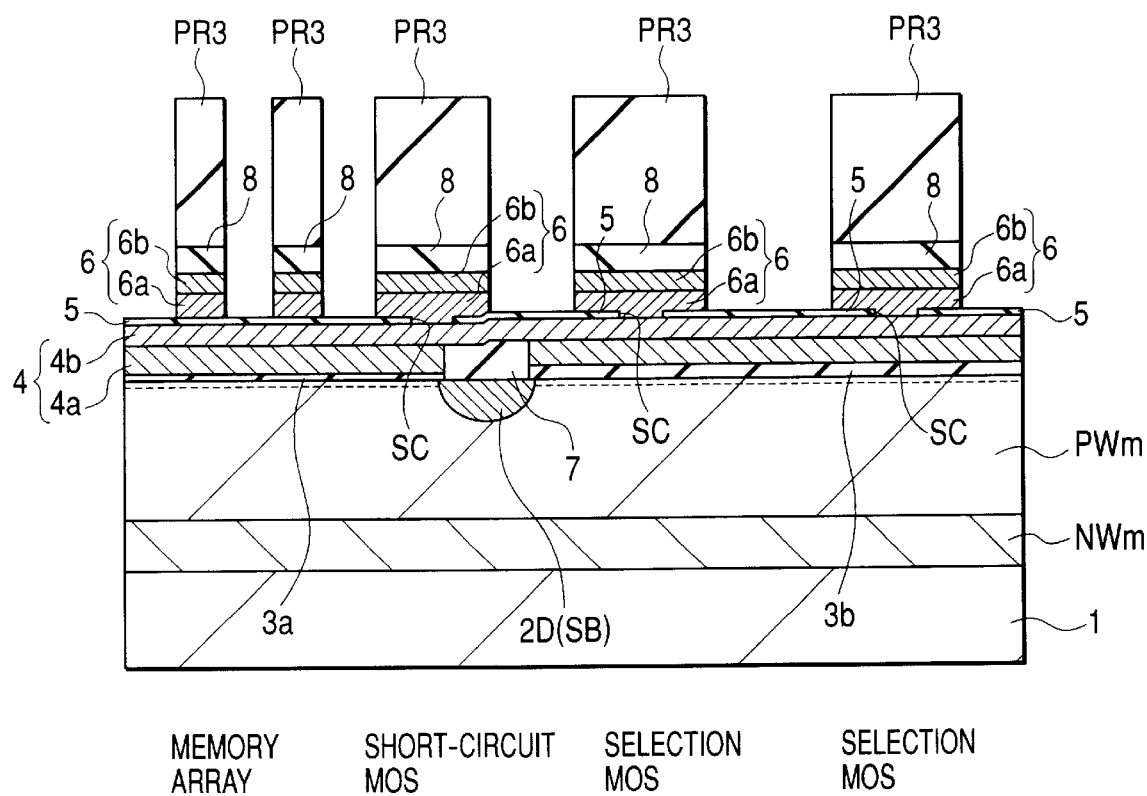
FIG. 28 is a fragmentary cross-sectional view illustrating the same point as FIG. 12, of the flash memory in the same process as FIG. 26.

Next, FIG. 26 is a fragmentary plan view of the same point as FIG. 10 in the subsequent manufacturing process, FIG. 27 is a fragmentary cross-sectional view of the same point as FIG. 11 in the subsequent manufacturing process, and FIG. 28 is a fragmentary cross-sectional view of the same point as FIG. 12 in the subsequent manufacturing process.

First of all, a lower conductor film 6a comprising, for example, low-resistance polycrystalline silicon, an upper conductor film 6b comprising tungsten silicide or the like, and a cap insulating film 8 comprising silicon oxide or the like are deposited on the semiconductor substrate 1 in order from below by the CVD method or the like herein. Thereafter, a photoresist pattern PR3 is formed thereon by the photolithography technology. The photoresist pattern PR3 is used as an etching mask, and the cap insulating film 8, the upper conductor film 6b and the lower conductor film 6a exposed therefrom are removed by the dry etching method or the like, whereby control gate electrodes (word lines W) are formed in the memory array, and parts of gate electrodes of individual MOSs are formed in regions other than the control gate electrodes, i.e., high voltage-operated MOS regions, low voltage-operated MOS regions, short-circuit MOS regions and selection MOS regions, etc. Upon such an etching process, an interlayer film 5 is caused to serve as an etching stopper.

Since there is no step between the memory array and each peripheral circuit region in the first embodiment, the word lines W can be processed at narrow pitches. Further, the Levenson type phase shift capable of ensuring a predetermined focal depth and improving resolution is used in the photolithography (exposure processing) process for forming the photoresist pattern PR3. It is thus possible to form line/space (e.g., 0.16/0.24 μm or 0.24/0.16 μm) of each word line W designed so as to be thinner than the minimum processing size F (e.g., 0.2 μm).

In the Levenson type phase shift, the phase of one of lights transmitted through adjacent apertures or openings is reversed 180° to thereby cause the two lights diffracted upon transmission thereof through the adjacent aperture to interfere with each other on the semiconductor wafer. The inversion of the phase of the light is implemented by adding a layer called a "phase shifter" to each aperture or opening on the mask. Using the interference of the light allows improvements in resolution and focal depth.

Figure 29:
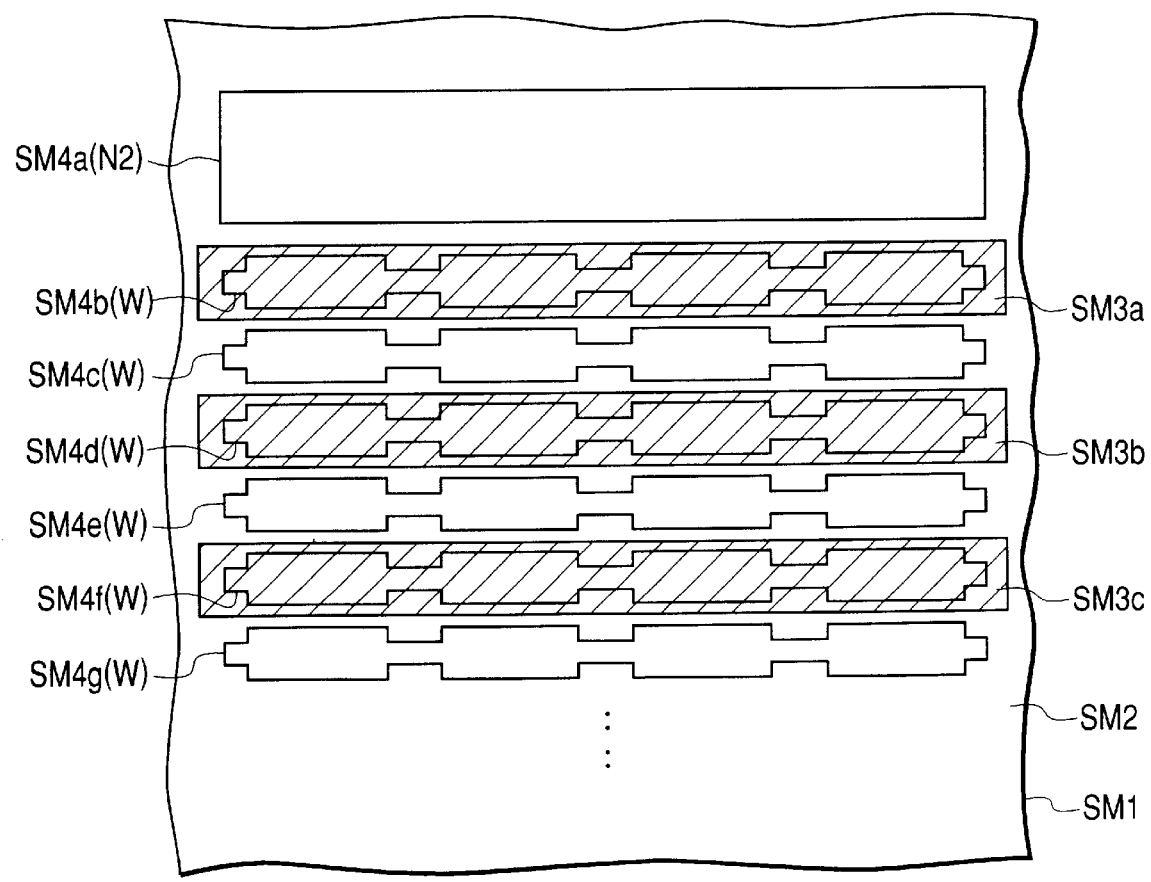
FIG. 29 is a fragmentary plan view showing one example of a phase shift mask.

FIG. 29 shows one example of a fragmentary plan view of the phase shift mask used upon forming the photoresist pattern PR3. In the same drawing, SM1 indicates a mask substrate which comprises quart glass or the like, SM2 indicates a light-shielding film made up of chromium (Cr) or the like, SM3a through SM3c indicate phase shifters, and SM4a through SM4g indicate mask substrate exposed portions or non-shift light-transmitted portions, respectively. Incidentally, a quartz glass substrate per se is not necessarily exposed even if the substrate exposed portions are adopted. The substrate per se may comprise a quartz glass substrate used as a substrate body, and a thin transparent film formed on the surface thereof. Each of the phase shifters SM3a through SM3c is one in which the thickness (thickness of a central portion in a shifter aperture or opening) of a transparent material determined according to the refractive index of the transparent material and the wavelength of transmitted light. Each of the phase shifters is a transparent thin film which comprises SOG (Spin On Glass), indium oxide (InO$_x$) or the like.

Figure 30:
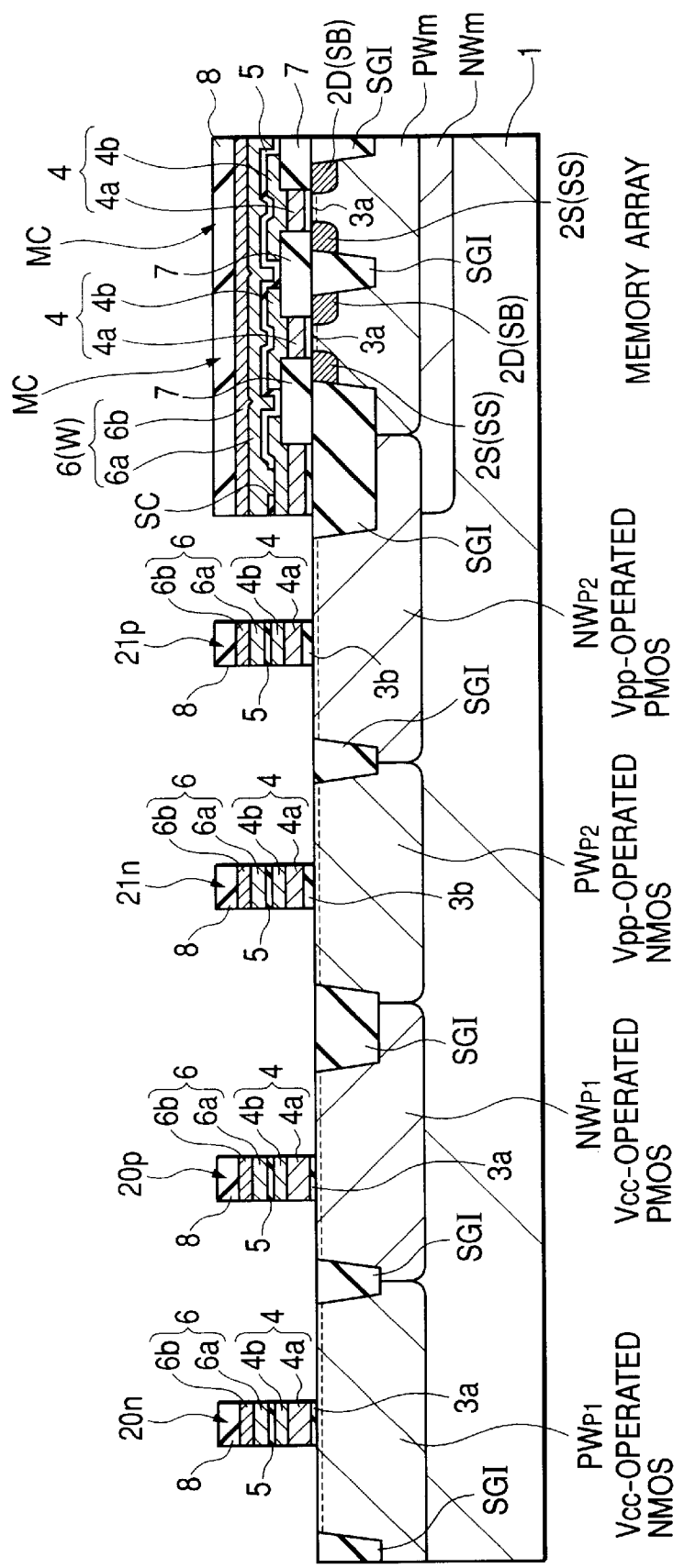
FIG. 30 is a fragmentary cross-sectional view showing the same point as FIG. 11, which is placed during the process of manufacture of the flash memory following FIGS. 26 through 28.
Figure 31:
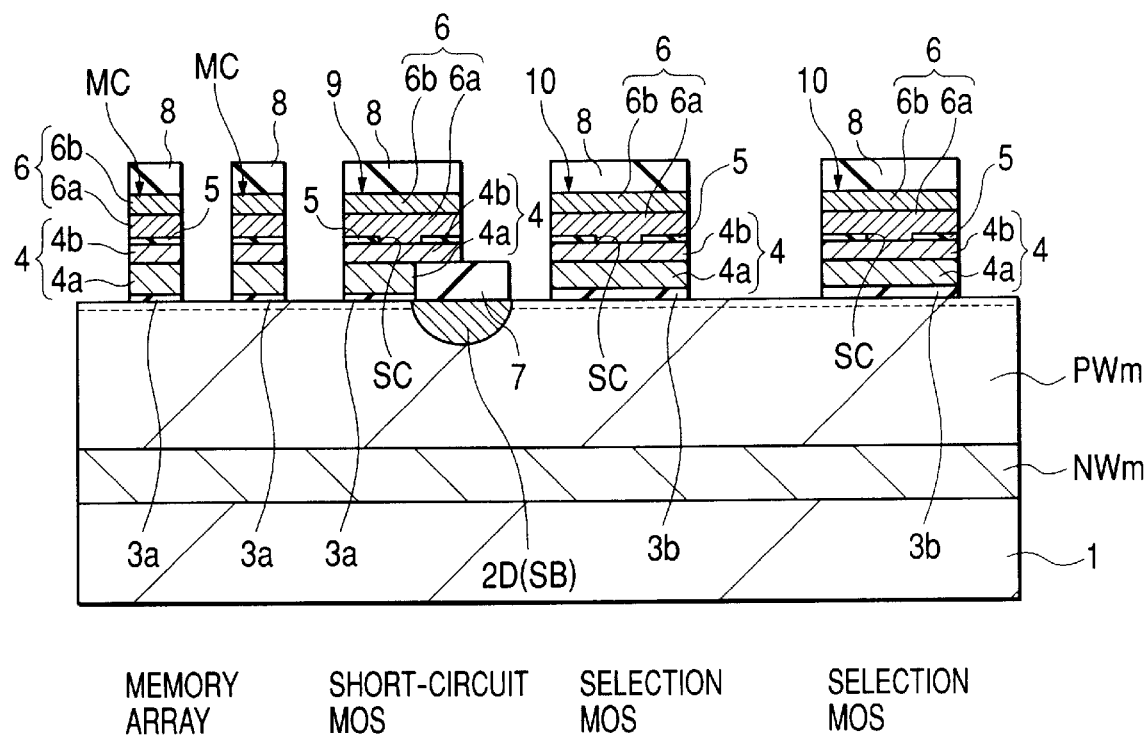
FIG. 31 is a fragmentary cross-sectional view illustrating the same point as FIG. 12, of the flash memory in the same process as FIG. 30.

Next, FIG. 30 is a fragmentary cross-sectional view of the same point as FIG. 11 in the subsequent manufacturing process, and FIG. 31 is a fragmentary cross-sectional view of the same point as FIG. 12 in the subsequent manufacturing process, respectively.

First of all, the cap insulating film 8 and the conductor film 6 are used as etching masks herein, and the interlayer film 5, the upper conductor film 4b and the lower conductor film 4a located therebelow are removed by the dry etching method or the like. Thus, the conductor films 4 are patterned in self-alignment with their corresponding conductor films 6 and respectively have the same shapes as viewed in the word line direction.

Thus, the control gate and floating gate electrodes of the memory cell MC are completed in the memory array. Namely, a two-layer gate electrode structure is completed wherein the conductor films 6 for the control gate electrode is laminated on each of the conductor films 4 for the floating gate electrodes with the interlayer film 5 interposed therebetween. The floating gate and control electrodes of each memory MC are completely isolated.

In the peripheral circuit regions (low voltage-operated MOS regions, high voltage-operated MOS regions, short-circuit MOS regions and selection MOS regions), gate electrodes 20n, 20p, 21n, 21p, 9 and 10 of respective MOSs are completed. In the gate electrodes 20n, 20p, 21n, 21p, 9 and 10, the conductor films 4 and the conductor films are electrically connected to one another through their corresponding contact holes SC.

Figure 32:
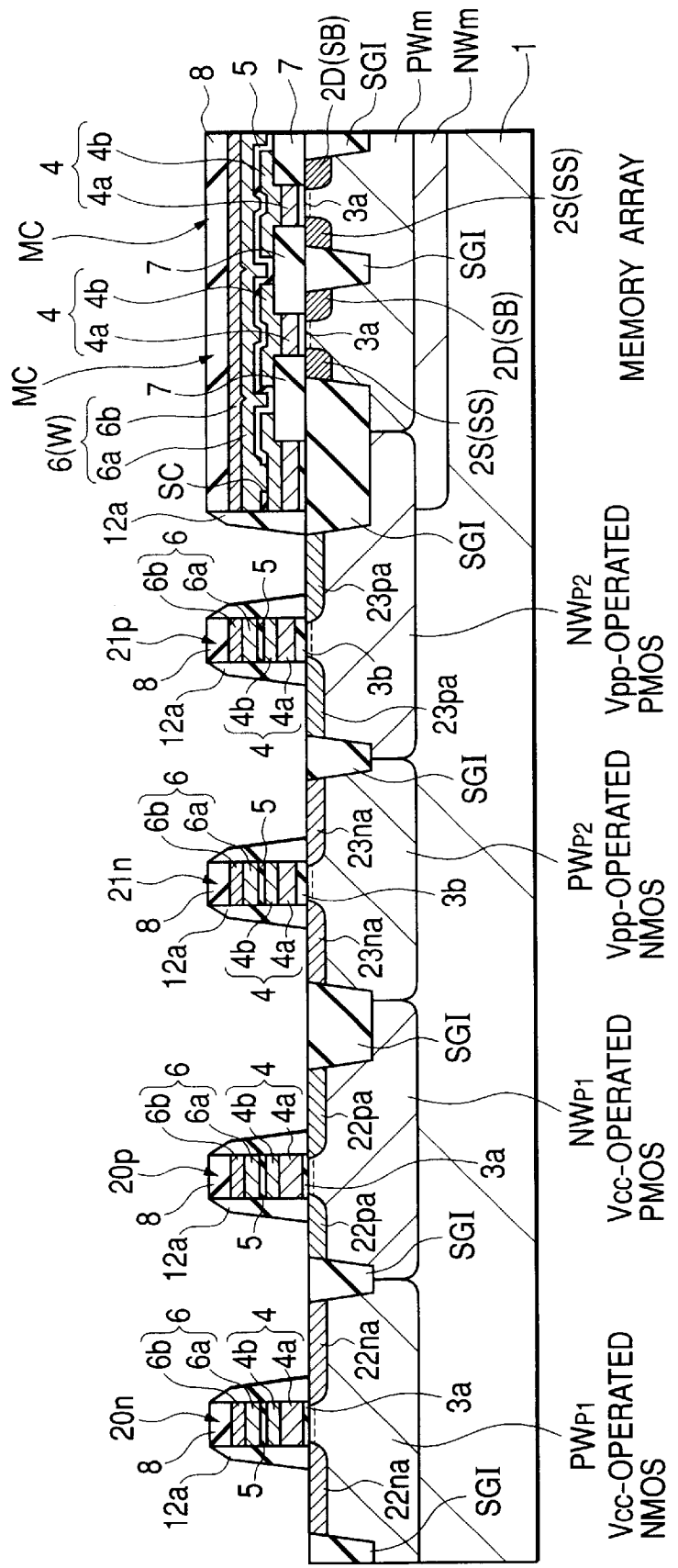
FIG. 32 is a fragmentary cross-sectional view depicting the same point as FIG. 11, which is in the process of manufacture of the flash memory following FIGS. 30 and 31.
Figure 33:
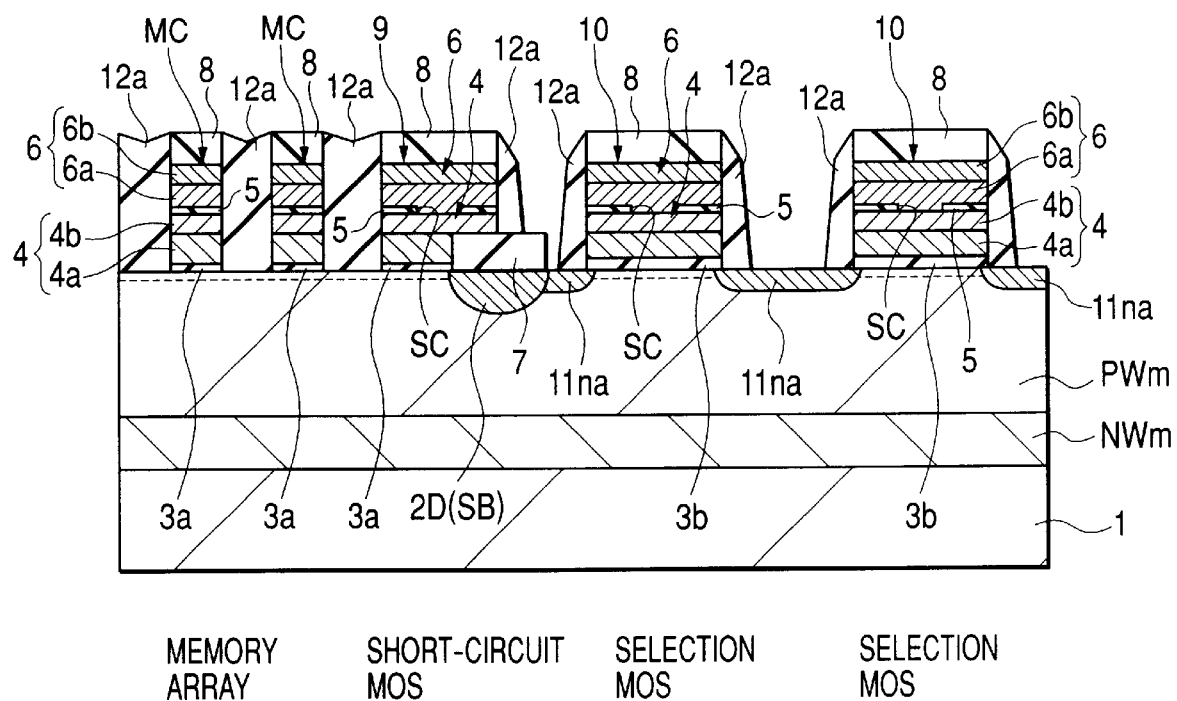
FIG. 33 is a fragmentary cross-sectional view showing the same point as FIG. 12, of the flash memory in the same process as FIG. 32.

Next, FIG. 32 is a fragmentary cross-sectional view of the same point or place as FIG. 11 in the subsequent manufacturing process, and FIG. 33 is a fragmentary cross-sectional view of the same point as FIG. 12 in the subsequent manufacturing process, respectively.

Here, semiconductor regions 22na, 22pa, 23na, 23pa and 11na relatively low in impurity concentration, of the respective MOSs are respectively formed in several. For example, arsenic is introduced into the semiconductor regions 11na, 22na and 23na, and for example, boron is introduced into the semiconductor regions 22pa and 23pa. Subsequently, an insulating film comprising silicon oxide, for example is deposited on the main surface of the semiconductor substrate 1 by the CVD method or the like and thereafter etch-backed by an anisotropic dry etching method or the like, whereby insulating films 12a are formed on their corresponding sides of the gate electrodes 20n, 20p, 21n, 9 and 10. Incidentally, each spacing defined between the word lines W adjacent to each another is buried by the insulating film 12a.

Figure 34:
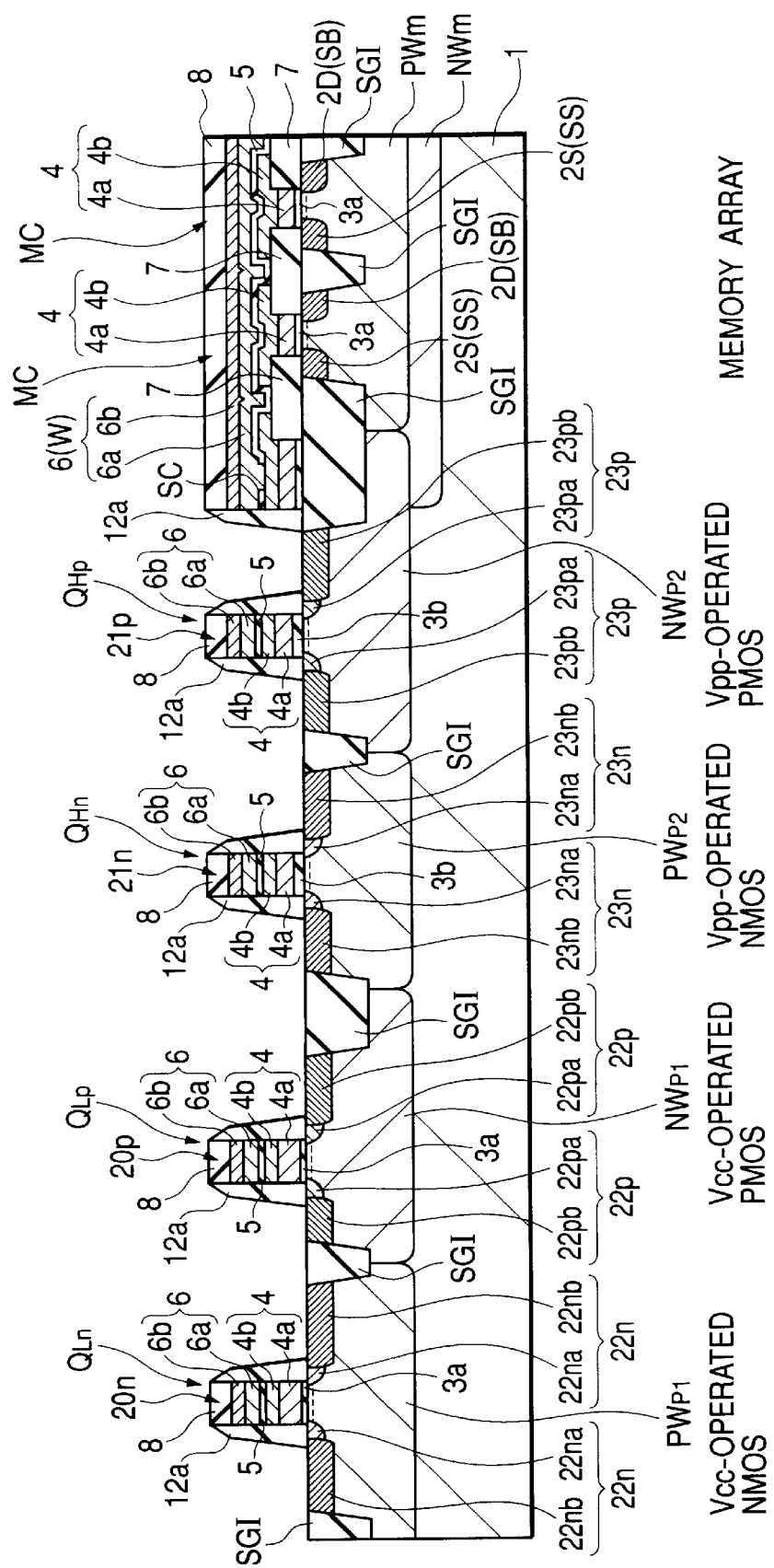
FIG. 34 is a fragmentary cross-sectional view illustrating the same point as FIG. 11, which is in the process of manufacture of the flash memory following FIGS. 32 and 33.
Figure 35:
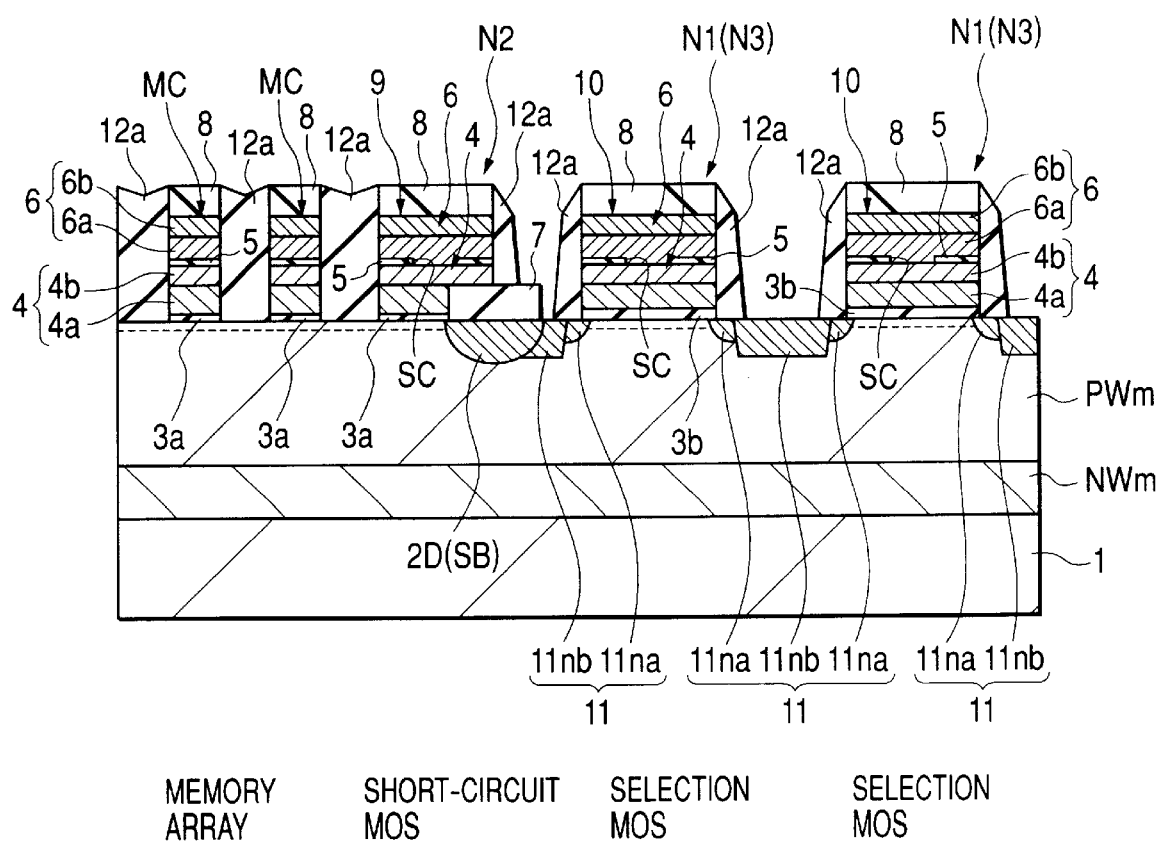
FIG. 35 is a fragmentary cross-sectional view depicting the same point as FIG. 12, of the flash memory in the same process as FIG. 34.

Next, FIG. 34 is a fragmentary cross-sectional view of the same point or place as FIG. 11 in the subsequent manufacturing process, and FIG. 35 is a fragmentary cross-sectional view of the same point as FIG. 12 in the subsequent manufacturing process.

Here, semiconductor regions 22nb, 22pb, 23nb, 23pb and 11nb relatively high in impurity concentration, of the respective MOSs are respectively formed in several. For example, arsenic is introduced into the semiconductor regions 11nb, 22nb and 23nb, and for example, boron is introduced into the semiconductor regions 22pb and 23pb. Thus, pairs of n type semiconductor regions 11, 22n and 23n and pairs of p type semiconductor regions 22p and 23p for sources and drains of low voltage-operated nMOSQLn and pMOSQLp, high voltage-operated nMOSQHn and pMOSQHp, and selection MOSN1 and MOSN3 are formed.

Figure 36:
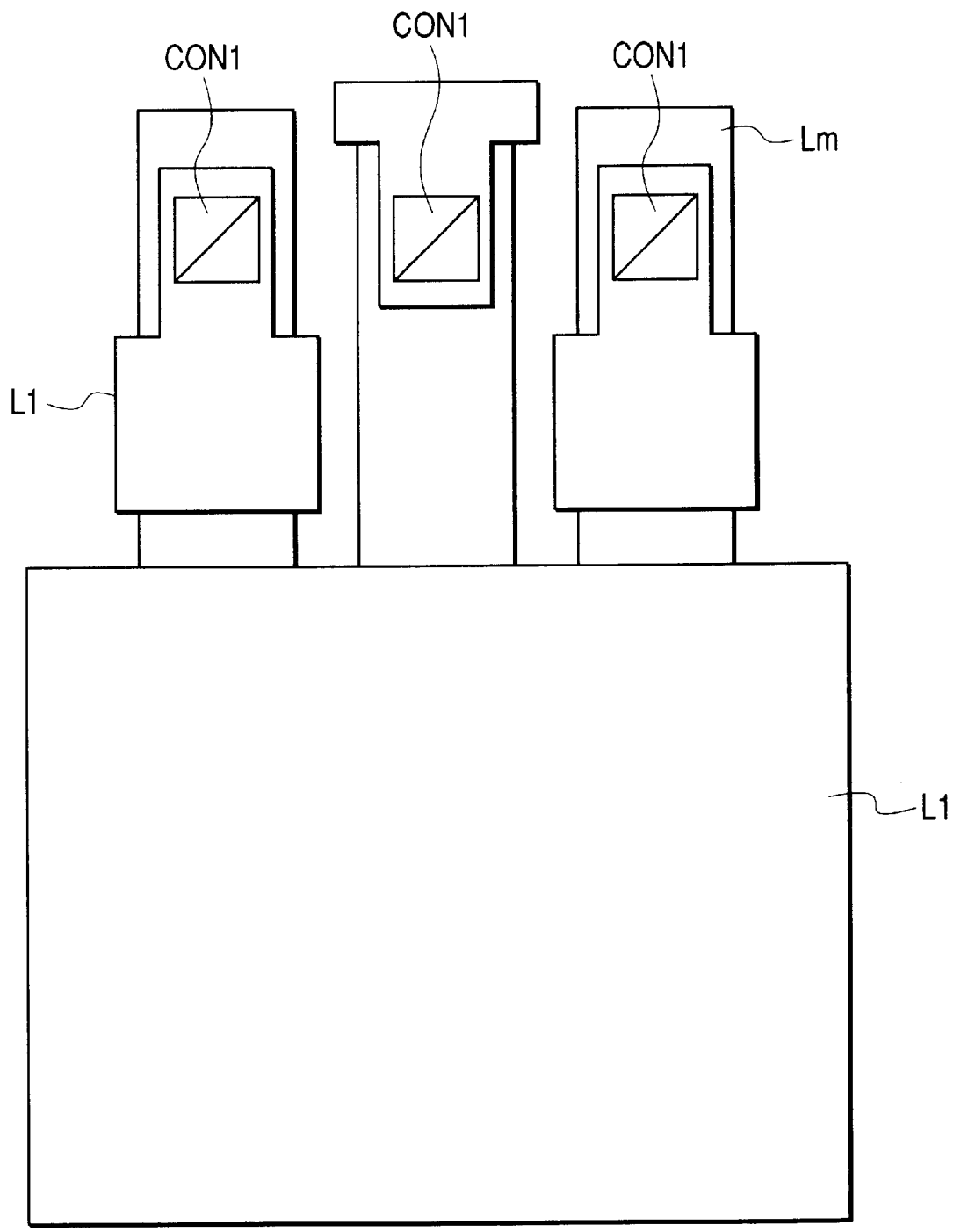
FIG. 36 is a fragmentary plan view showing the same point as FIG. 10, which is placed during the process of manufacture of the flash memory following FIGS. 34 and 35.
Figure 37:
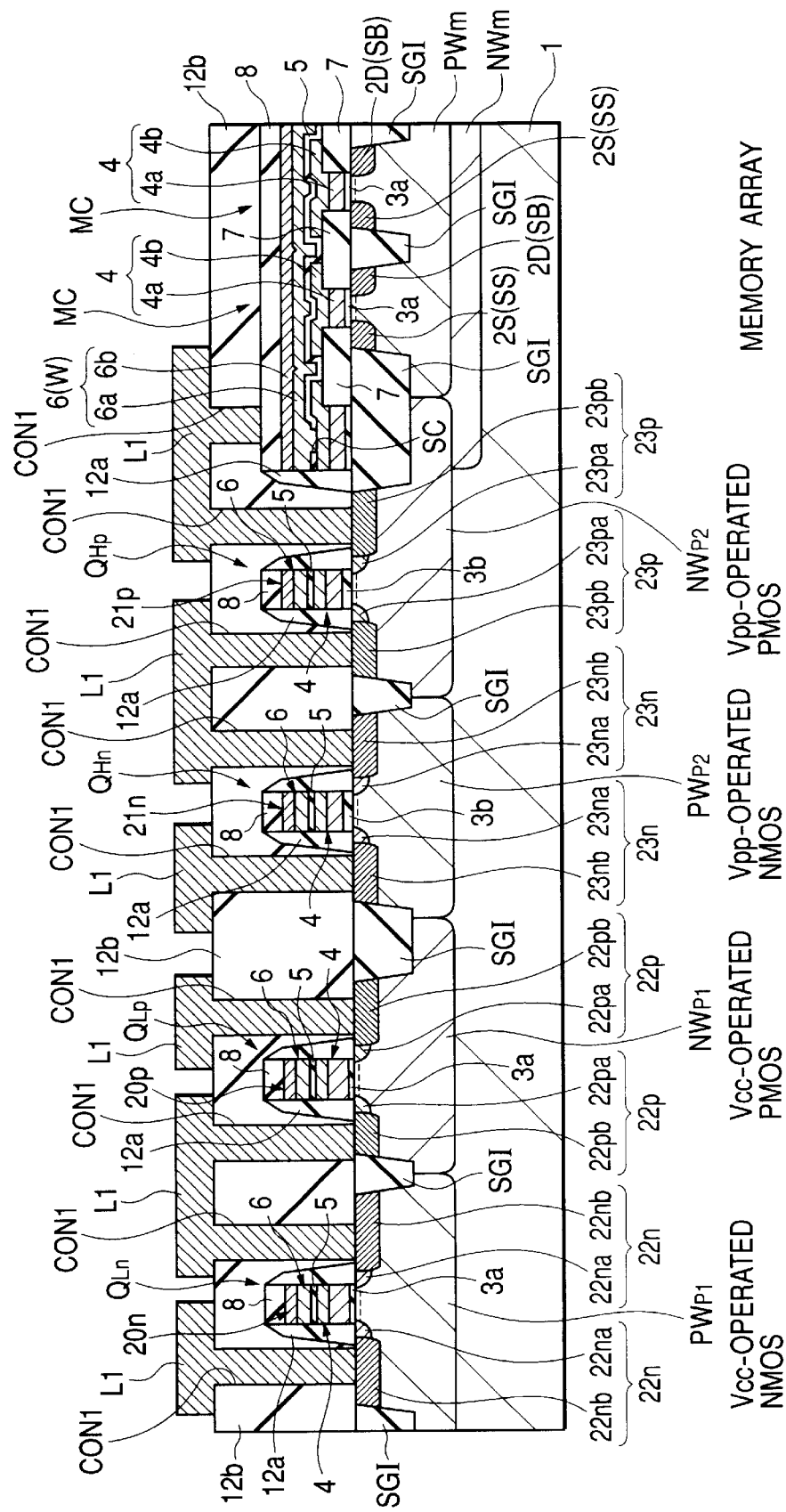
FIG. 37 is a fragmentary cross-sectional view illustrating the same point as FIG. 11, of the flash memory in the same process as FIG. 36.
Figure 38:
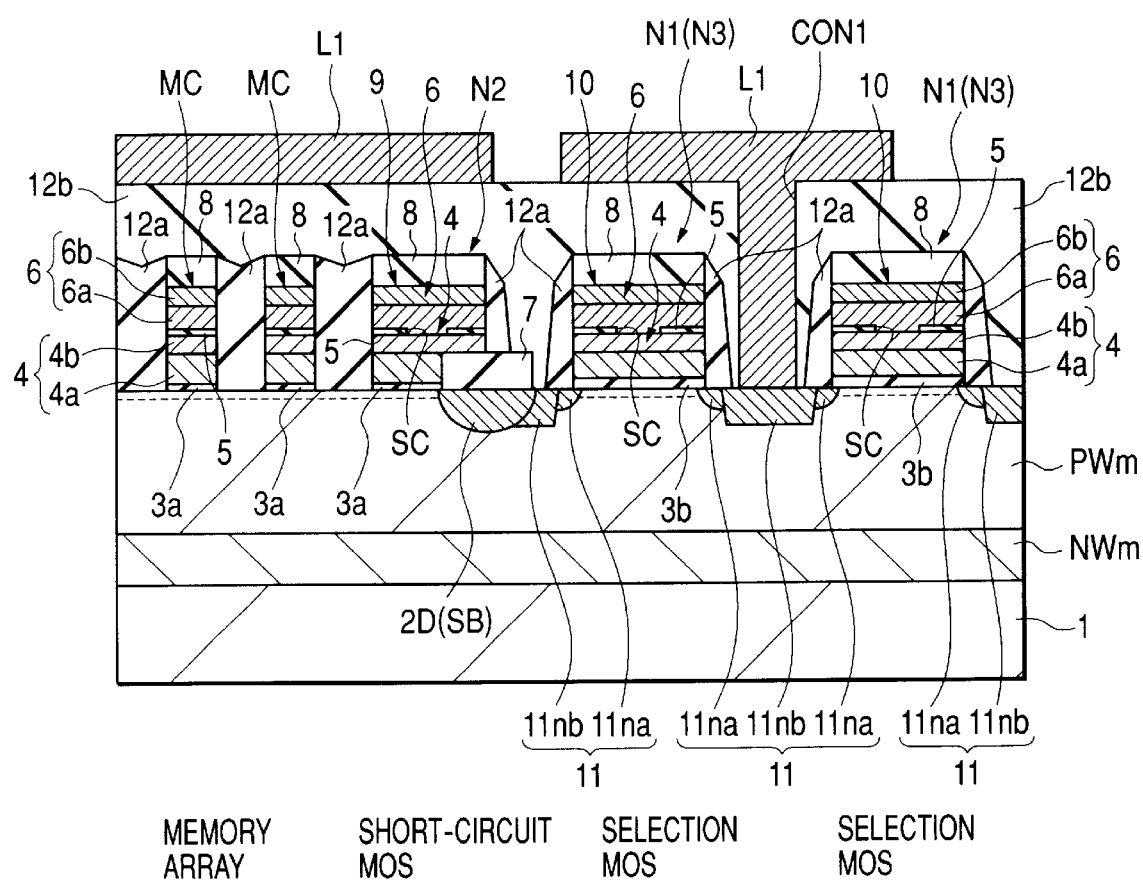
FIG. 38 is a fragmentary cross-sectional view showing the same point as FIG. 12, of the flash memory in the same process as FIG. 36.

Next, FIG. 36 is a fragmentary plan view of the same point as FIG. 10 in the subsequent manufacturing process, FIG. 37 is a fragmentary cross-sectional view of the same point as FIG. 11 in the subsequent manufacturing process, and FIG. 38 is a fragmentary cross-sectional view of the same point as FIG. 12 in the subsequent manufacturing process, respectively.

Here, an insulating film 12b comprising silicon oxide, for example, is deposited on the semiconductor substrate 1 by the CVD method or the like. Thereafter, such contact holes CON1 as to expose parts (source and drain regions of respective MOSs) of the semiconductor substrate 1, parts of the word lines W, and parts of the gate electrodes of the predetermined MOSs are defined in the insulating film 12b by the photolithography technology and the dry etching technology. Subsequently, a metal film like tungsten or the like, for example, is deposited on the semiconductor substrate 1 by a sputtering method or the like and thereafter patterned by the photolithography technology and the dry etching technology, whereby first layer wirings L1 (including a common source line) are formed. The first layer wirings L1 are suitably electrically connected to the pairs of semiconductor regions for the sources and drains of the respective MOSs, the gate electrodes and the word lines W through the contact holes CON1 respectively.

Figure 39:
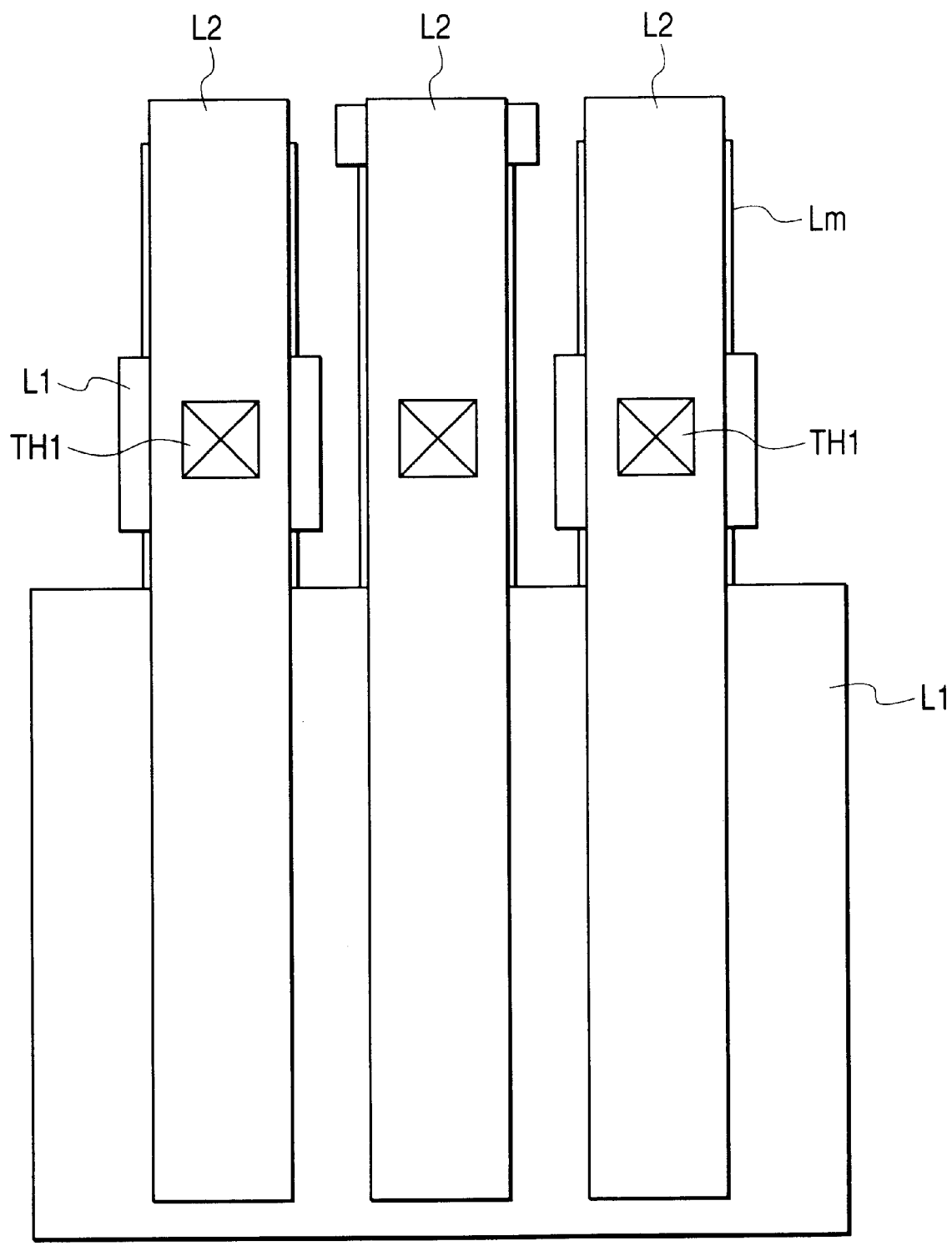
FIG. 39 is a fragmentary plan view illustrating the same point as FIG. 10, which is in the process of manufacture of the flash memory following FIGS. 36 through 38.
Figure 40:
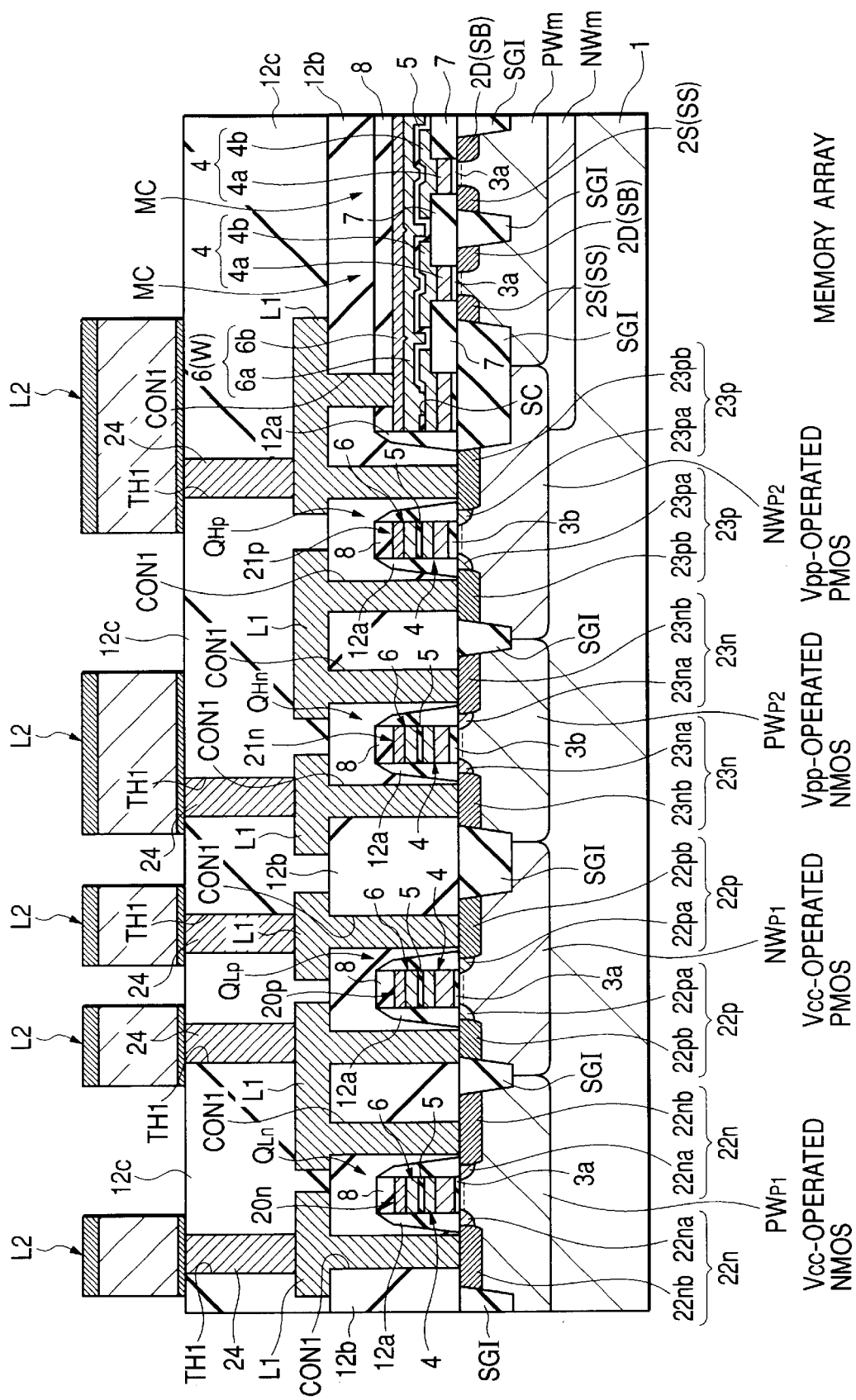
FIG. 40 is a fragmentary cross-sectional view depicting the same point as FIG. 11, of the flash memory in the same process as FIG. 39.
Figure 41:
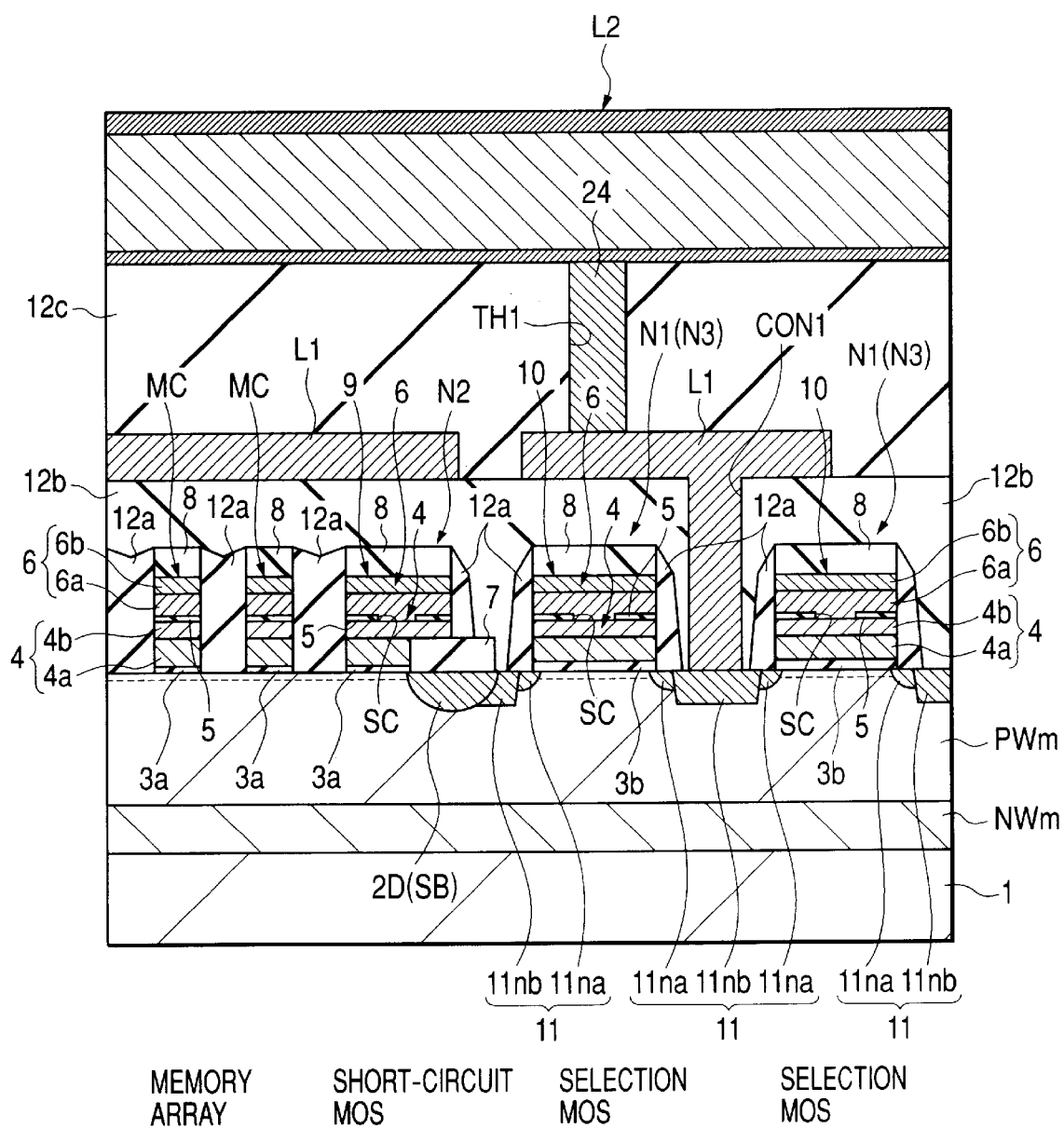
FIG. 41 is a fragmentary cross-sectional view illustrating the same point as FIG. 12, of the flash memory in the same process as FIG. 39.

Next, FIG. 39 is a fragmentary plan view of the same point as FIG. 10 in the subsequent manufacturing process, FIG. 40 is a fragmentary cross-sectional view of the same point as FIG. 11 in the subsequent manufacturing process, and FIG. 41 is a fragmentary cross-sectional view of the same point as FIG. 12 in the subsequent manufacturing process, respectively.

Here, an insulating film 12c formed of silicon oxide, for example, is deposited on the semiconductor substrate 1 by the CVD method or the like. Thereafter, such through holes TH1 as to expose parts of the first layer wirings L1 are defined in the insulating film 12c by the photolithography technology and the dry etching technology. Subsequently, a metal film like tungsten or the like, for example, is deposited on the semiconductor substrate 1 by the sputtering method and the CVD method or the like and thereafter polished by the CMP method or the like so that the metal film is left within the through holes TH1 alone, whereby plugs 24 are formed within the through holes TH1. Thereafter, titanium nitride, aluminum and titanium nitride are deposited on the semiconductor substrate 1 in order from below by the sputtering method or the like and thereafter patterned by the photolithography technology and the dry etching technology, whereby second layer wirings L2 (including main bit lines) are formed. The second layer wirings L2 are respectively electrically connected to the first layer wirings L1 through the plugs 24.

Figure 42:
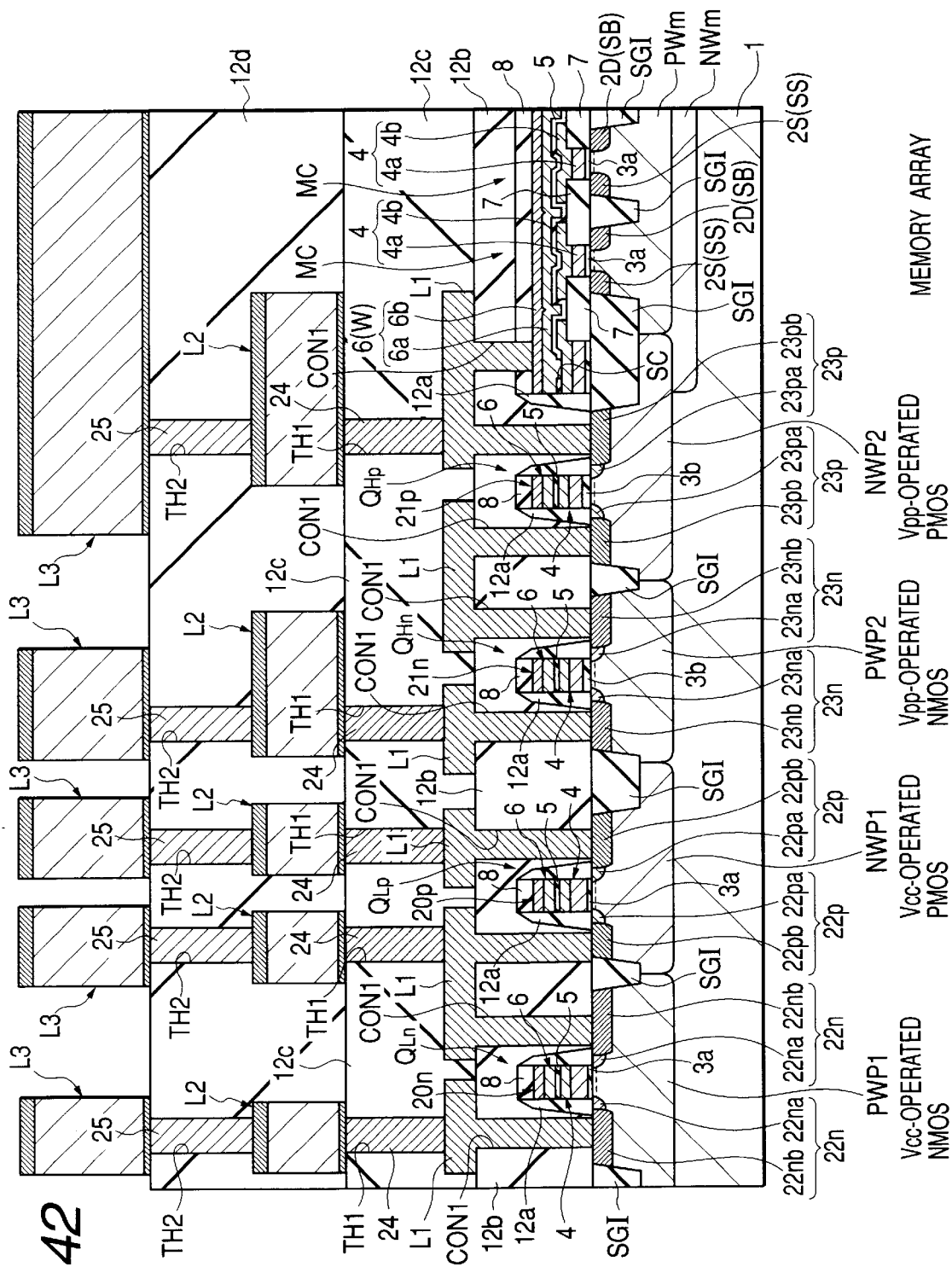
FIG. 42 is a fragmentary cross-sectional view showing the same point as FIG. 11, which is in the process of manufacture of the flash memory following FIGS. 39 through 41.
Figure 43:
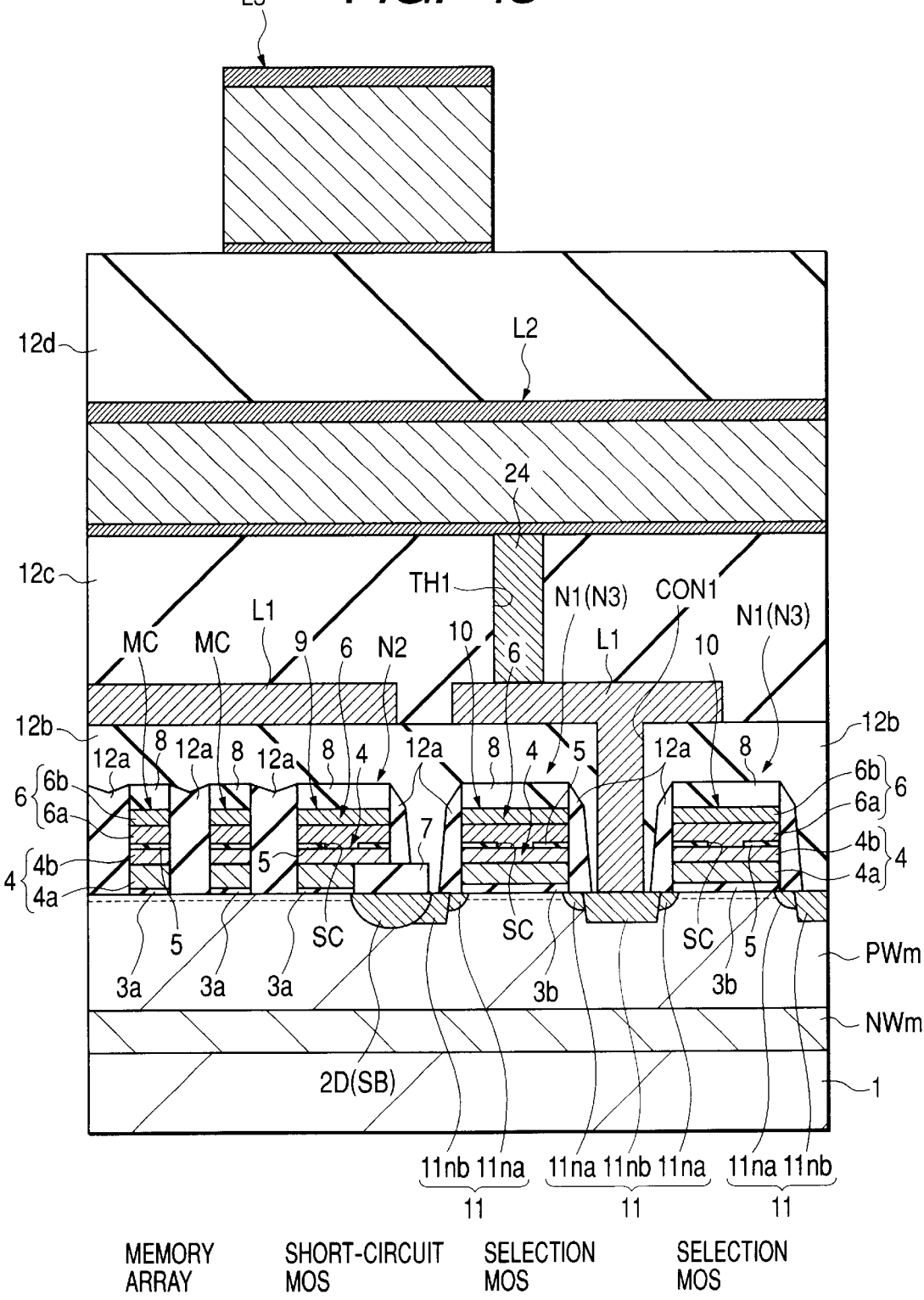
FIG. 43 is a fragmentary cross-sectional view depicting the same point as FIG. 12, which is in the process of manufacture of the flash memory in the same process as FIG. 42.

Next, FIG. 42 is a fragmentary cross-sectional view of the same point as FIG. 11 in the subsequent manufacturing process, and FIG. 43 is a fragmentary cross-sectional view of the same point as FIG. 12 in the subsequent manufacturing process.

An insulating film 12d comprising silicon oxide, for example, is deposited on the semiconductor substrate 1 herein. Thereafter, such through holes TH2 that parts of the second layer wirings L2 are exposed, are defined in the insulating film 12d in a manner similar to the through holes TH1. Subsequently, plugs 25 formed of tungsten or the like are formed in the through holes TH2 in a manner similar to the plugs 24. Afterwards, third layer wirings L3 comprising a laminated film of, for example, titanium nitride, aluminum and titanium nitride are formed on the semiconductor substrate 1 in a manner similar to the second layer wirings L2. The third layer wirings L3 are respectively electrically connected to the second layer wirings L2 through the plugs 25. Afterwards, a surface protective film is formed on the semiconductor substrate 1, and such apertures or openings that parts of the third layer wirings L3 are exposed, are thereafter defined in parts thereof to thereby form bonding pads, whereby the flash memory is manufactured.

Thus, according to the first embodiment, even if the bit line-to-bit line pitch is narrowed to 4F to 3F, for example to thereby reduce the unit cell area to a factor of 0.75, the lithography technology using the Levenson type phase shift is adopted to set the width taken along the gate-width direction, of the lower conductor film 4a for the floating gate electrode so as to be narrower than the minimum processing size F. Consequently, the areas opposed to each other between the lower conductor film 4a and the semiconductor substrate 1 are reduced. On the other hand, the width taken along the gate-width direction, of the upper conductor film 4b, which does not overlap with the lower conductor film 4a an is disposed on the insulating film 7, is set thicker than the minimum processing size F, whereby the areas opposed to each other between the upper conductor film 4b and the conductor film 6 for each control gate electrode can be restrained from decreasing. It is thus possible to restrain a reduction in coupling ratio between each control gate electrode and its corresponding floating gate electrode and satisfy a desired rewrite characteristic of each memory cell.

(Second Embodiment)

The second embodiment describes another example of a method of manufacturing an AND type flash memory.

Figure 44:
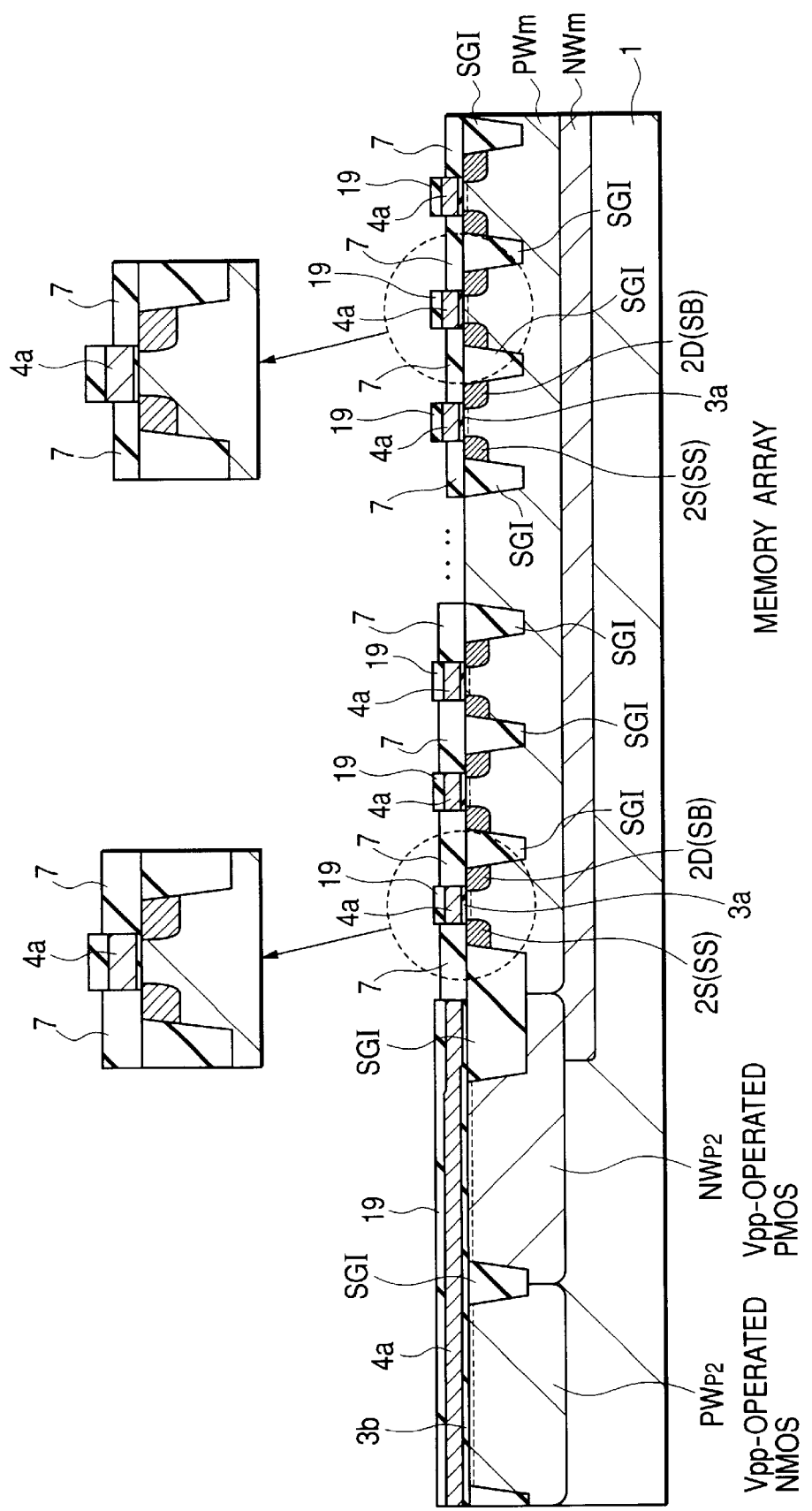
FIG. 44 is a cross-sectional view for describing dishing in a CMP process discussed by the present inventors.

As described in FIG. 18 illustrative of the first embodiment by way of example, the insulating film 7 is interposed between the upper conductor film 4b of the conductor film 4 for each floating gate electrode and the semiconductor substrate 1 to thereby achieve or provide isolation between each pair of n type semiconductor regions 2S and 2D and the upper conductor film 4b. However, when dishing occurs in a CMP process for polishing or grinding the insulating film 7 deposited on the main surface of the semiconductor substrate 1, the thickness of the insulating film 7 varies as shown in FIG. 44 so that the coupling ratio will vary within each memory mat MA. Due to the dishing, the thickness of the insulating film 7 of a central portion of a memory array is easy to become relatively thinner than that of the insulating film 7 located on the periphery of the memory array in particular. Therefore, a velocity or speed distribution in which the operating speed of the peripheral portion of the memory array is relatively slower than that of the central portion, is produced within one memory mat.

Figure 45:
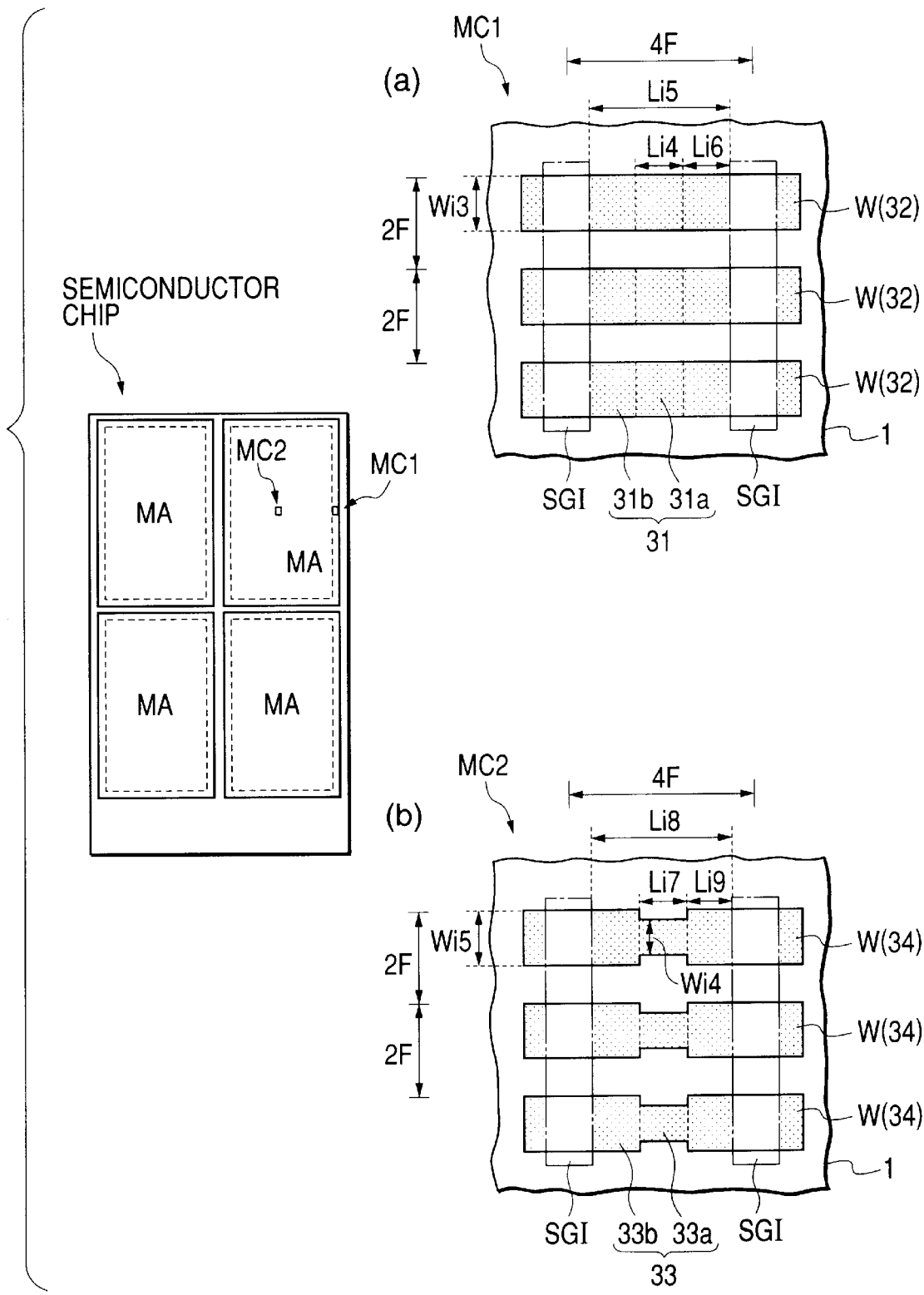
FIG. 45(a) is a fragmentary cross-sectional view showing one example of a memory cell having an AND type structure.
FIG. 45(b) is a fragmentary cross-sectional view illustrating another example of a memory cell having an AND type structure.

FIG. 45 is a fragmentary plan view of a semiconductor substrate 1 on which each of memory cells MC1 and MC2 according to the second embodiment is shown, wherein FIG. 45(*a*) is a plan view showing isolation trenches SGI, conductor film 31 (lower conductor films 31a and upper conductor films 31b) for floating gate electrodes, and conductor films 32 for control gate electrodes, all of which constitute the memory cell MC1, and FIG. 45(*b*) is a plan view illustrating isolation trenches SGI, conductor films 33 (lower conductor films 33a and upper conductor films 33b) for floating gate electrodes, and conductor films 34 for control gate electrodes, all of which constitute the memory cell MC2. In the drawings, the conductor films 31 and 33 for the floating gate electrodes are indicated by their corresponding shaded hatchings. Incidentally, bit line-to-bit line pitches of the memory cells MC1 and MC2 are 0.8 $\mu$m (4f), their word line-to-word line pitches are 0.4 $\mu$m (2F), and hence their unit cell areas are 0.32 $\mu$m$^2$(8F$^2$), respectively.

Each memory cell (e.g., a memory cell coupled to about three bit lines as viewed from the outermost periphery) located on the periphery of the memory array is configured typically by a memory cell MC1 to be described next. Namely, a width Li4 taken along a gate-length direction, of the lower conductor film 31a of each conductor film 31 for the floating gate electrode is 0.2 $\mu$m (F), a width Li5 taken along the gate-length direction, of the upper conductor film 31b is 0.6 $\mu$m (3F), a width Li6 taken along the gate-length direction, of the upper conductor film 31b, which does not overlap with the lower conductor film 31a, is 0.2 $\mu$m (F) on one side, and a width Wi3 taken along a gate-width direction, of each of the lower conductor film 31a and the upper conductor film 31b is 0.2 $\mu$m (F), respectively.

Other memory cells excluding the memory cell MC1 are configured typically by a memory cell MC2 to be described next. Namely, a width Li7 taken along a gate-length direction, of the lower conductor film 33a of each conductor film 33 for the floating gate electrode is 0.2 $\mu$m (F), a width Li8 taken along the gate-length direction, of the upper conductor film 33b is 0.6 $\mu$m (3F), a width Li9 taken along the gate-length direction, of the upper conductor film 33b, which does not overlap with the lower conductor film 33a, is 0.2 $\mu$m (F) on one side. These Li7 through Li9 are respectively identical to the Li4 through Li6 of the memory cell MC1. However, a width Wi4 taken along a gate-width direction, of the lower conductor film 33a is 0.16 $\mu$m thinner than the minimum processing size F, and a width Wi5 taken along the gate-width direction, of the upper conductor film 33b, which does not overlap with the lower conductor film 33a, is 0.24 µm thicker than the minimum processing size F.

Areas opposed to each other between the lower conductor film 33a for the floating gate electrode and the semiconductor substrate 1 in the memory cell MC2 are relatively set smaller than those opposed to each other between the lower conductor film 31a for the floating gate electrode and the semiconductor substrate 1 in the memory cell MC1. Further, areas opposed to each other between the upper conductor film 33b for the floating gate electrode and the conductor film 34 for the control gate electrode in the memory cell MC2 are relatively set larger than those opposite to each other between the upper conductor film 31b for the floating gate electrode and the conductor film 32 for the control gate electrode in the memory cell MC1. Consequently, even if the thinning of the insulating film 7 (see FIG. 44) due to the dishing at the central portion of each memory array occurs, a reduction in the coupling ratio of the memory cell MC2 located in the center portion of the memory array can be corrected or supplemented. It is thus possible to control variations in characteristic between the central portion of the memory array and its peripheral portion.

Incidentally, while the second embodiment has described the case in which the present invention is applied to the AND type flash memory, the present invention is not limited to it. The present invention is applicable even to a NAND type flash memory, for example.

A description will next be made of the case in which the present invention is applied to the NAND type flash memory.

Figure 46:
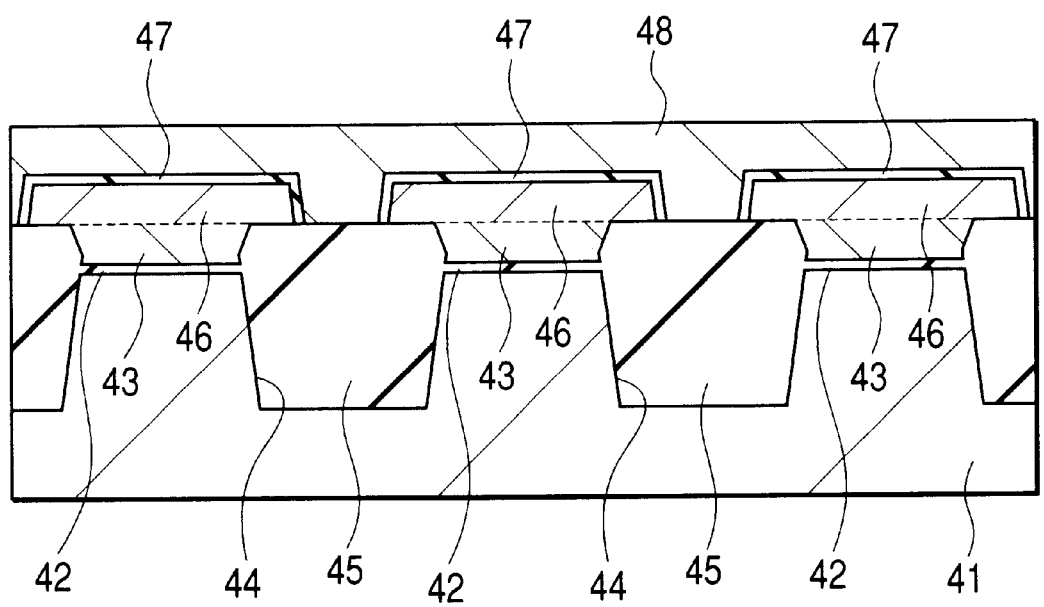
FIG. 46 is a fragmentary plan view showing one example of a memory cell having a NAND type array structure.

FIG. 46 is a fragmentary cross-sectional view of a semiconductor substrate taken along a gate-width direction, on which a memory cell having a NAND type array structure is shown.

A method of manufacturing the present memory cell is as follows. First of all, tunnel insulating films 42 and first conductor films 43 for floating gate electrodes are formed on a semiconductor substrate 41, and isolation trenches 44 are defined therein in self-alignment therewith. Next, an insulating film 45 is embedded into each isolation trench 44 and then flattened by a CMP method, followed by formation of second conductor films 46 for the floating gate electrodes. Afterwards, interlayer films 47 and a third conductor film 48 for each control gate electrode are formed.

When dishing occurs upon flattening the insulating film 45 by the CMP method in the same manner as the AND type flash memory, each insulating film 45 varies in thickness and hence a coupling ratio also varies. Therefore, the area of each second conductor film 46 for the floating gate electrode, which constitutes the corresponding memory cell in which each insulating film 45 is easy to become thin due to the influence of the dishing, is relatively set larger than that of each second conductor film 46 for the floating gate electrode, which constitutes the corresponding memory cell in which each insulating film 45 is hard to become thin.

Figure 47A:
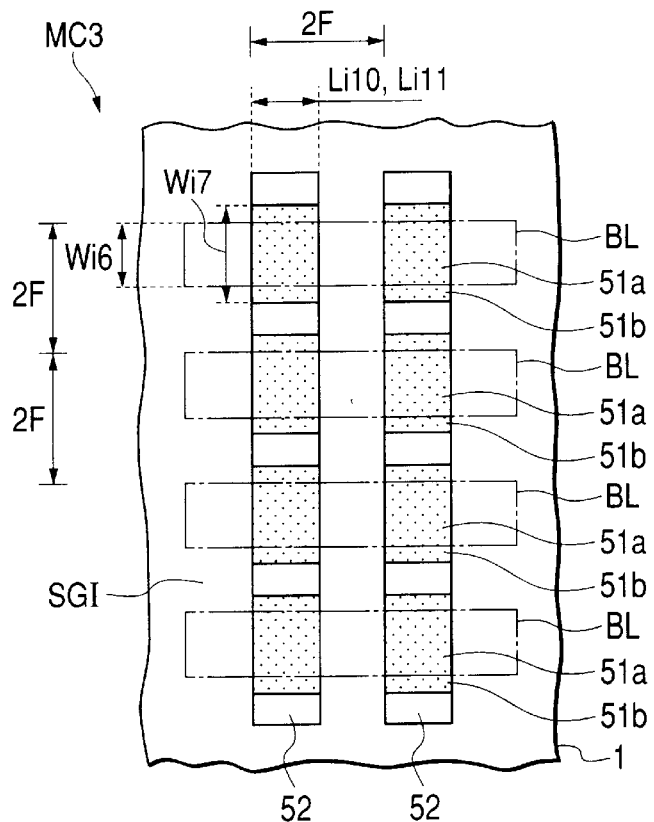
FIG. 47(a) is a fragmentary cross-sectional view illustrating one example of a memory cell having a NAND type structure.
Figure 47B:
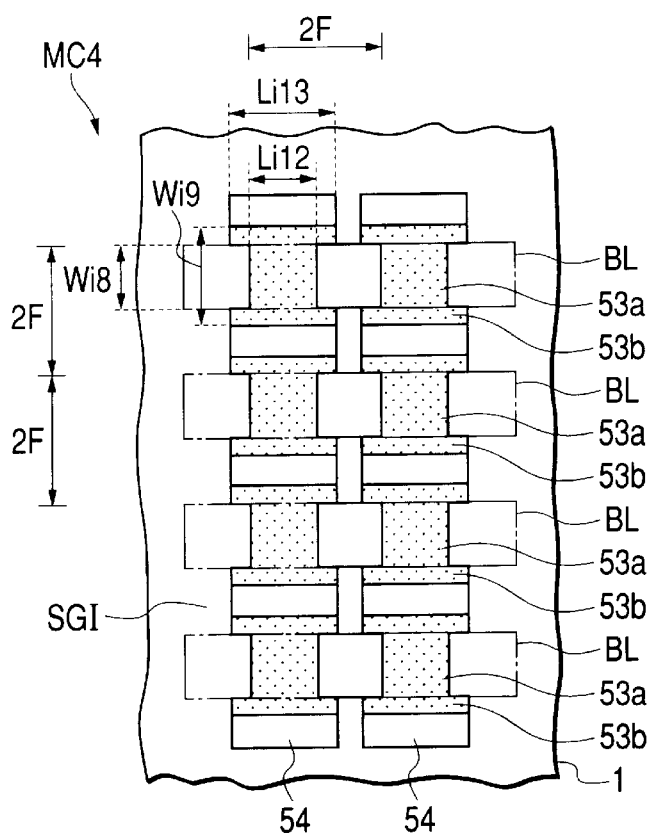
FIG. 47(b) is a fragmentary cross-sectional view showing another example of a memory cell having a NAND type structure.

FIG. 47 is a fragmentary plan view of a semiconductor substrate 1 on which each of memory cells MC3 and MC4 lying within a memory array having a NAND type array configuration is shown. FIG. 47(a) is a plan view showing an isolator SGI, lower conductor films 51a and upper conductor films 51b for floating gate electrodes, and conductor films 52 for control gate electrodes, all of which constitute the memory cell MC3. The present memory cell MC3 is placed in a peripheral portion of the memory array, for example. Further, FIG. 47(b) is a plan view showing an isolator SGI, lower conductor films 53a and upper conductor films 53b for floating gate electrodes, and conductor films 54 for control gate electrodes, all of which constitute the memory cell MC4. The present memory cell MC4 is located in a central portion of the memory array, for example. In the drawings, the floating gate electrodes are indicated by their corresponding shaded hatchings. Incidentally, a bit line-to-bit line pitch of the memory cell MC3 was set to 3F, a word line-to-word line pitch thereof was set to 2F, and hence a unit cell area thereof was set to $6F^2$ (3F×2F), respectively.

Each memory cell (e.g., a memory cell coupled to about three bit lines as viewed from the outermost periphery) located on the periphery of the memory array is configured typically by a memory cell MC3 to be described next. Namely, a width Wi6 taken along a gate-width direction, of the lower conductor film 51a of each conductor film for the floating gate electrode is equivalent to the minimum processing size F, a width Wi7 taken along the gate-width direction, of the upper conductor film 51b is thicker than the minimum processing size F to increase coupling capacitance. Further, a width Li10 taken along a gate-length direction, of the lower conductor film 51a and a width Li11 taken along the gate-length direction, of the upper conductor film 51b unsuperimposed on the lower conductor film 51a are respectively the minimum processing size F.

Another memory cell excluding the memory cell MC3 is configured typically by a memory cell MC4 to be described next. Namely, a width Wi8 taken along a gate-width direction, of the lower conductor film 53a of each conductor film for the floating gate electrode is equivalent to the minimum processing size F. A width Wi9 taken along the gate-width direction, of the upper conductor film 53b is thicker than the minimum processing size F. These Wi8 and Wi9 are respectively identical to the Wi6 and Wi7 of the memory cell MC3. A width Li12 taken along a gate-length direction, of the lower conductor film 53a is equivalent to the minimum processing size F and identical to Li10 of the memory cell MC3. However, a width Li13 taken along the gate-length direction, of the upper conductor film 53b which does not overlap with the lower conductor film 53a, is thicker than F to increase coupling capacitance.

The area of each upper conductor film 53b for the floating gate electrode in the memory cell MC4 is set greater than that of each upper conductor film 51b for the floating gate electrode in the memory cell MC3, whereby the coupling ratio of the memory cell MC4 can be set relatively larger than that of the memory cell MC3. Thus, even if the thinning of each insulating film 45 (see FIG. 46) due to the dishing in the central portion of the memory array, for example, occurs, a reduction in coupling ratio, which is easy to occur in the central portion of the memory array, can be corrected or supplemented.

While the invention made above by the present inventors has been described specifically by the embodiments of the invention, the present invention is not limited to the embodiments. It is needless to say that various changes can be made thereto within the scope not departing from the substance thereof.

While the above-described embodiments respectively have described the case in which the present invention is applied to the single flash memory, for example, the present invention is not limited thereto. The present invention can be applied even to a mixed type nonvolatile semiconductor memory device wherein, for example, a flash memory and a logic circuit are provided on the same semiconductor substrate.

Advantageous effects obtained by a typical one of the inventions disclosed in the present application will be explained in brief as follows:

According to the present invention, even if the area of each memory cell is reduced with the narrowing of each pitch along a bit line direction, a reduction in coupling ratio can be restrained from occurring. It is therefore possible to implement high integration without causing a reduction in operating speed of a nonvolatile semiconductor memory device having a flash memory.

According to the present invention as well, since variations in coupling ratios of memory cells in a semiconductor chip can be restrained, the reliability of the flash memory can be improved.

What is claimed is:

1. A nonvolatile semiconductor memory device, comprising:
a memory array including,
a plurality of nonvolatile memory cells disposed on a semiconductor substrate in matrix form; and
wherein source/drain regions of the plurality of nonvolatile memory cells are connected in parallel with one another in respective columns, and word lines respectively extend in a first direction of the nonvolatile memory cells;
wherein each of the plurality of nonvolatile memory cells includes a lower conductor film for a floating gate electrode, which is provided on a channel region in the first direction between the source/drain regions with a first insulating film interposed therebetween, an upper conductor film for the floating gate electrode, which is electrically connected to the lower conductor film and is formed so as to extend on the source/drain regions from the lower conductor film with a second insulating film placed on the source/drain regions being interposed therebetween, and a conductor film for a control gate electrode, which is provided on the upper conductor film with a third insulating film interposed therebetween and serves as one of said word lines superimposed on the upper conductor film, and
wherein widths taken along a second direction crossing the first direction, of the lower conductor film on each channel region and of the word line thereat are thinner than widths taken along the second direction, of a portion of the upper conductor film placed on the second insulating film and of a corresponding portion of the word line.

2. The nonvolatile semiconductor memory device according to claim 1, wherein the widths taken along the second direction, of the lower conductor film provided on the channel region and of the word line are thinner than a minimum processing size of the word line, which is determined by a design rule.

3. The nonvolatile semiconductor memory device according to claim 1, wherein each of widths Wi1 taken along the second direction, of the lower conductor film provided on the channel region and of the word line satisfies the relations in $a \leq Wi1 < F$ when a minimum wirable size is given as a and a minimum processing size of the word line, which is determined by a design rule, is given as F.

4. The nonvolatile semiconductor memory device according to claim 1, wherein the widths taken along the second direction, of the portion of the upper conductor film placed on the second insulating film and of the word line are thicker than a minimum processing size of the word line, which is determined by a design rule.

5. The nonvolatile semiconductor memory device according to claim 1, wherein each of widths Wi2 taken along the second direction, of the portion of the upper conductor film placed on the second insulating film and of the word line satisfies the relations in $F < Wi2 \leq 2F-b$ when a minimum isolable size is given as b, a minimum processing size of the word line, which is determined by a design rule, is given as F, and the pitch between the adjacent word lines is given as 2F.

6. The nonvolatile semiconductor memory device according to claim 1, wherein when a minimum processing size of the word line, which is determined by a design rule, is given as F, a minimum wirable size is given as a, a minimum isolable size is given as b, and the pitch between the adjacent word lines is given as 2F, each of widths Wi1 taken along the second direction, of the lower conductor film provided on the channel region and of the word line is set thinner than the minimum processing size F with a size of (F−a) as a limit, and each of widths Wi2 taken along the second direction, of the portion of the upper conductor film on the second insulating film and of the word line is set thicker than the minimum processing size F with a size of (F−b) as a limit.

7. The nonvolatile semiconductor memory device according to claim 1, wherein each of the widths taken along the second direction, of the lower conductor film provided on the channel region and of the word line is thinner than one-half the pitch between the adjacent word lines.

8. The nonvolatile semiconductor memory device according to claim 1, wherein each of the widths taken along the second direction, of the portion of the upper conductor film on the second insulating film and of the word line is thicker than one-half the pitch between the adjacent word lines.

9. The nonvolatile semiconductor memory device according to any of claims 1 to 8, wherein a width taken along the first direction, of each of the source/drain regions of said each nonvolatile memory cell is shorter than a width taken along the first direction, of the channel region between the source/drain regions.

10. The nonvolatile semiconductor memory device according to any of claims 1 to 8, wherein a width taken along the second direction, of the channel region between the source/drain regions of said each nonvolatile memory cell is shorter than a width taken along the first direction, of the channel region between the source/drain regions.

11. The nonvolatile semiconductor memory device according to claim 9, wherein a width taken along the second direction, of the channel region between the source/drain regions of said each nonvolatile memory cell is shorter than a width taken along the first direction, of the channel region between the source/drain regions.

12. The nonvolatile semiconductor memory device according to any of claims 1 to 8, wherein another portion of the upper conductor film for a floating gate electrode overlaps the lower conductor film for a floating gate electrode and has the same width, taken along the second direction, as the width of the conductor film for a control gate electrode and as the lower conductor film for a floating gate electrode, and wherein the portion of the upper conductor film for a floating gate electrode that is placed on the second insulating film does not overlap the lower conductor film for a floating gate electrode and has the same width in the second direction as the conductor film for a control gate electrode.

13. The nonvolatile semiconductor memory device according to claim 11, wherein another portion of the upper conductor film for a floating gate electrode overlaps the lower conductor film for a floating gate electrode and has the same width, taken along the second direction, as the width of the conductor film for a control gate electrode and as the lower conductor film for a floating gate electrode, and wherein the portion of the upper conductor film for a floating gate electrode that is placed on the second insulating film does not overlap the lower conductor film for a floating gate electrode and has the same width in the second direction as the conductor film for a control gate electrode.

14. The nonvolatile semiconductor memory device according to claim 9, wherein another portion of the upper conductor film for a floating gate electrode overlaps the lower conductor film for a floating gate electrode and has the same width, taken along the second direction, as the width of the conductor film for a control gate electrode and as the lower conductor film for a floating gate electrode, and wherein the portion of the upper conductor film for a floating gate electrode that is placed on the second insulating film does not overlap the lower conductor film for a floating gate electrode and has the same width in the second direction as the conductor film for a control gate electrode.

15. A nonvolatile semiconductor memory device, comprising:

a memory array including,
  a plurality of nonvolatile memory cells disposed on a semiconductor substrate in matrix form; and
  wherein source/drain regions of the plurality of nonvolatile memory cells are connected in parallel with one another in respective columns, and word lines respectively extend in a first direction of the nonvolatile memory cells;
wherein each of the plurality of nonvolatile memory cells includes an information storage film, which is provided on a channel region in the first direction between the source/drain regions with a first insulating film interposed therebetween, and a conductor film for a control gate electrode, which is formed over the information storage film and serves as one of said word lines superimposed on the information storage film, and
wherein widths taken along a second direction crossing the first direction, of a portion of the information storage film on each channel region and of the word line thereat are thinner than widths taken along the second direction, of portions of the information storage film that extend on the source/drain regions from the portion of the information storage film on the channel region, and of corresponding portions of the word line.

16. A nonvolatile semiconductor memory device, comprising:

a memory array including,
  a plurality of nonvolatile memory cells disposed on a semiconductor substrate in matrix form; and
  wherein source/drain regions of the plurality of nonvolatile memory cells are connected in parallel with one another in respective columns, and word lines respectively extend in a first direction of the nonvolatile memory cells;
wherein each of the plurality of nonvolatile memory cells includes an information storage film, which is provided on a channel region in the first direction between the source/drain regions with a first insulating film interposed therebetween, and a conductor film for a control gate electrode, which is formed over the information storage film and serves as one of said word lines superimposed on the information storage film, and
wherein the width taken along a second direction crossing the first direction, of a portion of the word line on each channel region is thinner than widths taken along the second direction, of portions of the information storage film that extend on the source/drain regions from a portion of the information storage film on the channel region, and of corresponding portions of the word line.

17. A nonvolatile semiconductor memory device according to claim 16, wherein said first direction is a gate-length direction and said second direction is a gate-width direction.

18. A nonvolatile semiconductor memory device according to claim 15, wherein said first direction is a gate-length direction and said second direction is a gate-width direction.

19. A nonvolatile semiconductor memory device according to claim 1, wherein said first direction is a gate-length direction and said second direction is a gate-width direction.

* * * * *